United States Patent
Yanagishima et al.

(10) Patent No.: US 11,115,020 B2
(45) Date of Patent: Sep. 7, 2021

(54) SIGNAL TRANSMISSION CIRCUIT DEVICE, SEMICONDUCTOR DEVICE, METHOD AND APPARATUS FOR INSPECTING SEMICONDUCTOR DEVICE, SIGNAL TRANSMISSION DEVICE, AND MOTOR DRIVE APPARATUS USING SIGNAL TRANSMISSION DEVICE

(71) Applicant: Rohm Co., Ltd., Kyoto (JP)

(72) Inventors: Daiki Yanagishima, Kyoto (JP); Toshiyuki Ishikawa, Kyoto (JP); Hirotaka Takihara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 154 days.

(21) Appl. No.: 16/508,682

(22) Filed: Jul. 11, 2019

(65) Prior Publication Data

US 2019/0334522 A1    Oct. 31, 2019
US 2020/0313671 A9    Oct. 1, 2020

Related U.S. Application Data

(60) Continuation of application No. 15/463,121, filed on Mar. 20, 2017, now Pat. No. 10,382,035, which is a
(Continued)

(30) Foreign Application Priority Data

Nov. 5, 2009 (JP) .................................. 2009-253900
Dec. 1, 2009 (JP) .................................. 2009-273598
Apr. 28, 2010 (JP) .................................. 2010-104192

(51) Int. Cl.
*H03K 17/691* (2006.01)
*H03K 17/61* (2006.01)
(Continued)

(52) U.S. Cl.
CPC .......... *H03K 17/691* (2013.01); *G01R 31/27* (2013.01); *G01R 31/2884* (2013.01);
(Continued)

(58) Field of Classification Search
USPC ..................................... 324/762.01, 546, 547
See application file for complete search history.

(56) References Cited

U.S. PATENT DOCUMENTS 3,398,255 A    8/1968   Aldenhoff
5,420,558 A    5/1995   Ito
(Continued)

FOREIGN PATENT DOCUMENTS

CN    1159586     9/1997
CN    1514258 A    7/2004
(Continued)

OTHER PUBLICATIONS

International Search Report for PCT/JP2010/067903 dated Jan. 25, 2011.
(Continued)

*Primary Examiner* — Vincent Q Nguyen
(74) *Attorney, Agent, or Firm* — Fish & Richardson P.C.

(57) ABSTRACT

A signal transmission device includes a first lead frame supporting a signal transmission chip that includes first and second inductor spiral rings, a first bonding pad electrically coupled between the first and second inductor spiral rings, and a guard ring provided to roundly cover the first and second inductor spiral rings in a plan view. Bonding pads are provided outside of the guard ring. A direction of rotation between the first and second inductor spiral rings are different from each other so that the first and second inductor spiral rings are disposed substantially symmetrically about the first bonding pad. A second lead frame supports a
(Continued)

semiconductor chip, with the signal transmission chip and the semiconductor chip facing each other.

12 Claims, 40 Drawing Sheets

Related U.S. Application Data continuation of application No. 14/576,775, filed on Dec. 19, 2014, now Pat. No. 9,632,135, which is a division of application No. 13/505,342, filed as application No. PCT/JP2010/067903 on Oct. 13, 2010, now Pat. No. 8,947,117.

(51) Int. Cl.
*H04L 25/02* (2006.01)
*G01R 31/27* (2006.01)
*G01R 31/28* (2006.01)
*H02P 31/00* (2006.01)

(52) U.S. Cl.
CPC ............ *H02P 31/00* (2013.01); *H03K 17/61* (2013.01); *H04L 25/028* (2013.01)

(56) References Cited

U.S. PATENT DOCUMENTS

| | | | |
|---|---|---|---|
| 5,677,931 A | 10/1997 | Okuyama |
| 5,942,902 A | 8/1999 | Okayasu |
| 6,107,676 A | 8/2000 | Suzuki |
| 6,320,399 B1 | 11/2001 | Kunz et al. |
| 6,486,765 B1 | 11/2002 | Katayanagi |
| 7,075,329 B2 | 7/2006 | Chen et al. |
| 2002/0017919 A1 | 2/2002 | Haigh et al. |
| 2004/0051522 A1 | 3/2004 | Worledge |
| 2004/0124836 A1 | 7/2004 | Kang et al. |
| 2004/0135644 A1 | 7/2004 | Mizoguchi |
| 2005/0057277 A1 | 3/2005 | Chen et al. |
| 2006/0033174 A1 | 2/2006 | Yang |
| 2006/0094152 A1 | 5/2006 | Yang |
| 2006/0180918 A1 | 8/2006 | Masuko et al. |
| 2007/0128821 A1 | 6/2007 | Lee |
| 2009/0091413 A1 | 4/2009 | Kato |
| 2009/0230938 A1 | 9/2009 | Sakurai |
| 2010/0052804 A1 | 3/2010 | Yang et al. |
| 2010/0259909 A1* | 10/2010 | Ho ................. H01F 27/2804 361/767 |
| 2011/0316625 A1 | 12/2011 | Scheytt |

FOREIGN PATENT DOCUMENTS

| | | |
|---|---|---|
| CN | 101091315 | 12/2007 |
| JP | S 61-500245 A | 2/1986 |
| JP | H 01-124244 A | 5/1989 |
| JP | H 04-340264 A | 11/1992 |
| JP | 05-299576 A | 11/1993 |
| JP | H06-13249 | 1/1994 |
| JP | H 06-120048 A | 4/1994 |
| JP | H 07-045778 A | 2/1995 |
| JP | H 08-255862 A | 10/1996 |
| JP | H10-274668 | 10/1998 |
| JP | H10-326856 | 12/1998 |
| JP | 2001-085248 | 3/2001 |
| JP | 2002-505523 A | 2/2002 |
| JP | 2003-523147 | 7/2003 |
| JP | 2006-222351 | 8/2006 |
| JP | 2007-123650 | 5/2007 |
| JP | 2008-502215 A | 1/2008 |
| JP | 2009-038956 | 2/2009 |
| JP | 2009-188621 | 8/2009 |
| JP | 2009-219294 | 9/2009 |
| JP | 2009-232637 | 10/2009 |
| JP | 2009-244077 | 10/2009 |

OTHER PUBLICATIONS

Japanese Office Action for JP Application No. 2017-075316 dated Feb. 6, 2018 with English Translation.
The State Intellectual Property Office of People's Republic of China, Office Action for Chinese Patent Application No. 201610096548.X dated May 3, 2018 (with English Translation).
Japan Patent Office, Office Action for Japanese Patent Application No. 2017-075316, dated Jun. 12, 2018 (with English Translation).
Japanese Patent Office, official communication mailed in counterpart Japanese Patent Application No. 2018-168997 (dated Nov. 19, 2019) (with English-language translation).

\* cited by examiner

FIG.5
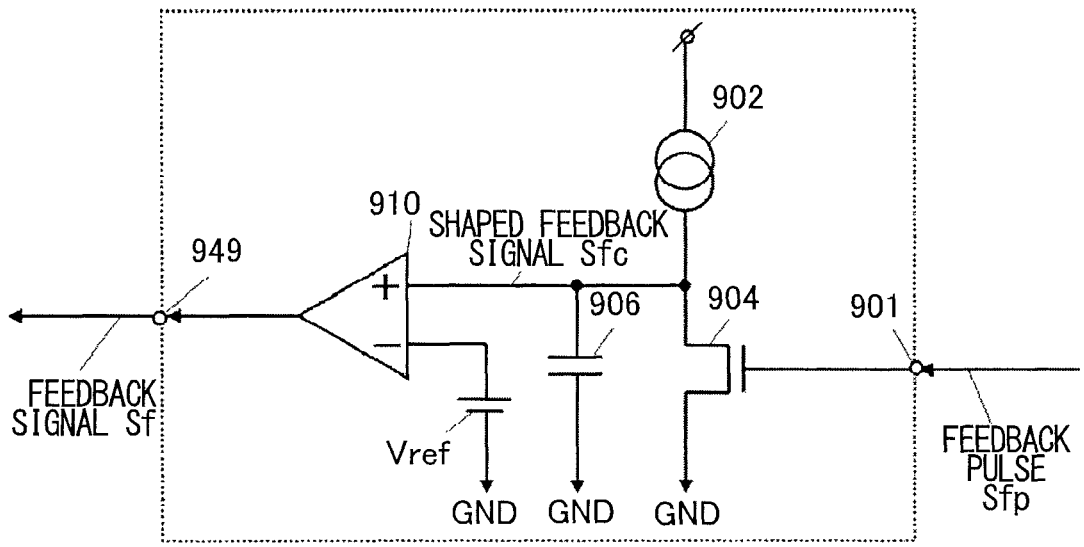
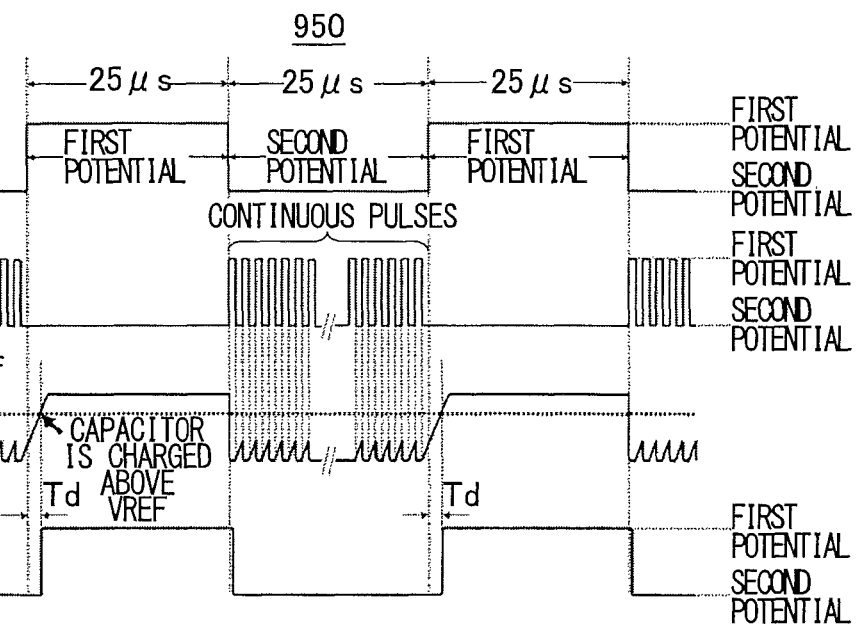

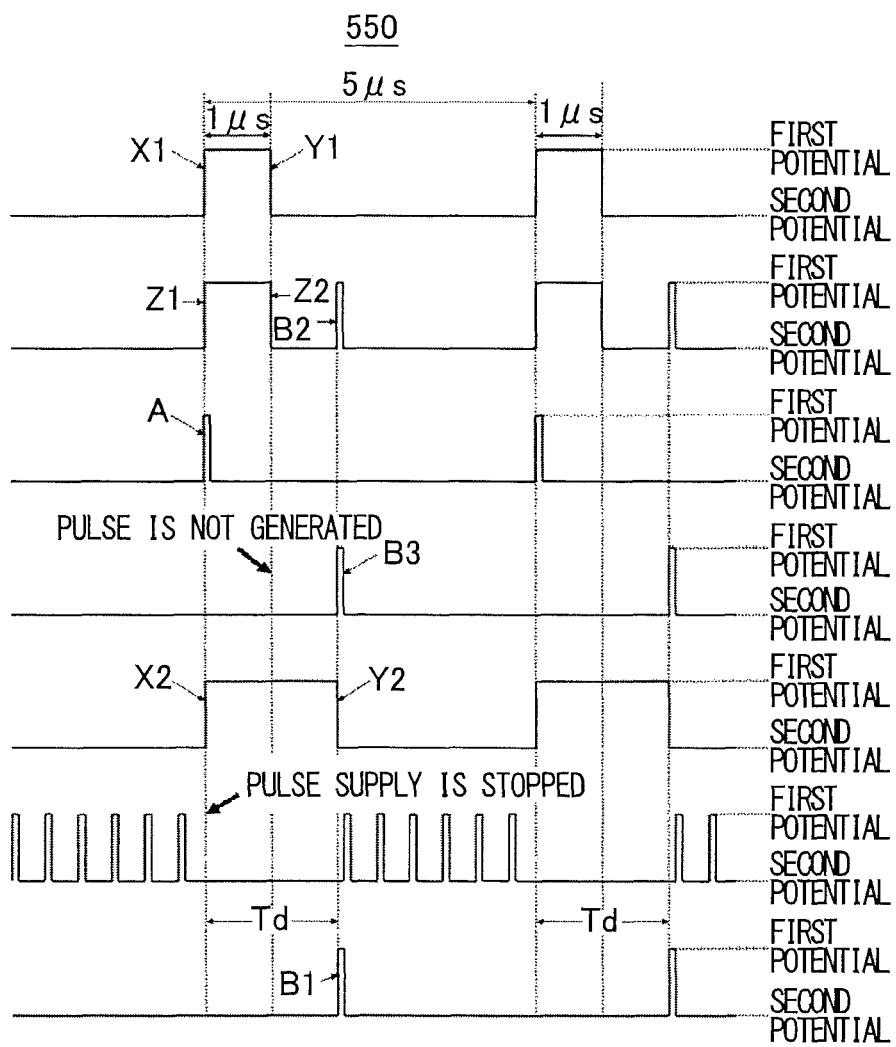

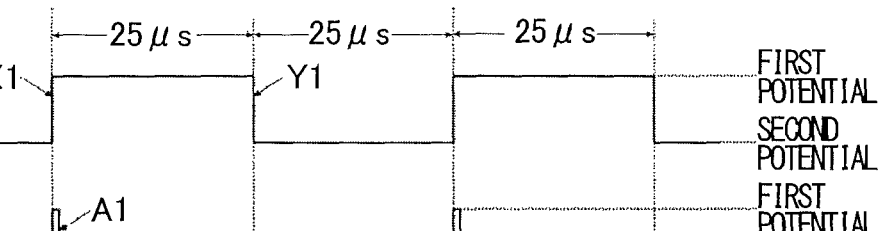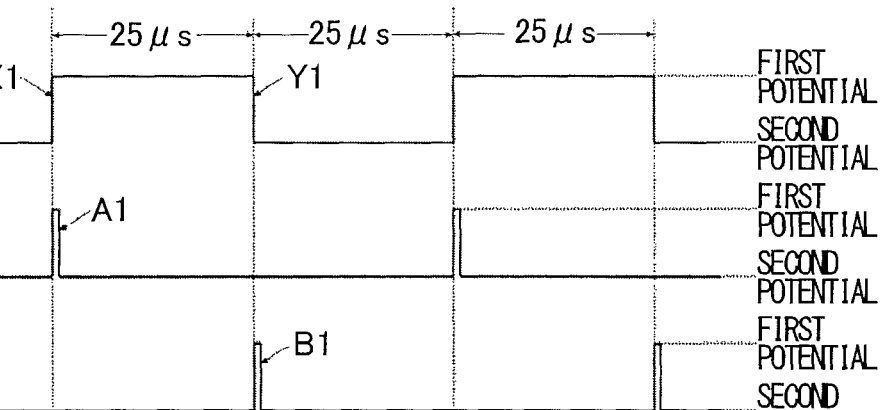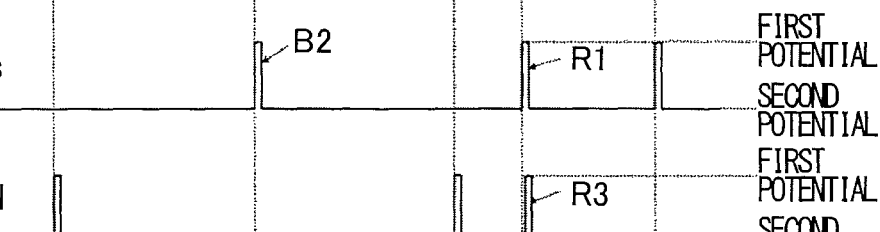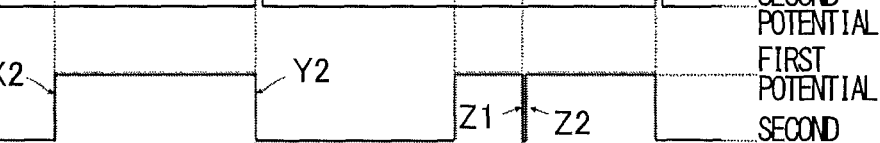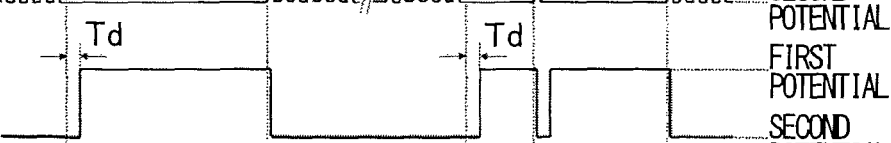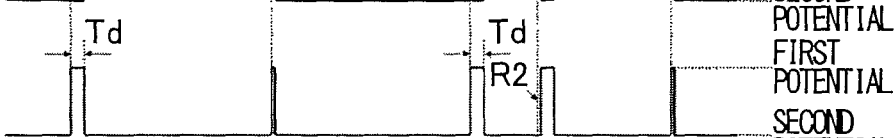

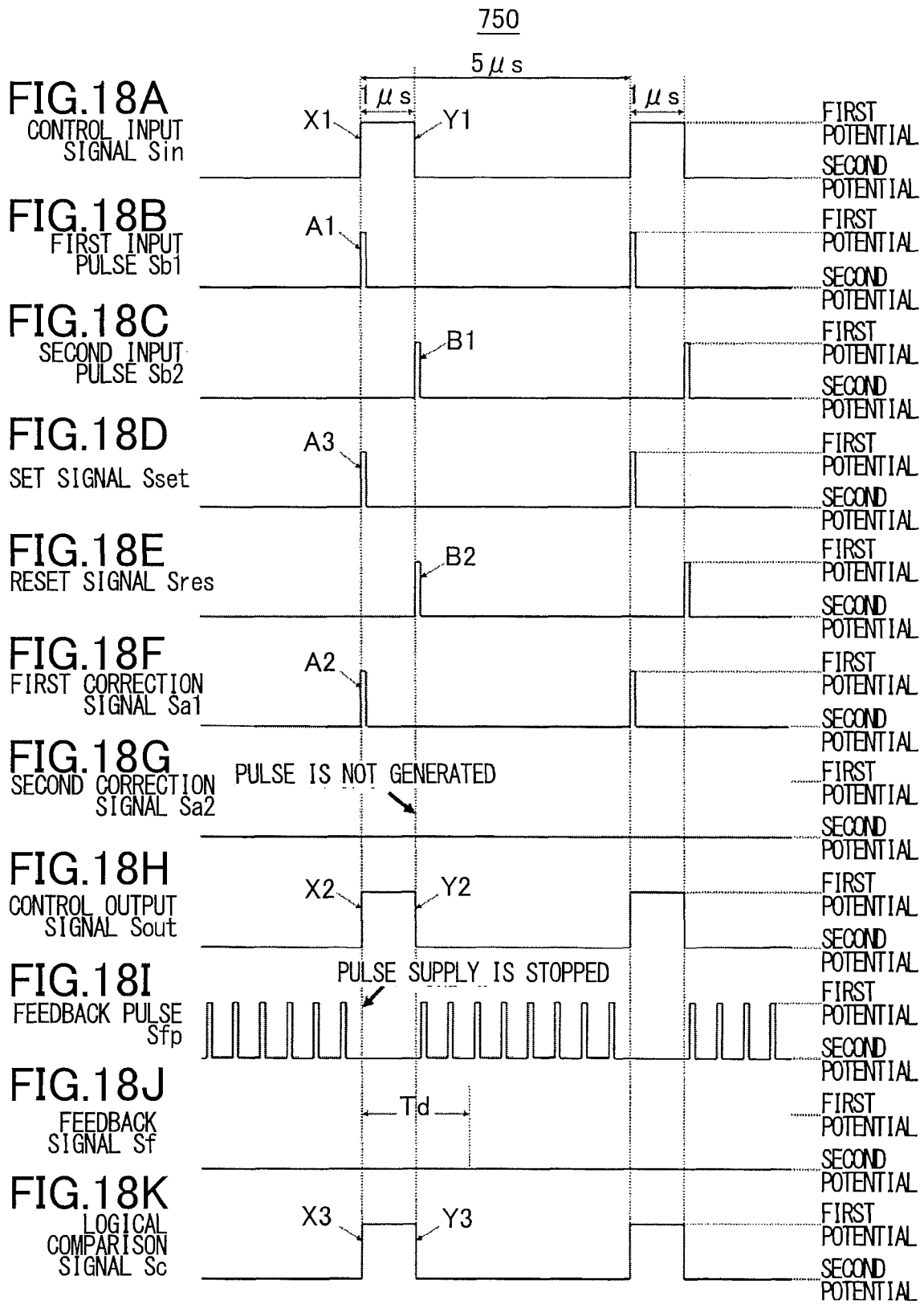

| TERMINAL NUMBER | TERMINAL NAME | TERMINAL NUMBER | TERMINAL NAME |
|---|---|---|---|
| 1 | NC | 11 | GND1 |
| 2 | VEE2 | 12 | IN |
| 3 | GND2 | 13 | RST |
| 4 | OCP/DESATIN | 14 | FLT |
| 5 | OUT | 15 | OCPOUT |
| 6 | VCC2 | 16 | ERRIN |
| 7 | CLAMP | 17 | VCC1 |
| 8 | PROOUT | 18 | NC |
| 9 | VEE2 | 19 | NC |
| 10 | NC | 20 | GND1 |

※NC:Non Connection

FIG.30

| ITEM | SYMBOL | SPECIFICATION | UNIT | CONDITION |
|---|---|---|---|---|
| GENERAL | | | | |
| INPUT SIDE CIRCUIT CURRENT | $I_{CC1}$ | 0.65 | mA | |
| OUTPUT SIDE CIRCUIT CURRENT | $I_{CC2}$ | 1.8 | mA | |
| LOGIC | | | | |
| LOGIC H LEVEL INPUT VOLTAGE | $V_{INH}$ | 3.5-5.5 | V | |
| LOGIC L LEVEL INPUT VOLTAGE | $V_{INL}$ | 0-1.5 | V | |
| LOGIC H LEVEL INPUT CURRENT | $I_{INH}$ | 100 | $\mu A$ | INPUT=5V |
| LOGIC L LEVEL INPUT CURRENT | $I_{INL}$ | 0 | $\mu A$ | INPUT=0V |
| OPEN DRAIN OUTPUT L VOLTAGE | $V_{ODL}$ | 0.18 | V | INPUT CURRENT=5mA |
| OUTPUT | | | | |
| OUTPUT SOURCE SIDE ON RESISTANCE | $R_{ONOUTH}$ | 3.6 | $\Omega$ | $I_{OUT}=-100mA$ |
| OUTPUT SINK SIDE ON RESISTANCE | $R_{ONOUTL}$ | 1.8 | $\Omega$ | $I_{OUT}=100mA$ |
| CLAMP SOURCE SIDE ON RESISTANCE | $R_{ONCLAMPH}$ | 2.8 | $\Omega$ | $I_{CLAMP}=-100mA$ |
| CLAMP SINK SIDE ON RESISTANCE | $R_{ONCLAMPL}$ | 1.5 | $\Omega$ | $I_{CLAMP}=100mA$ |
| CLAMP H REFERENCE VOLTAGE | $V_{CLAMPH}$ | 2.0 | V | |
| CLAMP L REFERENCE VOLTAGE | $V_{CLAMPL}$ | 2.0 | V | |
| PROOUT ON RESISTANCE | $R_{ONPROOUTL}$ | 1.5 | $\Omega$ | $I_{PROOUT}=100mA$ |
| Turn ON Time | $t_{PON}$ | 60 | ns | |
| Turn OFF Time | $t_{POFF}$ | 60 | ns | |
| Propagation distortion | $t_{PDIST}$ | 0 | ns | |
| Rise Time | $t_{RISE}$ | 30 | ns | |
| Fall Time | $t_{FALL}$ | 30 | ns | |
| PROTECTION FUNCTION | | | | |
| INPUT SIDE UVLO OFF VOLTAGE | $V_{UVLO1H}$ | 4.0 | V | |
| INPUT SIDE UVLO ON VOLTAGE | $V_{UVLO1L}$ | 3.8 | V | |
| OUTPUT SIDE UVLO OFF VOLTAGE | $V_{UVLO2H}$ | 12.0 | V | |
| OUTPUT SIDE UVLO ON VOLTAGE | $V_{UVLO2L}$ | 11.0 | V | |
| WATCHDOG TIMER MASK TIME | $t_{WDMASK}$ | 10 | $\mu s$ | |
| OVERCURRENT DETECTION VOLTAGE | $V_{OCDET}$ | 4 | V | |
| OVERCURRENT PROTECTION AUTOMATIC RESET TIME | $T_{OCPRLS}$ | 10 | ms | |
| ERR DETECTION VOLTAGE | $V_{ERRDET}$ | 1.2 | V | |
| ERR DETECTION HYSTERESIS | $V_{ERRHYS}$ | 0.10 | V | |

SIGNAL TRANSMISSION CIRCUIT DEVICE, SEMICONDUCTOR DEVICE, METHOD AND APPARATUS FOR INSPECTING SEMICONDUCTOR DEVICE, SIGNAL TRANSMISSION DEVICE, AND MOTOR DRIVE APPARATUS USING SIGNAL TRANSMISSION DEVICE

CROSS-REFERENCE TO RELATED APPLICATION(S)

This application is a continuation of U.S. Ser. No. 15/463,121, filed Mar. 20, 2017 which is a continuation of U.S. Ser. No. 14/576,775, filed Dec. 19, 2014, now U.S. Pat. No. 9,632,135, which is a divisional of U.S. Ser. No. 13/505,342, filed May 1, 2012, now U.S. Pat. No. 8,947,117, which is a national phase of international application PCT/JP2010/067903, filed on Oct. 13, 2010, which in turn claims the benefit of Japanese Application No. 2009-253900, filed Nov. 5, 2009, and Japanese Application No. 2009-273598, filed Dec. 1, 2009, and Japanese Application No. 2010-104192, filed Apr. 28, 2010, the contents of all the foregoing are incorporated by reference herein.

TECHNICAL FIELD

A first technical feature disclosed in this specification relates to a signal transmission circuit device that transmits a control input signal via an isolator, and particularly to a signal transmission circuit device having a function of feeding back a control output signal to an input side circuit for correcting a signal.

In addition, a second technical feature disclosed in this specification relates to a semiconductor device in which a coil is integrated, and a method and an apparatus for inspecting the semiconductor device.

In addition, a third technical feature disclosed in this specification relates to a signal transmission device using a transformer, and a motor drive apparatus using the signal transmission device.

BACKGROUND ART

First Background Art

Conventionally, in fields of hybrid vehicles, electric vehicles, household electrical appliance, industrial equipment, and medical equipment, there have been used signal transmission circuit devices using an isolator for isolating direct current between input and output while transmitting a signal.

FIG. 19 illustrates a conventional drive circuit device for a power semiconductor for driving a motor mounted in a hybrid vehicle, for example, and a signal transmission circuit device used for the drive circuit device. A drive circuit device 100 for the power semiconductor includes an electronic control device 102, a signal transmission circuit device 104, a power semiconductor 106, and a motor 108.

The electronic control device 102 generates a control input signal for controlling the motor 108 mounted in a hybrid vehicle, for example, via the power semiconductor 106. The electronic control device 102 corresponds to an engine control unit (ECU) in this type of technical field.

The signal transmission circuit device 104 includes a transmission pulse generating circuit 110, an input signal transmission unit 112, and a reception circuit 114. The input signal transmission unit 112 includes a photocoupler or a transformer (not shown) as an isolator for isolating direct current between an input side circuit and an output side circuit of the signal transmission circuit device 104.

FIG. 20 illustrates a signal transmission circuit device disclosed in FIG. 1 of Patent Document 1. A signal transmission circuit device 120 includes a glitch filter 122, edge detectors 124 and 126, an inverter 128, transformers 130 and 132, and a flip-flop 134.

The transformer 130 has a primary winding 130A and a secondary winding 130B, and the transformer 132 has a primary winding 132A and a secondary winding 132B. The primary windings 130A and 132A are connected to ground potential A (GND A), and the secondary windings 130B and 132B are connected to another ground potential B (GND B) that is isolated for direct current from the ground potential A.

In addition, with reference to FIG. 8 of Patent Document 1, a transmission circuit 802 and the ground potential A (GND A) are disposed on a first substrate 804, while a top coil 806A having a function as the primary winding, a reception circuit 810, a bottom coil 806B having a function as the secondary winding, and the ground potential B (GND B) are disposed on a second substrate 808. Thus, a technical concept of forming an isolator including a transformer on an IC chip is disclosed in Patent Document 1.

FIG. 21 illustrates a signal transmission circuit device disclosed in FIG. 7 of Patent Document 2, in which reference numerals are changed.

Patent Document 2 discloses a technical concept of correcting mismatch between the control input signal and the control output signal by regularly generating a refresh pulse in the input side circuit.

A signal transmission circuit device 140 includes Schmitt trigger inverters 142 and 150, an input signal encode circuit 144, a transformer 146, and an input signal decode circuit 148, and further includes an input signal updating circuit 152 and a watchdog circuit 154. The input signal updating circuit 152 regularly generates the refresh pulse so as to update the control input signal. The watchdog circuit 154 detects an abnormal state in the circuit device and controls shutdown or the like of the control output signal.

Second Background Art

FIG. 33 is a schematic diagram illustrating a conventional example of a semiconductor device in which a coil is integrated. A semiconductor device Y10 of this conventional example includes a coil L1, and pads Y11 and Y12. Note that both ends of the coil L1 are connected to the pads Y11 and Y12, respectively.

FIG. 34 is a schematic diagram for explaining defective inspection of the semiconductor device Y10. An inspection apparatus Y20 used for defective inspection of the semiconductor device Y10 includes probes Y21 and Y22, a constant current source Y23, and a voltmeter Y24. Note that one end of the constant current source Y23 and one end of the voltmeter Y24 are connected to the probe Y21, while the other ends of them are connected to the probe Y22.

Conventionally, in the defective inspection of the semiconductor device Y10, the probes Y21 and Y22 are made to contact with the pads Y11 and Y12, respectively, and a predetermined constant current I is supplied from the constant current source Y23 to the coil L1. Then, a voltage generated across the coil L1 (voltage drop generated due to a series resistance component RL of the coil L1) is measured by the voltmeter Y24 so that a break of the coil L1 is checked. Specifically, if the voltage across the coil L1 cannot be measured normally, it is decided that the coil L1 is broken, and the semiconductor device Y10 is rejected as a defective product.

Note that there is Patent Document 3 as an example of a conventional technique related to the semiconductor device in which a coil is integrated.

Third Background Art

FIG. 43 is a circuit block diagram illustrating a conventional example of the signal transmission device, and FIG. 44 is a timing chart illustrating an example of the normal operation. A signal transmission device 100 of this conventional example includes a transformer drive signal generating portion 101, a transformers 102a and 102b, comparators 103a and 103b, and an SR flip-flop 104, and realizes signal transmission between a primary side circuit and a secondary side circuit while isolating between a ground voltage GND1 of the primary side circuit and a ground voltage GND2 of the secondary side circuit by using the transformers 102a and 102b.

The transformer drive signal generating portion 101 generates transformer drive signals S10a and S20a, and outputs the same to primary side windings of the transformers 102a and 102b, respectively. Note that the transformer drive signal generating portion 101 generates one pulse via the transformer drive signal S10a using a rising edge of an input signal IN as a trigger, and generates one pulse via the transformer drive signal S20a using a falling edge of the input signal IN as a trigger.

The transformers 102a and 102b respectively generate induced signals S10b and S20b corresponding to the transformer drive signals S10a and S20a in secondary side windings thereof.

The comparators 103a and 103b respectively compare the induced signals S10b and S20b with a predetermined threshold voltage to generate comparison signals S10c and S20c, and hence output the signals to a set input terminal (S) and a reset input terminal (R) of the SR flip-flop 104, respectively.

The SR flip-flop 104 sets an output signal OUT to high level using a rising edge of a comparison signal S10c as a trigger, and sets the output signal OUT to low level using a rising edge of a comparison signal S20c as a trigger.

Therefore, if a normal signal transmission operation is performed, the output signal OUT from the SR flip-flop 104 becomes the same signal as the input signal IN input to the transformer drive signal generating portion 101.

Note that there is Patent Document 1 as an example of a conventional technique related to the above description.

PRIOR ART DOCUMENTS

Patent Documents

Patent Document 1: U.S. Pat. No. 7,075,329
Patent Document 2: JP-A-2007-123650
Patent Document 3: JP-A-2001-85248

DISCLOSURE OF THE INVENTION

Problem to be Solved by the Invention

First Problem to be Solved by First Technical Feature

However, both the signal transmission circuit devices illustrated in FIGS. 19 and 20 transmit the signal input to the input side circuit to the output side circuit in one direction, and has no means for avoiding an abnormal state such as mismatch between input and output signals due to noise generated in the input signal transmission unit, for example.

Patent Document 2 discloses a technical concept of updating the control output signal every predetermined period by generating a refresh pulse, but does not suggest any technical concept of avoiding mismatch between input and output signals by directly comparing the control output signal with the control input signal. In the signal transmission circuit device illustrated in Patent Document 2, in order to improve noise immunity characteristic, it is necessary to increase the frequency of the refresh pulse. As a result, a malfunction may occur in stability or power consumption.

The present invention overcomes such a malfunction, and an object thereof is to provide a signal transmission circuit device that corrects the control output signal based on detection of an abnormal state when the abnormal state occurs for some problem, in which the control input signal is not correctly transmitted to the control output signal.

Second Problem to be Solved by Second Technical Feature

Here, in the defective inspection of the semiconductor device Y10 illustrated in FIGS. 33 and 34, a voltage value of detected voltage Vdet obtained by the voltmeter Y24 is expressed by the following equation (1).

$$Vdet = I \times (RL + Rx + Ry) \quad (1)$$

Note that in the above equation (1), a variable Rx denotes a contact resistance component when the probe Y21 is made to contact with the pad Y11, and a variable Ry denotes a contact resistance component when the probe Y22 is made to contact with the pad Y12.

As understood from the above equation (1), the detected voltage Vdet is affected not only from the series resistance component RL of the coil L1 but also from the contact resistance components Rx and Ry of the probes Y21 and Y22. In particular, the series resistance component RL of the coil L1 is a very small resistance component (a few ohms to a few ten ohms) that is not different largely from the contact resistance components Rx and Ry of the probes Y21 and Y22. Therefore, in the defective inspection of the semiconductor device Y10, it is very difficult to correctly measure the series resistance component RL so as to detect an abnormal resistance of coil L1.

Therefore, even if there is an abnormal resistance of the coil L1 (for example, a partial short circuit between windings), as long as there is no break in the coil L1, the above-mentioned conventional semiconductor device Y10 cannot be rejected as a defective product and may be in the market.

In view of the above-mentioned problem, an object of the present invention is to provide a semiconductor device and an inspection method thereof in which an abnormal resistance of the coil can be inspected.

Third Problem to be Solved by Third Technical Feature

However, the signal transmission device 100 of the above-mentioned conventional example illustrated in FIG. 43 has a problem that if a noise is generated in at least one of the induced signals S10b and S20b in the secondary side windings of the transformers 102a and 102b in the case where the ground voltage GND2 of the secondary side circuit varies, an erroneous pulse is generated in the comparison signals S10c and S20c so that the output signal OUT is changed to an unintentional logical level.

For instance, FIG. 45A illustrates a manner in which when the input signal IN is low level, a noise is generated in the induced signal S10b and causes an erroneous pulse in the comparison signal S10c, and hence the output signal OUT is changed unintentionally to high level. In addition, FIG. 45B illustrates a manner in which when the input signal IN is high level, a noise is generated in the induced signal S20b and causes an erroneous pulse in the comparison signal S20c, and hence the output signal OUT is changed unintentionally to low level.

In addition, if the transformers 102a and 102b are disposed close to each other, the same noise is generated in both the induced signals S10b and S20b. In this case, too, the output signal OUT may change to an unintentional logical level.

For instance, it is supposed that the SR flip-flop 104 has a structure of keeping the output signal OUT to be a previous logical level while both the comparison signals S10c and S20c are high level. If such a structure is adopted, when the same noise is generated in both the induced signals S10b and S20b, the output signal OUT is not changed to an unintentional logical level as long as the comparison signals S10c and S20c rise to high level simultaneously and fall to low level simultaneously.

However, as a matter of fact, there is a difference of logic change timing between the comparison signals S10c and S20c due to a variation of response speed between the comparators 103a and 103b. If one of them rises to high level or falls to low level earlier than the other does, the output signal OUT may change to an unintentional logical level.

For instance, FIG. 46A illustrates a manner in which when the input signal IN is low level, a noise is generated in both the induced signals S10b and S20b, and as a result, the comparison signals S10c and S20c rise to high level simultaneously, but the comparison signal S20c falls to low level earlier than the other so that the output signal OUT unintentionally changes to high level. In addition, FIG. 46B illustrates a manner in which when the input signal IN is high level, a noise is generated in both the induced signals S10b and S20b, and as a result, the comparison signals S10c and S20c rise to high level simultaneously, but the comparison signal S10c falls to low level earlier than the other so that the output signal OUT unintentionally changes to low level.

In view of the above-mentioned problem found by inventors of the present invention, an object of the present invention is to provide a signal transmission device and a motor drive apparatus using the same, which are resistant to noise.

Means for Solving the Problem

Means to Solve the First Problem

In this specification, "restoration" means to reconstruct original form and position (phase) of the signal. For instance, in an example of the control output signal, the control input signal that is input to the input terminal is converted or shaped into any type and form of signal to reach an output terminal, but the control output signal is changed back to the form and position (phase) of the original control input signal when it is output from the output terminal. This operation is referred to as "restoration".

In addition, in this specification, "equivalent" means that the signal form and the signal position (phase) are within a predetermined range such that no obstruction occurs in a circuit function.

In addition, in this specification, the "input side circuit" and the "output side circuit" mean a circuit portion to which a signal is input and a circuit portion from which a signal is output, respectively. In this specification, a boundary between the "input side circuit" and the "output side circuit" is the input signal transmission unit or a feedback signal transmission unit described later, which are disposed to straddle the "input side circuit" and the "output side circuit".

In addition, in this specification, "to isolate direct current" means that the object to be isolated is not connected by a conductor.

In addition, in this specification, a "first potential" and a "second potential" mean high level or low level of a rectangular signal, and voltage values of the high level and the low level in each signal are set to predetermined values depending on a circuit structure. As a matter of course, the voltage value of the first potential or the second potential may be different for each signal. In this specification, "first potential" is supposed to be high level while the "second potential" is supposed to be low level in the description, but as a matter of course, it is possible to constitute the signal transmission circuit device in which the "first potential" is low level while the "second potential" is high level.

In addition, in this specification, a "first combination" means a combination in which a comparison result between the control input signal and a feedback signal described later is "mismatch", and the control input signal is the first potential. A "second combination" means a combination in which a comparison result between the control input signal and the feedback signal is "mismatch" and the control input signal is the second potential.

In addition, in this specification, an "output signal correction function" means a function to make a potential of the control output signal to "match" with a potential of the control input signal when the potential of the control output signal (the first potential or the second potential) becomes "mismatched" with the potential of the control input signal.

The present invention provides a signal transmission circuit device for transmitting signals between an input side circuit and an output side circuit, which includes:

(a) a first pulse generating circuit that receives a control input signal input to the input side circuit and outputs a first correction signal;

(b) a second pulse generating circuit that receives the control input signal and outputs a second correction signal;

(c) an input signal transmission unit that receives the first correction signal and the second correction signal, and transmits a signal from the input side circuit to the output side circuit;

(d) an input signal restoration circuit that receives an output signal of the input signal transmission unit and outputs a control output signal equivalent to the control input signal;

(e) a feedback signal transmission unit that receives the control output signal, transmits a signal from the output side circuit to the input side circuit, and outputs a feedback signal; and (f) a logical comparison circuit that receives the control input signal and the feedback signal, performs logical comparison between the control input signal and the feedback signal, and outputs a logical comparison signal, in which (g) the first pulse generating circuit receives the logical comparison signal together with the control input signal, and outputs the first correction signal when the control input signal and the logical comparison signal become a first combination, and the second pulse generating circuit receives the logical comparison signal together with the control input signal, and outputs the second correction signal when the control input signal and the logical comparison signal become a second combination different from the first combination (Structure 1-1).

The signal transmission circuit device having the above-mentioned structure includes the feedback signal transmission unit that feeds back the control output signal to the input side circuit, and the logical comparison circuit that performs logical comparison between the feedback signal and the control input signal. The first pulse generating circuit and the second pulse generating circuit output correct signals appropriately based on the control input signal and a logical comparison result of the logical comparison circuit. Therefore, even if "mismatch" between the control input signal and the control output signal occurs, the control output signal is promptly corrected so that the control input signal and the control output signal are "matched".

In the present invention, each of the input signal transmission unit and the feedback signal transmission unit includes at least one isolator (Structure 1-2).

The signal transmission circuit device having the above-mentioned structure can perform signal transmission between two blocks having different ground potentials, because the input side circuit and the output side circuit are isolated for direct current by the isolator.

In the present invention, the isolator is a transformer (Structure 1-3).

The signal transmission circuit device having the above-mentioned structure can isolate direct current between the input side circuit and the output side circuit, and can perform precise signal transmission of a high frequency signal too, with little delay in signal transmission.

In the present invention, the input side circuit, the output side circuit, and the transformer are formed on different semiconductor substrates and are constituted integrally in one package (Structure 1-4).

In the present invention, the input side circuit and the output side circuit are formed on different semiconductor substrates, respectively, and the transformer may be formed on the same substrate as the input side circuit or the output side circuit (Structure 1-5).

In the present invention, a primary winding and a secondary winding of the transformer are connected to different ground potentials (Structure 1-6).

In the present invention, the isolator may be a photocoupler (Structure 1-7).

In the present invention, the input signal restoration circuit is constituted of an RS flip-flop (Structure 1-8).

The signal transmission circuit device having the above-mentioned structure can output the control output signal equivalent to the control input signal without a malfunction even if signals are input continuously to the set terminal or the reset terminal, because a signal transmitted from the input side circuit to the output side circuit by the input signal transmission unit is supplied respectively to the set terminal and the reset terminal of the RS flip-flop.

In the present invention, the feedback signal transmission unit includes a feedback pulse generating circuit that generates a feedback pulse having continuous pulses in synchronization with the control output signal, and a waveform shaping circuit that performs waveform shaping of the feedback pulse (Structure 1-9).

The signal transmission circuit device having the above-mentioned structure can reduce the number of isolators in the feedback signal transmission unit to one, and further can enhance noise immunity characteristic of the feedback signal transmission unit.

In the present invention, the waveform shaping circuit includes a switching transistor that is turned on and off by the feedback pulse, a current source and a capacitor for generating a shaped feedback signal different from the feedback pulse in cooperation with the switching transistor, and a comparator that receives the shaped feedback signal and generates the feedback signal different from the shaped feedback signal (Structure 1-10).

The signal transmission circuit device having the above-mentioned structure can perform waveform shaping of the feedback pulse with a relatively simple structure.

In the present invention, the logical comparison circuit includes an exclusive OR circuit (Structure 1-11).

The signal transmission circuit device having the above-mentioned structure can simplify a structure of the logical comparison circuit.

In the present invention, it is possible to adopt a structure in which the first correction signal and the second correction signal are signals having continuous pulses, the first pulse generating circuit outputs the first correction signal having continuous pulses in a period while the control input signal and the logical comparison signal are the first combination, and the second pulse generating circuit outputs the second correction signal having continuous pulses in a period while the control input signal and the logical comparison signal are the second combination (Structure 1-12).

The signal transmission circuit device having the above-mentioned structure can improve reliability of the signal transmission circuit device, because the first pulse generating circuit and the second pulse generating circuit generate continuous pulses in a period while the input and output are "mismatched" so that generation of pulses is continued until the mismatch between input and output is canceled.

In the present invention, it is possible to adopt a structure in which the feedback signal transmission unit includes a first output edge detection circuit that detects a rising edge of the control output signal so as to generate a first feedback pulse, a second output edge detection circuit that detects a falling edge of the control output signal to as to generate a second feedback pulse, and an RS flip-flop that receives the first feedback pulse and the second feedback pulse at a set terminal and a reset terminal, respectively (Structure 1-13).

The signal transmission circuit device having the above-mentioned structure can largely reduce a delay of the feedback signal from the control output signal.

In the present invention, it is possible to adopt a structure in which the feedback signal transmission unit includes an output edge detection circuit that detects a rising edge and a falling edge of the control output signal to as to generate a feedback pulse, and a D flip-flop that receives the feedback pulse at a clock terminal (Structure 1-14).

The signal transmission circuit device having the above-mentioned structure can largely reduce a delay of the feedback signal from the control output signal, and further can reduce the number of isolators in the feedback signal transmission unit.

In the present invention, the input signal restoration circuit may be constituted of a D flip-flop (Structure 1-15).

The signal transmission circuit device having the above-mentioned structure can reduce the number of signals input to the input signal restoration circuit to one, and compared with a case where the RS flip-flop is used for the input signal restoration circuit, the number of isolators in the input signal transmission unit can be reduced.

In the present invention, it is possible to adopt a structure in which the signal transmission circuit device further includes a first edge detection circuit that detects a rising edge of the control input signal so as to generate a first input pulse, and a second edge detection circuit that detects a falling edge of the control input signal so as to generate a second input pulse, and the input signal transmission unit receives the first input pulse and the second input pulse together with the first correction signal and the second correction signal (Structure 1-16).

In the signal transmission circuit device having the above-mentioned structure, the input signal transmission unit receives the first input pulse and the second input pulse together with the first correction signal and the second correction signal, and transmits a signal to the input signal restoration. Therefore, a potential change in the control input signal can be promptly reflected on the control output signal based on the first input pulse and the second input pulse. Therefore, the control output signal is not affected by a delay of the feedback signal from the control input signal, and the smallest input pulse width of the control input signal can be largely reduced while remaining the output signal correction function based on the first pulse generating circuit and the second pulse generating circuit.

In the present invention, the input signal transmission unit includes a first logical OR circuit that performs a logical OR process between the first correction signal and the first input pulse, and a second logical OR circuit that performs a logical OR process between the second correction signal and the second input pulse, and the input signal restoration circuit may be constituted of an RS flip-flop that receives an output signal of the first logical OR circuit at a set terminal and an output signal of the second logical OR circuit at a reset terminal (Structure 1-17).

In the present invention, the first logical OR circuit and the second logical OR circuit are disposed in the input side circuit (Structure 1-18).

The signal transmission circuit device having the above-mentioned structure can reduce the number of isolators in the input signal transmission unit by performing the logical OR process between signals. In addition, the first correction signal and the first input pulse, as well as the second correction signal and the second input pulse have a mutual complementation relationship so that noise immunity characteristic of the signal transmission circuit device can be further improved.

In the present invention, the input signal transmission unit includes a logical OR circuit that performs a logical OR process among the first correction signal, the second correction signal, the first input pulse, and the second input pulse, and the input signal restoration circuit may be constituted of a D flip-flop that receives an output signal of the logical OR circuit at a clock terminal (Structure 1-19).

In the present invention, the logical OR circuit is disposed in the input side circuit (Structure 1-20).

The signal transmission circuit device having the above-mentioned structure can reduce the number of isolators in the input signal transmission unit, and can downsize the signal transmission circuit device.

Another signal transmission circuit device of the present invention includes:

(a) a first logical AND circuit that receives a control input signal input to the input side circuit and outputs a first correction signal;

(b) a second logical AND circuit that receives an inverted signal of the control input signal and outputs a second correction signal;

(c) an input signal transmission unit that receives the first correction signal and the second correction signal, and transmits a signal from the input side circuit to the output side circuit;

(d) an input signal restoration circuit that receives an output signal of the input signal transmission unit and outputs a control output signal equivalent to the control input signal;

(e) a feedback signal transmission unit that receives the control output signal, transmits a signal from the output side circuit to the input side circuit, and outputs a feedback signal;

(f) a logical comparison circuit that receives the control input signal and the feedback signal, performs logical comparison between the control input signal and the feedback signal, and outputs a logical comparison signal; and (g) a comparison pulse generating circuit that receives the logical comparison signal and outputs a logical comparison pulse signal in synchronization with the logical comparison signal, in which (h) the first logical AND circuit receives the logical comparison pulse signal together with the control input signal, and the second logical AND circuit receives the logical comparison pulse signal together with the inverted signal of the control input signal (Structure 1-21).

Still another signal transmission circuit device of the present invention includes:

(a) a first edge detection circuit that detects a rising edge of a control input signal input to the input side circuit so as to generate a first input pulse;

(b) a second edge detection circuit that detects a falling edge of the control input signal so as to generate a second input pulse;

(c) a signal combining circuit that receives the control input signal, the first input pulse, and the second input pulse, and outputs a set signal or a reset signal at timing when the first input pulse or the second input pulse is received;

(d) an input signal transmission unit that receives the set signal and the reset signal, and transmits a signal from the input side circuit to the output side circuit;

(e) an input signal restoration circuit that receives and output signal of the input signal transmission unit, and outputs a control output signal equivalent to the control input signal;

(f) a feedback signal transmission unit that receives the control output signal, transmits a signal from the output side circuit to the input side circuit, and outputs a feedback signal;

(g) a logical comparison circuit that receives the control input signal and the feedback signal, performs logical comparison between the control input signal and the feedback signal, and outputs a logical comparison signal; and (h) a comparison pulse generating circuit that receives the logical comparison signal and outputs a logical comparison pulse signal in synchronization with the logical comparison signal, in which (i) the signal combining circuit receives the logical comparison pulse signal together with the control input signal, the first input pulse, and the second input pulse, and outputs the set signal or the reset signal also at timing when the logical comparison pulse signal is received (Structure 1-22).

In the present invention, the signal combining circuit may include (a) a logical OR circuit that receives the first input pulse, the second input pulse, and the logical comparison pulse signal, (b) a first logical AND circuit that receives the control input signal and an output signal of the logical OR circuit, and outputs the set signal, and (c) a second logical AND circuit that receives an inverted signal of the control input signal and an output signal of the logical OR circuit, and outputs the reset signal (Structure 1-23).

In addition, in the signal transmission circuit device having the above-mentioned Structure 1-21 or 1-22, it is preferred that each of the input signal transmission unit and the feedback signal transmission unit has at least one transformer structure (Structure 1-24).

In addition, in the signal transmission circuit device having the above-mentioned Structure 1-21 or 1-22, it is preferred that the input signal restoration circuit is constituted of an RS flip-flop (Structure 1-25)

In addition, in the signal transmission circuit device having the above-mentioned Structure 1-21 or 1-22, it is preferred that the feedback signal transmission unit includes a feedback pulse generating circuit that generates a feedback pulse having continuous pulses in synchronization with the control output signal, and a waveform shaping circuit that performs waveform shaping of the feedback pulse (Structure 1-26)

Means to Solve the Second Problem

In order to solve the above-mentioned object, the semiconductor device according to the present invention provides a semiconductor device in which a coil is integrated, a first current supply pad and a first voltage measurement pad are connected to an end of the coil, and a second current supply pad and a second voltage measurement pad are connected to the other end of the coil (Structure 2-1).

Note that in the semiconductor device having the above-mentioned Structure 2-1, it is preferred that the first current supply pad and the first voltage measurement pad are formed integrally as a first common pad having an area that enables a first current supply probe and a first voltage measurement probe to contact simultaneously, and the second current supply pad and the second voltage measurement pad are formed integrally as a second common pad having an area that enables a second current supply probe and a second voltage measurement probe to contact simultaneously (Structure 2-2).

In addition, it is preferred that an inspection method for inspecting the semiconductor device of the above-mentioned Structure 2-1 or 2-2 includes a step of supplying a predetermined constant current between the first current supply pad and the second current supply pad, and a step of measuring a voltage generated between the first voltage measurement pad and the second voltage measurement pad (Structure 2-3)

In addition, it is preferred that an inspection apparatus for inspecting the semiconductor device of the above-mentioned Structure 2-1 or 2-2 includes a first current supply probe that contacts with the first current supply pad, a first voltage measurement probe that contacts with the first voltage measurement pad, a second current supply probe that contacts with the second current supply pad, a second voltage measurement probe that contacts with the second voltage measurement pad, a constant current source that supplies a predetermined constant current between the first current supply probe and the second current supply probe, and a voltmeter that measures a voltage generated between the first voltage measurement probe and the second voltage measurement probe (Structure 2-4).

Means to Solve the Third Problem

In order to solve the above-mentioned object, a signal transmission device according to the present invention includes a transformer drive signal generating portion that generates (N+a) pulses (here, N≥2 and a≥0) in a first transformer drive signal in response to a pulse edge of an input signal changing from a first logical level to a second logical level, and generates N+a pulses in a second transformer drive signal in response to a pulse edge of the input signal changing from the second logical level to the first logical level; a first transformer that generates a first induced signal in a secondary side winding in response to the first transformer drive signal input to a primary side winding; a second transformer that generates a second induced signal in a secondary side winding in response to the second transformer drive signal input to a primary side winding; a first comparator that compares the first induced signal with a predetermined threshold voltage so as to generate a first comparison signal; a second comparator that compares the second induced signal with a predetermined threshold voltage so as to generate a second comparison signal; a first pulse detection portion that detects that N pulses are generated in the first comparison signal so as to generate a pulse in a first detection signal; a second pulse detection portion that detects that N pulses are generated in the second comparison signal so as to generate a pulse in a second detection signal; and an SR flip-flop that makes an output signal change from the first logical level to the second logical level in response to the pulse generated in the first detection signal, and makes the output signal change from the second logical level to the first logical level in response to the pulse generated in the second detection signal (Structure 3-1).

Note that in the signal transmission device having the above-mentioned Structure 3-1, it is preferred that the first pulse detection portion is a counter that counts the number of pulses generated in the first comparison signal, and generates a pulse in the first detection signal when a count value of the counter reaches N, and the second pulse detection portion is a counter that counts the number of pulses generated in the second comparison signal, and generates a pulse in the second detection signal when a count value of the counter reaches N (Structure 3-2).

In addition, in the signal transmission device having the Structure 3-2, it is preferred that the count value of the first pulse detection portion is reset by a pulse generated in the second comparison signal, and the count value of the second pulse detection portion is reset by a pulse generated in the first comparison signal (Structure 3-3).

In addition, in the signal transmission device having the Structure 3-3, it is preferred that the transformer drive signal generating portion includes a pulse generating portion that generates a pulse signal having a predetermined frequency, a counter that counts the number of pulses of the pulse signal and stops to drive the pulse generating portion when a count value of the counter reaches N+a, an edge detection portion that starts to drive the pulse generating portion and resets a count value of the counter when a pulse edge of the input signal is detected, and a pulse distribution portion that distributes the pulse signal as either one of the first transformer drive signal and the second transformer drive signal in response to the input signal (Structure 3-4).

In addition, in the signal transmission device having the above-mentioned Structure 3-4, it is preferred that the pulse generating portion does not generate the pulse signal after the edge detection portion detects the pulse edge of the input signal until a predetermined time passes (Structure 3-5).

In addition, it is preferred that the signal transmission device according to the present invention includes a transformer drive signal generating portion that generates N+a pulses (here, N≥2 and a≥0) in a transformer drive signal in response to a pulse edge of an input signal; a transformer that generates an induced signal in a secondary side winding in response to the transformer drive signal input to the primary side winding; a comparator that generates a comparison signal by comparing the induced signal with a predetermined threshold voltage; and a pulse detection portion that detects that N pulses are generated in the comparison signal so as to generate a pulse in an output signal (Structure 3-6).

In addition, a motor drive apparatus according to the present invention includes the signal transmission device having any one of Structures 3-1 to 3-6 for performing a drive control of a motor by using the output signal (Structure 3-7).

Effects of the Invention

Effect of the First Technical Feature

The signal transmission circuit device of the present invention includes a feedback signal transmission unit that feeds back the control output signal, the logical comparison circuit that performs logical comparison between the control input signal and the feedback signal, the first pulse generating circuit that outputs the first correction signal, and the second pulse generating circuit that outputs the second correction signal. Therefore, it is possible to detect mismatch between the control input signal and the control output signal and to correct the control output signal promptly. In addition, the first pulse generating circuit and the second pulse generating circuit output the correct signal only when the input and output signals are mismatched. Therefore, it is possible to perform an operation with low power consumption.

In addition, if the structure of the present invention further includes the first edge detection circuit that detects a rising edge of the control input signal so as to generate the first input pulse, and the second edge detection circuit that detects a falling edge of the control input signal so as to generate the second input pulse, a potential change in the control input signal can be promptly reflected on the control output signal so that the smallest input pulse width of the control input signal can be largely reduced without being affected a delay of the feedback signal from the control input signal. Thus, applications of the signal transmission circuit device can be expanded.

Effect of the Second Technical Feature

The semiconductor device according to the present invention and the inspection method of the same can inspect an abnormal resistance of the coil.

Effect of the Third Technical Feature

According to the present invention, it is possible to provide a signal transmission device that is hardly affected by a noise, and a motor drive apparatus using the same.

BRIEF DESCRIPTION OF THE DRAWINGS

FIG. 5 is a diagram illustrating a specific circuit structure of a waveform shaping circuit according to the present invention.

FIGS. 6A, 6B, 6C and 6D are timing charts of individual portions of the waveform shaping circuit illustrated in FIG. 5.

FIGS. 7A, 7B, 7C, 7D, 7E, 7F and 7G are timing charts illustrating pulse signals of individual portions when a signal having a small pulse width is input in the second embodiment of the present invention (FIG. 2).

FIGS. 17A, 17B, 17C, 17D, 17E, 17F, 17G 17H, 17I, 17J and 17K are timing charts illustrating pulse signals of individual portions of the fourth embodiment of the present invention (FIG. 12).

FIGS. 18A, 18B, 18C, 18D, 18E, 18F, 18G, 18H, 18I, 18J, 18K are timing charts illustrating pulse signals of individual portions when a signal having a small pulse width is input in the fourth embodiment of the present invention (FIG. 12).

FIG. 30 is an electrical characteristic table of a switch control device 1.

BEST MODE FOR CARRYING OUT THE INVENTION

First Technical Feature

First Embodiment

Figure 1:
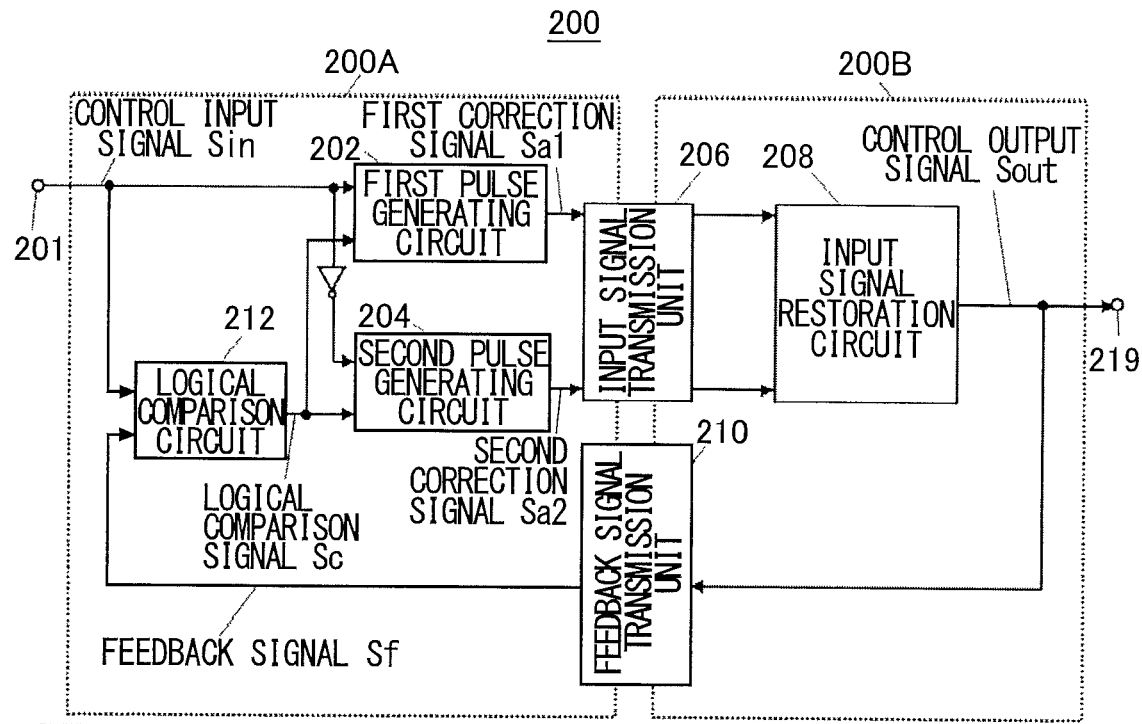
FIG. 1 is a diagram illustrating a signal transmission circuit device according to a first embodiment of the present invention.

FIG. 1 illustrates a signal transmission circuit device according to a first embodiment. A signal transmission circuit device 200 includes an input terminal 201, a first pulse generating circuit 202, a second pulse generating circuit 204, an input signal transmission unit 206, an input signal restoration circuit 208, an output terminal 219, a feedback signal transmission unit 210, and a logical comparison circuit 212.

The signal transmission circuit device 200 can be split into an input side circuit 200A and an output side circuit 200B at boundaries of the input signal transmission unit 206 and the feedback signal transmission unit 210. In addition, the input signal transmission unit 206 and the feedback signal transmission unit 210 are disposed to straddle the input side circuit 200A and the output side circuit 200B. Each of the input signal transmission unit 206 and the feedback signal transmission unit 210 has an isolator so as to isolate direct current between the input side circuit 200A and the output side circuit 200B.

As the isolator, a photocoupler or a transformer is usually used. Recent years, as the isolator, there has been used a transformer in which coils are formed on an IC chip, and the coils are used as a primary winding and a secondary winding of the transformer. Embodiments of the present invention may be constituted by using either one of the photocoupler and the transformer.

However, in order to avoid a malfunction due to a difference of characteristics between the isolators, it is preferred to use the same type of elements for the isolator in the input signal transmission unit 206 and the isolator in the feedback signal transmission unit 210. In other words, if a transformer is used as the isolator in the input signal transmission unit 206, a transformer should be used in the feedback signal transmission unit 210, too.

When a transformer is used as the isolator, the input side circuit 200A, the transformer, and the output side circuit 200B may be formed on different semiconductor substrates. Alternatively, it is possible to form the input side circuit 200A and the output side circuit 200B on different semiconductor substrates, and to form the transformer on the same substrate as the input side circuit 200A or the output side circuit 200B. The same is true for other examples in this specification.

The control input signal Sin input to the input terminal 201 is transmitted to the first pulse generating circuit 202 and the second pulse generating circuit 204. Usually, a rectangular pulse signal is used as the control input signal Sin.

The first pulse generating circuit 202 and the second pulse generating circuit 204 are structured to receive the control input signal Sin as well as a logical comparison signal Sc that is an output of the logical comparison circuit 212 described later, and to output a first correction signal Sa1 or a second correction signal Sa2 for correcting a control output signal Sout when the control input signal Sin and the logical comparison signal Sc becomes a first combination or a second combination, respectively.

The logical comparison circuit 212 performs logical comparison between the control input signal Sin and a feedback signal Sf, and output a result of the logical comparison as the logical comparison signal Sc. The feedback signal Sf is a signal obtained when the feedback signal transmission unit 210 feeds back the control output signal Sout to the input side circuit 200A.

The logical comparison signal Sc is a signal that becomes the second potential indicating that the logical comparison result between the control input signal Sin and the feedback signal Sf is "match", when the control input signal Sin is the first potential (e.g., high level) and the feedback signal Sf is the first potential, or when the control input signal Sin is the second potential (e.g., low level) and the feedback signal Sf is the second potential, for example, and becomes the first potential indicating that the control input signal Sin and the feedback signal Sf are "mismatched", when the control input signal Sin is the first potential and the feedback signal Sf is the second potential, or when the control input signal Sin is the second potential and the feedback signal Sf is the first potential.

The first pulse generating circuit 202 outputs the first correction signal Sa1 when a combination of the control input signal Sin and the logical comparison signal Sc becomes a first combination. The first combination means a combination in which the logical comparison result of the logical comparison circuit 212 is "mismatch" and the control input signal Sin is the first potential. In other words, the first correction signal Sa1 is a signal for correcting the control output signal Sout described later to the first potential when the input and output are "mismatched" and the control input signal Sin is the first potential.

The second pulse generating circuit 204 outputs the second correction signal Sa2 when the combination of the control input signal Sin and the logical comparison signal Sc becomes a second combination different from the first combination. The second combination is a combination in which the logical comparison result of the logical comparison circuit 212 is "mismatch" and the control input signal Sin is the second potential. In other words, the second correction signal Sa2 is a signal for correcting the control output signal Sout described later to the second potential when the input and output are "mismatched" and the control input signal Sin is the second potential.

The first pulse generating circuit 202 and the second pulse generating circuit 204 output the correct signals responding to the mismatch between input and output based on a potential change of the control input signal Sin so as to change the control output signal Sout described later. Further, also in the case where a mismatch occurs between the control input signal Sin and the control output signal Sout due to a certain abnormal state, the first pulse generating circuit 202 and the second pulse generating circuit 204 output the correct signals similarly to cancel the mismatch between input and output.

The first correction signal Sa1 and the second correction signal Sa2 are transmitted to the output side circuit 200B by the input signal transmission unit 206 and are transmitted to the input signal restoration circuit 208 in the output side circuit 200B.

The input signal restoration circuit 208 receives the first correction signal Sa1 and the second correction signal Sa2 transmitted by the input signal transmission unit 206, and based on the signals, outputs the control output signal Sout to the output terminal 219, which is equivalent to the control input signal Sin.

The input signal restoration circuit 208 can be constituted of a D flip-flop or an RS flip-flop, for example.

The control output signal Sout is further transmitted to the feedback signal transmission unit 210, too. The feedback signal transmission unit 210 transmits the signal from the output side circuit 200B to the input side circuit 200A, and outputs the feedback signal Sf in the input side circuit 200A. The feedback signal Sf is transmitted to the logical comparison circuit 212 and is logically compared with the control input signal Sin.

The logical comparison circuit 212 can be constituted using an exclusive OR circuit, for example. The same is true for other examples in this specification.

In order to reduce power consumption accompanying the signal transmission, it is preferred that the feedback signal transmission unit 210 convert the control output signal Sout into a signal having a small pulse width in the output side circuit 200B, transmit the signal from the output side circuit 200B to the input side circuit 200A, and then perform restoration to the feedback signal Sf equivalent to the control output signal Sout in the input side circuit 200A. The same is true for other examples in this specification.

By a series of signal paths described above, the control output signal Sout is kept in a state that always matches the control input signal Sin. In other words, the first pulse generating circuit 202 and the second pulse generating circuit 204 have two functions including a function of reflecting the potential change of the control input signal Sin on the control output signal Sout, and a function of canceling mismatch between input and output due to an abnormal state in the circuit.

Second Embodiment

Figure 2:
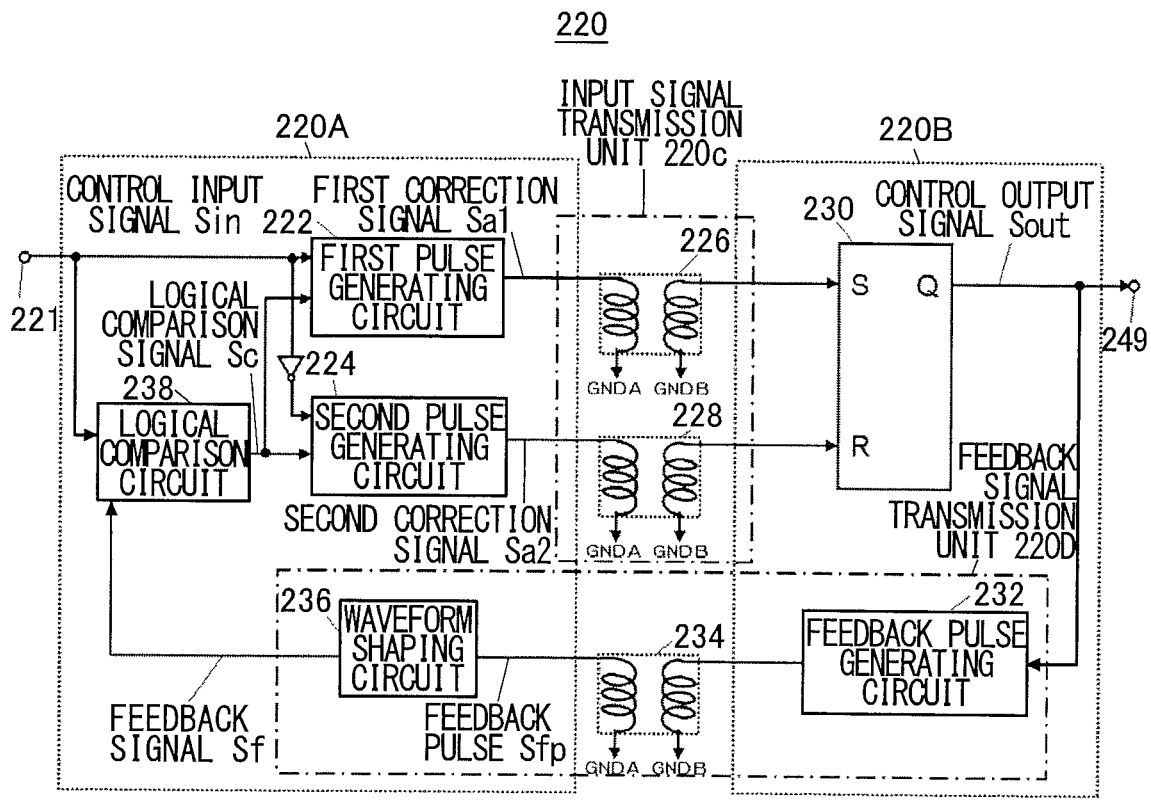
FIG. 2 is a diagram illustrating a signal transmission circuit device according to a second embodiment of the present invention.

FIG. 2 illustrates a signal transmission circuit device according to a second embodiment. In FIG. 2 is a diagram in which a part of FIG. 1 is illustrated as a specific circuit.

A signal transmission circuit device 220 includes an input terminal 221, a first pulse generating circuit 222, a second pulse generating circuit 224, a first transformer 226, a second transformer 228, an RS flip-flop 230, an output terminal 249, a feedback pulse generating circuit 232, a third transformer 234, a waveform shaping circuit 236, and a logical comparison circuit 238.

An input signal transmission unit 220C that transmits the signal from an input side circuit 220A to an output side circuit 220B is constituted of the first transformer 226 and the second transformer 228. A feedback signal transmission unit 220D that transmits the signal from the output side circuit 220B to the input side circuit 220A is constituted of the feedback pulse generating circuit 232, the third transformer 234, and the waveform shaping circuit 236.

The control input signal Sin input to the input terminal 221 is transmitted to the first pulse generating circuit 222 and the second pulse generating circuit 224.

The first pulse generating circuit 222 outputs the first correction signal Sa1 when both the control input signal Sin and the logical comparison signal Sc described later become a first combination (e.g., both signals are the first potential). In other words, the first correction signal Sa1 is a signal for correcting the control output signal Sout to the first potential when the logical comparison result between the control input signal Sin and the feedback signal Sf in the logical comparison circuit 238 is "mismatch" and the control input signal Sin is the first potential.

The second pulse generating circuit 224 outputs the second correction signal Sa2 when the control input signal Sin and the logical comparison signal Sc described later become a second combination different from the first combination (e.g., the control input signal Sin is the second potential while the logical comparison signal Sc is the first potential). In other words, the second correction signal Sa2 is a signal for correcting the control output signal Sout to the second potential when the logical comparison result between the control input signal Sin and the feedback signal Sf in the logical comparison circuit 238 is "mismatch" and the control input signal Sin is the second potential.

The pulse widths of the first correction signal Sa1 and the second correction signal Sa2 are set to be smaller than a pulse width of the control input signal Sin in order to reduce power consumption in the signal transmission. The same is true for other examples in this specification.

The first pulse generating circuit 222 and the second pulse generating circuit 224 may have a structure of generating a single pulse (e.g., the pulse width is set to 25 ns) when the control input signal Sin and the logical comparison signal Sc become a predetermined combination (the first combination or the second combination), or may have a structure of generating a continuous pulse signal (e.g., pulse width is set to 25 ns, and the period is set to 200 ns) when the control input signal Sin and the logical comparison signal Sc become a predetermined combination (the first combination or the second combination). The same is true for other examples in this specification.

When the single pulse is generated, the first pulse generating circuit 222 and the second pulse generating circuit 224 may be constituted as a combination of a logical AND circuit and a rising edge detection circuit, for example.

When the continuous pulse signal is generated, the first pulse generating circuit 222 and the second pulse generating circuit 224 may be constituted as a combination of a logical AND circuit, a ring oscillator, and a rising edge detection circuit, for example.

When the structure of generating the continuous pulse signal is adopted, the first pulse generating circuit 222 and the second pulse generating circuit 224 generate the pulse signal until "mismatch" between the control input signal Sin and the control output signal Sout is canceled, and hence reliability of the signal transmission circuit device is improved.

The first correction signal Sa1 is transmitted to the output side circuit 220B by the first transformer 226 and is input to a set terminal S of the RS flip-flop 230.

The second correction signal Sa2 is transmitted to the output side circuit 220B by the second transformer 228 and input to a reset terminal R of the RS flip-flop 230.

The RS flip-flop 230 receives the first correction signal Sa1 and the second correction signal Sa2, and outputs the control output signal Sout equivalent to the control input signal Sin.

The control output signal Sout is extracted from the output terminal 249 and is transmitted to the feedback pulse generating circuit 232. The feedback pulse generating circuit 232 generates a feedback pulse Sfp having continuous pulses during a period while the control output signal Sout is the second potential. The pulse width of the feedback pulse Sfp is set to 25 ns, and the period of the same is set to 600 ns, for example. As a matter of course, it is possible to adopt a structure of generating the feedback pulse Sfp in a period while the control output signal Sout is the first potential, but in this case, it is necessary to consider convenience of waveform shaping in the waveform shaping circuit 236 and logical comparison in the logical comparison circuit 238.

The feedback pulse generating circuit 232 can be constituted, for example, using an oscillator for generating a rectangular signal (continuous pulse signal), a logical AND circuit for performing a logical AND between the oscillation pulse signal generated from this oscillator and the control output signal Sout, and an inverter circuit as necessary.

The feedback pulse Sfp is transmitted to the input side circuit 220A by the third transformer 234 and is transmitted to the waveform shaping circuit 236. The waveform shaping circuit 236 shapes the feedback pulse Sfp into a rectangular signal that is substantially equivalent to the control output signal Sout.

The waveform shaping circuit 236 can be constituted using a switching transistor, a current source, a capacitor, a comparator, and the like, for example. A specific structure of the circuit will be described later.

The waveform shaping circuit 236 outputs the shaped rectangular signal as the feedback signal Sf, and the output feedback signal Sf is transmitted to the logical comparison circuit 238 and is compared with the control input signal Sin to check whether they are matched or not. The signals are compared with each other, and the logical comparison signal Sc indicating a match or mismatch between the control input signal Sin and the feedback signal Sf is transmitted to the first pulse generating circuit 222 and the second pulse generating circuit 224. The logical comparison circuit 238 can be constituted of an exclusive OR circuit, for example.

Therefore, when the control input signal Sin and the control output signal Sout become "mismatched", the signal transmission circuit device 220 having this structure generates the first correction signal Sa1 or the second correction signal Sa2 in accordance with a potential of the control input signal Sin at that time so as to correct the control output signal Sout. As a result, the control input signal Sin and the control output signal Sout are always kept at the same potential (the first potential or the second potential).

Figure 3:
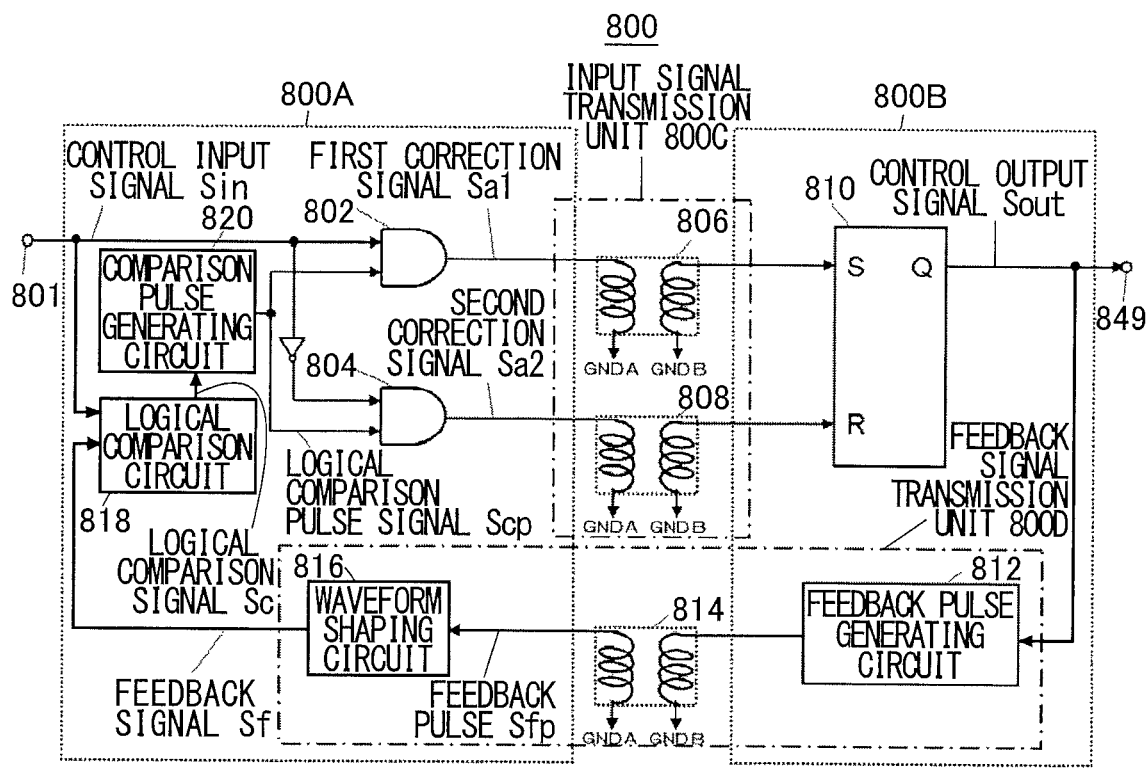
FIG. 3 illustrates a variation example of the second embodiment of the present invention (FIG. 2).

FIG. 3 is a variation example of the signal transmission circuit device 220 illustrated in FIG. 2. A signal transmission circuit device 800 is different from the structure of FIG. 2 in that a comparison pulse generating circuit 820 is disposed that converts the logical comparison signal Sc into a logical comparison pulse signal Scp synchronizing with the logical comparison signal Sc, and a first logical AND circuit 802 and a second logical AND circuit 804 are disposed instead of the first pulse generating circuit 222 and the second pulse generating circuit 224. With this structure, the circuit structure of the signal transmission circuit device can be simplified.

The comparison pulse generating circuit 820 may have a structure in which the single pulse is generated (e.g., the pulse width is set to 25 ns) when the logical comparison signal Sc becomes the first potential, or a structure in which the continuous pulse signal is generated (e.g., the pulse width is set to 25 ns, and the period is set to 200 ns) in a period while the logical comparison signal Sc is the first potential. The same is true for other examples in this specification.

When the single pulse is generated, the comparison pulse generating circuit 820 may be constituted of a rising edge detection circuit, for example.

When the continuous pulse signal is generated, the comparison pulse generating circuit 820 may be constituted as a combination of a ring oscillator and a rising edge detection circuit, for example.

Structures of a first transformer 806, a second transformer 808, an RS flip-flop 810, a feedback pulse generating circuit 812, a third transformer 814, a waveform shaping circuit 816, and a logical comparison circuit 818 in the signal transmission circuit device 800 are the same as structures of the first transformer 226, the second transformer 228, the RS flip-flop 230, the feedback pulse generating circuit 232, the third transformer 234, the waveform shaping circuit 236, and the logical comparison circuit 238 in the signal transmission circuit device 220 illustrated in FIG. 2, and hence detailed description thereof is omitted.

Figure 4:
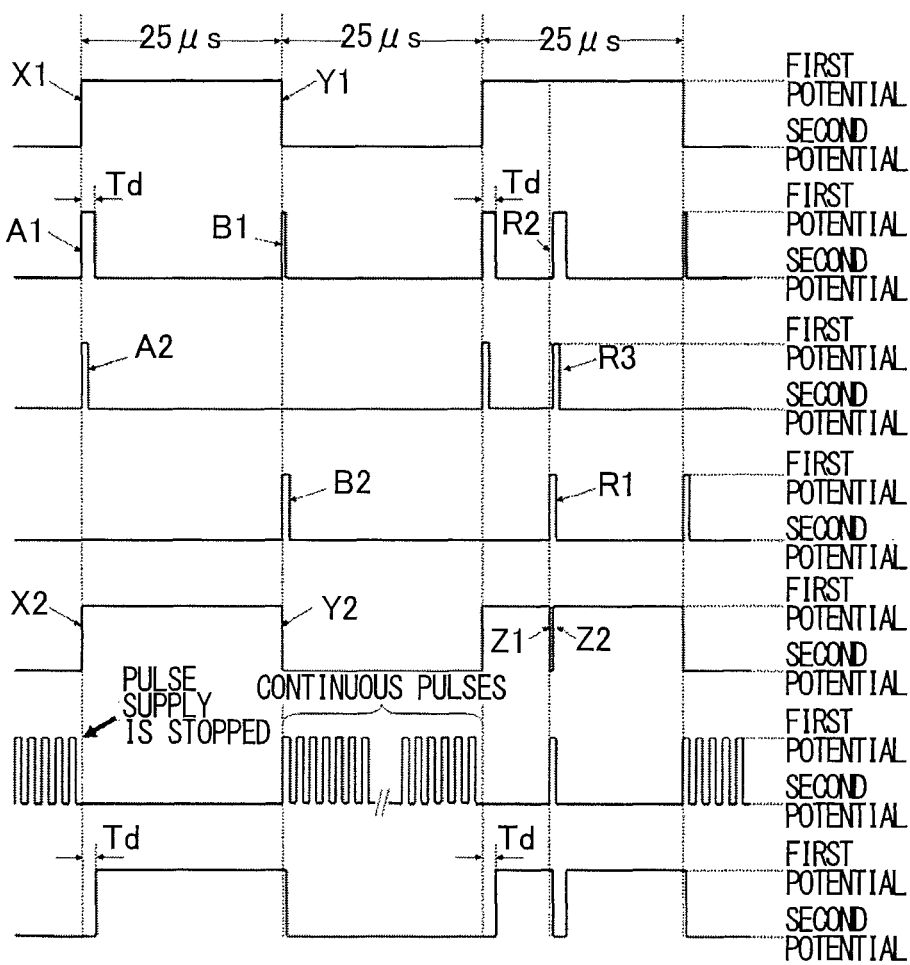
FIGS. 4A, 4B, 4C, 4D, 4E, 4F and 4G are timing charts illustrating pulse signals of individual portions of the second embodiment of the present invention (FIG. 2).

FIG. 4 is a timing chart illustrating signals of individual portions of the signal transmission circuit device 220 illustrated in FIG. 2. A timing chart 500 illustrates transitions of potentials (the first potential or the second potential) with time lapse of the control input signal Sin, the logical comparison signal Sc, the first correction signal Sa1, the second correction signal Sa2, the control output signal Sout, the feedback pulse Sfp, and the feedback signal Sf, described above, in the signal transmission circuit device 220.

Note that some change or phase delay may occur in the signal form or the signal position (phase) in the transmission/reception of this type of signal, but in this specification, it should be understood that such a change or phase delay is neglected except for some of them. In addition, for convenience sake of drawing, a ratio among the pulse widths is not necessarily accurate.

The control input signal Sin illustrated in FIG. 4(*a*) is an example of the control input signal Sin that is input to the input terminal 221 of the signal transmission circuit device 220, which indicates a signal having a pulse width of 25 us and a period of 50 μs.

When the control input signal Sin changes from the second potential to the first potential (FIG. 4(*a*), rising edge X1), because the feedback signal Sf at the moment of change is still the second potential, the logical comparison result in the logical comparison circuit 238 becomes "mismatch". Therefore, the logical comparison signal Sc becomes the first potential (FIG. 4(*b*), rising edge A1).

When the logical comparison signal Sc becomes the first potential, the first pulse generating circuit 222 generates a pulse A2 of FIG. 4(*c*) based on the fact that the control input signal Sin and the logical comparison signal Sc have become the first combination (e.g., both signals have become the first potential).

In order to reduce power consumption in the signal transmission, pulse widths of the first correction signal Sa1 and the second correction signal Sa2 are set sufficiently smaller than that of the control input signal Sin.

Because the first correction signal Sa1 is input to the set terminal S of the RS flip-flop 230 via the first transformer 226, the control output signal Sout is corrected to the same first potential as the control input signal Sin at the same timing as the pulse A2 of FIG. 4(*c*) (FIG. 4(*e*), rising edge X2).

When the control output signal Sout becomes the first potential, the supply of the feedback pulse Sfp is stopped (FIG. 4(*f*)), and the feedback signal Sf is changed to the first potential (FIG. 4(*g*)).

The rising of the feedback signal Sf illustrated in FIG. 4(*g*) is affected by waveform shaping time in the waveform shaping circuit 236 to be delayed by delay time Td. If the input pulse width is sufficiently larger than the delay time Td, the control output signal Sout is not affected. A case where the input pulse width is small will be described later.

When the control input signal Sin is changed from the first potential to the second potential (FIG. 4(*a*), falling edge Y1), because the feedback signal Sf at the moment of change is still the first potential, the logical comparison result in the logical comparison circuit 238 becomes "mismatch", and hence the logical comparison signal Sc becomes the first potential (FIG. 4(*b*), rising edge B1).

When the logical comparison signal Sc becomes the first potential, the second pulse generating circuit 224 generates a pulse B2 of FIG. 4(*d*) based on the fact that the control input signal Sin and the logical comparison signal Sc have becomes the second combination (e.g., the control input signal Sin has become the second potential while the logical comparison signal Sc has become the first potential).

Because the second correction signal Sa2 is input to the reset terminal R of the RS flip-flop 230 via the second transformer 228, the control output signal Sout is corrected to the same second potential as the control input signal Sin at the same timing as the pulse B2 of FIG. 4(*d*) (FIG. 4(*e*), falling edge Y2).

As a result, in a normal operating state of the circuit, the control input signal Sin and the control output signal Sout are kept in the always matched state.

Next, a case where noise R1 of FIG. 4(*d*) is mixed in the second correction signal Sa2 is described below.

When the noise R1 is mixed in the second correction signal Sa2, the control output signal Sout is temporarily changed from the first potential to the second potential (FIG. 4(*e*), falling edge Z1). The potential change in the control output signal Sout is transmitted as a potential change of the feedback signal Sf to the logical comparison circuit 238. Then, the logical comparison circuit 238 becomes the first potential based on the fact that the control input signal Sin and the feedback signal Sf have become "mismatched", as illustrated in FIG. 4(*b*) as a rising edge R2.

Then, because the control input signal Sin is the first potential at present, the first pulse generating circuit 222 transmits a pulse R3 of FIG. 4(*c*) so that the RS flip-flop 230 corrects the control output signal Sout to the first potential based on the pulse R3 (FIG. 4(*e*), rising edge Z2).

As a result, when noise is mixed in the circuit, the logical comparison circuit 238 promptly detects that the control input signal Sin and the control output signal Sout have become "mismatched", and the first correction signal Sa1 or the second correction signal Sa2 is transmitted. Thus, the control output signal Sout is corrected to the same potential as the control input signal Sin (the first potential or the second potential) just after the input and output become "mismatched".

As an abnormal state, in addition to the above-mentioned noise mixing, there is considered a case where the pulse is not transmitted by the first transformer or the second transformer. In this case, too, the output signal correction function works similarly so as to correct the control output signal Sout to the same potential as the control input signal Sin (the first potential or the second potential). Flows of signals of individual portions are the same, and therefore detailed description thereof is omitted.

Here, because of an influence of the waveform shaping time of the feedback pulse Sfp in the waveform shaping circuit 236, the rising of the feedback signal Sf is delayed from the control output signal Sout by the delay time Td in a strict sense.

The length of the delay time Td is approximately 1 to 2 μs, for example. If the pulse width of the control input signal Sin is longer than the delay time Td, the control output signal Sout is not affected at all. However, if the pulse width of the control input signal Sin is shorter than the delay time Td, a pulse width of the control output signal Sout is increased up to the delay time Td. Details are described below.

FIG. 5 illustrates a circuit structure of the waveform shaping circuit 236 that is used for the signal transmission circuit device 220. The waveform shaping circuit 236 includes a switching transistor 904 that is turned on and off by the feedback pulse Sfp input to an input terminal 901, a current source 902 and a capacitor 906 for generating a shaped feedback signal Sfc different from the feedback pulse Sfp in cooperation with the switching transistor 904, a comparator 910 that is supplied with the shaped feedback signal Sfc and generates a feedback signal Sf different from the shaped feedback signal Sfc, and an output terminal 949 for extracting the feedback signal Sf.

The feedback pulse Sfp synchronizing with the control output signal Sout is a signal having continuous pulses in the potential of the shaped feedback signal Sfc, and the pulse width is set to 25 ns while the period is set to 600 ns, for example.

The feedback pulse Sfp is input to a gate electrode of the switching transistor 904. In a period while the feedback pulse Sfp is the first potential, the switching transistor 904 is turned on so as to lead the current supplied from the current source 902 to the GND. In this period, the capacitor 906 is discharged.

In the period while the feedback pulse Sfp is the second potential, the switching transistor 904 is turned off, and the capacitor 906 is charged by the current supplied from the current source 902 so that potential of the shaped feedback signal Sfc is increased.

The shaped feedback signal Sfc is input to the comparator 910. The comparator 910 set the feedback signal Sf to the first potential when the potential of the shaped feedback signal Sfc is higher than a threshold voltage Vref, and sets the feedback signal Sf to the second potential when the potential of the shaped feedback pulse Sfc is lower than the threshold voltage Vref.

In other words, in a period while the pulse signal as the feedback pulse Sfp is regularly supplied, the potential of the shaped feedback signal Sfc does not reach the threshold voltage Vref, and the feedback signal Sf is kept to be the second potential. However, when the supply of the pulse signal is stopped, the capacitor 906 is charged, and the feedback signal Sf becomes the first potential when the charge is accumulated above the threshold voltage Vref.

FIG. 6 is a timing chart illustrating signals of individual portions in the waveform shaping circuit 236, and the control output signal Sout. A timing chart 950 illustrates transitions of potentials with time lapse of the control output signal Sout, the feedback pulse Sfp, the shaped feedback signal Sfc, and the feedback signal Sf, described above, in the signal transmission circuit device 220. As the control output signal Sout, a signal having a pulse width of 25 µs and a period of 50 µs is fed back, for example.

The feedback pulse Sfp is a signal generated by the feedback pulse generating circuit 232 and is a signal having continuous pulses in the potential of the shaped feedback signal Sfc. For instance, the pulse width is set to 25 ns, and the period is set to 600 ns.

The shaped feedback signal Sfc becomes the ground potential in the period while the feedback pulse Sfp is the first potential, and the potential increases by the charge accumulated in the capacitor 906 in the period while the feedback pulse Sfp is the second potential.

The feedback signal Sf becomes the second potential when a potential of the shaped feedback signal Sfc is lower than Vref, and becomes the first potential when the potential of the shaped feedback signal Sfc exceeds Vref.

In other words, based on a time period from a time point when the control output signal Sout becomes the first potential so that the supply of the continuous pulses by the feedback pulse Sfp is stopped until a time point when the capacitor 906 is charged to exceed Vref, the rising of the feedback signal Sf is delayed from the control output signal Sout by the delay time Td.

FIG. 7 is a timing chart of signals of individual portions when the control input signal Sin having a pulse width shorter than the delay time Td described above is input to the signal transmission circuit device 220 illustrated in FIG. 4.

A timing chart 550 illustrates transitions of potentials (the first potential or the second potential) with time lapse of the control input signal Sin, the logical comparison signal Sc, the first correction signal Sa1, the second correction signal Sa2, the control output signal Sout, the feedback pulse Sfp, and the feedback signal Sf, described above, in the signal transmission circuit device 220.

The signal illustrated in FIG. 7(a) is an example of the control input signal Sin input to the input terminal 221, and is a signal having a pulse width of 1 µs and a period of 5 µs. When the control input signal Sin changes from the second potential to the first potential (FIG. 7(a), rising edge X1), because the feedback signal Sf at the moment of change is still the second potential, the logical comparison signal Sc becomes the first potential indicating a mismatch between the control input signal Sin and the feedback signal Sf (FIG. 7(b), rising edge Z1).

When the logical comparison signal Sc becomes the first potential, the first pulse generating circuit 222 generates a pulse A of FIG. 7(c) as the first correction signal Sa1.

The first correction signal Sa1 is input to the set terminal S of the RS flip-flop 230, and the control output signal Sout is corrected to the first potential (FIG. 7(e), rising edge X2).

When the control output signal Sout becomes the first potential, the feedback pulse Sfp stops the supply of the continuous pulses (FIG. 7(f)).

When the control input signal Sin changes from the first potential to the second potential (FIG. 7(a), falling edge Y1), because the feedback signal Sf is still the second potential due to the delay time Td, the logical comparison signal Sc becomes the second potential indicating that the control input signal Sin and the feedback signal Sf are matched (FIG. 7(b), falling edge Z2), and hence the second pulse generating circuit 224 does not generate the pulse at falling of the control input signal Sin (FIG. 7(d)).

When the delay time Td passes after the rising of the control output signal Sout, the feedback signal Sf becomes the first potential (FIG. 7(g), rising edge B1). Because the control input signal Sin is already the second potential at that time, the logical comparison signal Sc becomes the first potential indicating that the feedback signal Sf and the control input signal Sin are "mismatched" (FIG. 7(b), rising edge B2).

When the logical comparison signal Sc becomes the first potential, the second pulse generating circuit generates the second correction signal Sa2 (FIG. 7(d), pulse B3).

The second correction signal Sa2 is input to the reset terminal R of the RS flip-flop 230, and the control output signal Sout is corrected to the second potential (FIG. 7(e), falling edge Y2).

As a result, when the control input signal Sin having a pulse width shorter than the delay time Td is input to the signal transmission circuit device 220, there occurs a malfunction in which the pulse width of the control output signal Sout is increased up to the delay time Td.

In order to overcome this malfunction, there is considered a method of adopting a structure in which the waveform shaping circuit 236 is not used for the feedback signal transmission unit 220D so that the delay time Td is eliminated, or a method of disposing an edge detection circuit of the control input signal Sin in parallel with the first pulse generating circuit 222 and the second pulse generating circuit 224 so that the control input signal Sin is directly reflected on the control output signal Sout. The structure in which the waveform shaping circuit 236 is not used for the feedback signal transmission unit 220D is described in a third embodiment, and the structure of disposing the edge detection circuit of the control input signal Sin is described in a fourth embodiment.

Third Embodiment

Figure 8:
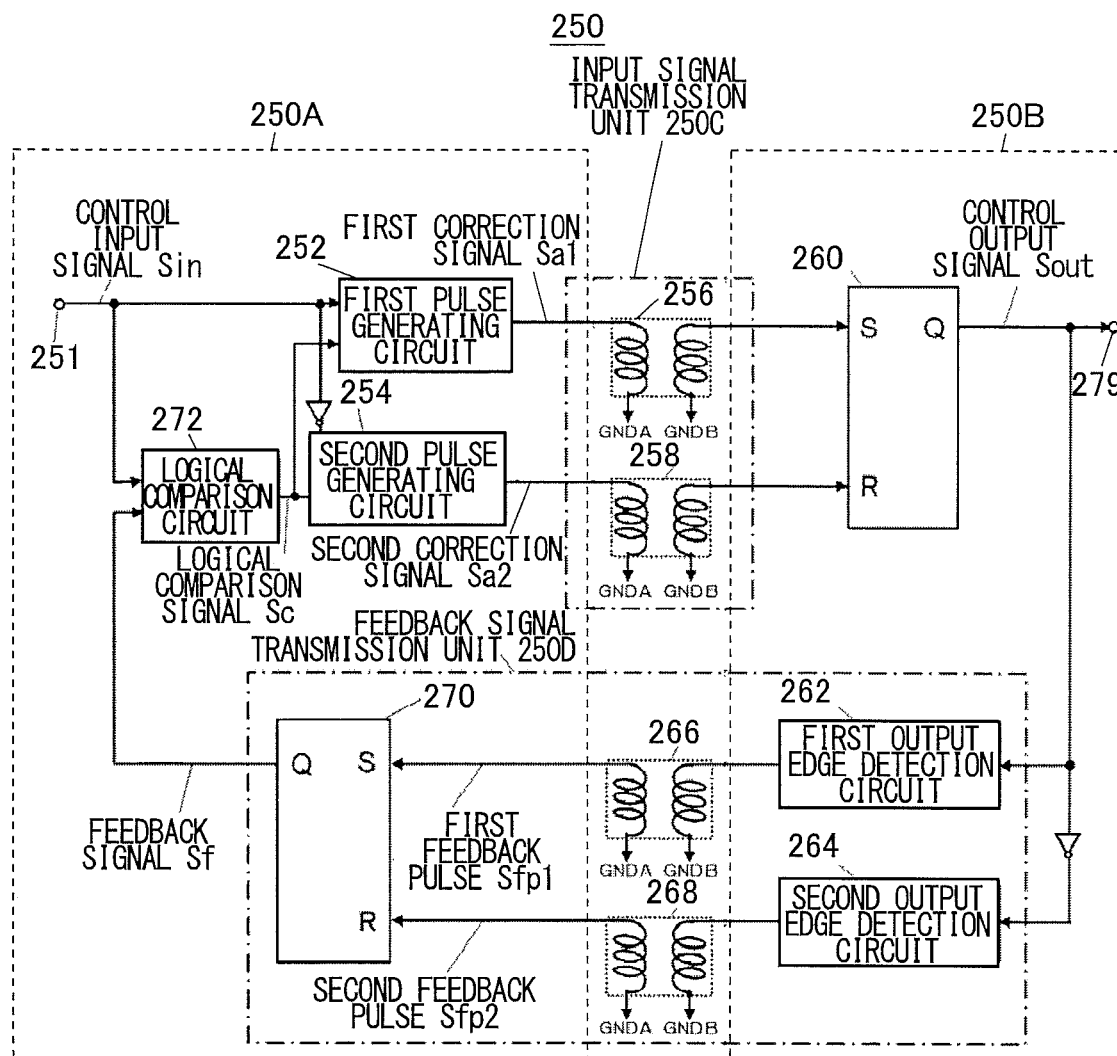
FIG. 8 is a diagram illustrating a signal transmission circuit device according to a third embodiment of the present invention.

FIG. 8 illustrates a signal transmission circuit device according to a third embodiment. A signal transmission circuit device 250 includes an input terminal 251, a first pulse generating circuit 252, a second pulse generating circuit 254, a first transformer 256, a second transformer 258, an RS flip-flop 260, an output terminal 279, a first output edge detection circuit 262, a second output edge detection circuit 264, a third transformer 266, a fourth transformer 268, a second RS flip-flop 270, and a logical comparison circuit 272.

An input signal transmission unit 250C that transmits a signal from an input side circuit 250A to an output side circuit 250B is constituted of the first transformer 256 and the second transformer 258. A feedback signal transmission unit 250D that transmits a signal from the output side circuit 250B to the input side circuit 250A is constituted of the first output edge detection circuit 262, the second output edge detection circuit 264, the third transformer 266, the fourth transformer 268, and the second RS flip-flop 270.

The signal transmission circuit device 250 is different from the structure of FIG. 2 in that the feedback signal transmission unit 250D is constituted of the first output edge detection circuit 262, the second output edge detection circuit 264, the third transformer 266, the fourth transformer 268, and the second RS flip-flop 270, in order to overcome a malfunction due to the delay time Td in the signal transmission circuit device 220 illustrated in FIG. 2.

Structures of the first pulse generating circuit 252, the second pulse generating circuit 254, the first transformer 256, the second transformer 258, the RS flip-flop 260, and the logical comparison circuit 272 in the signal transmission circuit device 250 are the same as the first pulse generating circuit 222, the second pulse generating circuit 224, the first transformer 226, the second transformer 228, the RS flip-flop 230, and the logical comparison circuit 238 in the signal transmission circuit device 220 illustrated in FIG. 2, and thus detailed description thereof is omitted.

The control output signal Sout restored in the output side circuit 250B is temporarily converted into a first feedback pulse Sfp1 and a second feedback pulse Sfp2 by the first output edge detection circuit 262 for detecting the rising edge of the control output signal Sout and the second output edge detection circuit 264 for detecting the falling edge of the control output signal Sout, and then the feedback pulses are transmitted to the input side circuit 250A by the third transformer 266 and the fourth transformer 268.

The first feedback pulse Sfp1 and the second feedback pulse Sfp2 are restored to the feedback signal Sf equivalent to the control output signal Sout by the second RS flip-flop 270 in the input side circuit 250A.

Because the feedback signal transmission unit 250D of the signal transmission circuit device 250 has no waveform shaping circuit, the rising of the feedback signal Sf is hardly delayed from the control output signal Sout.

Figure 9:
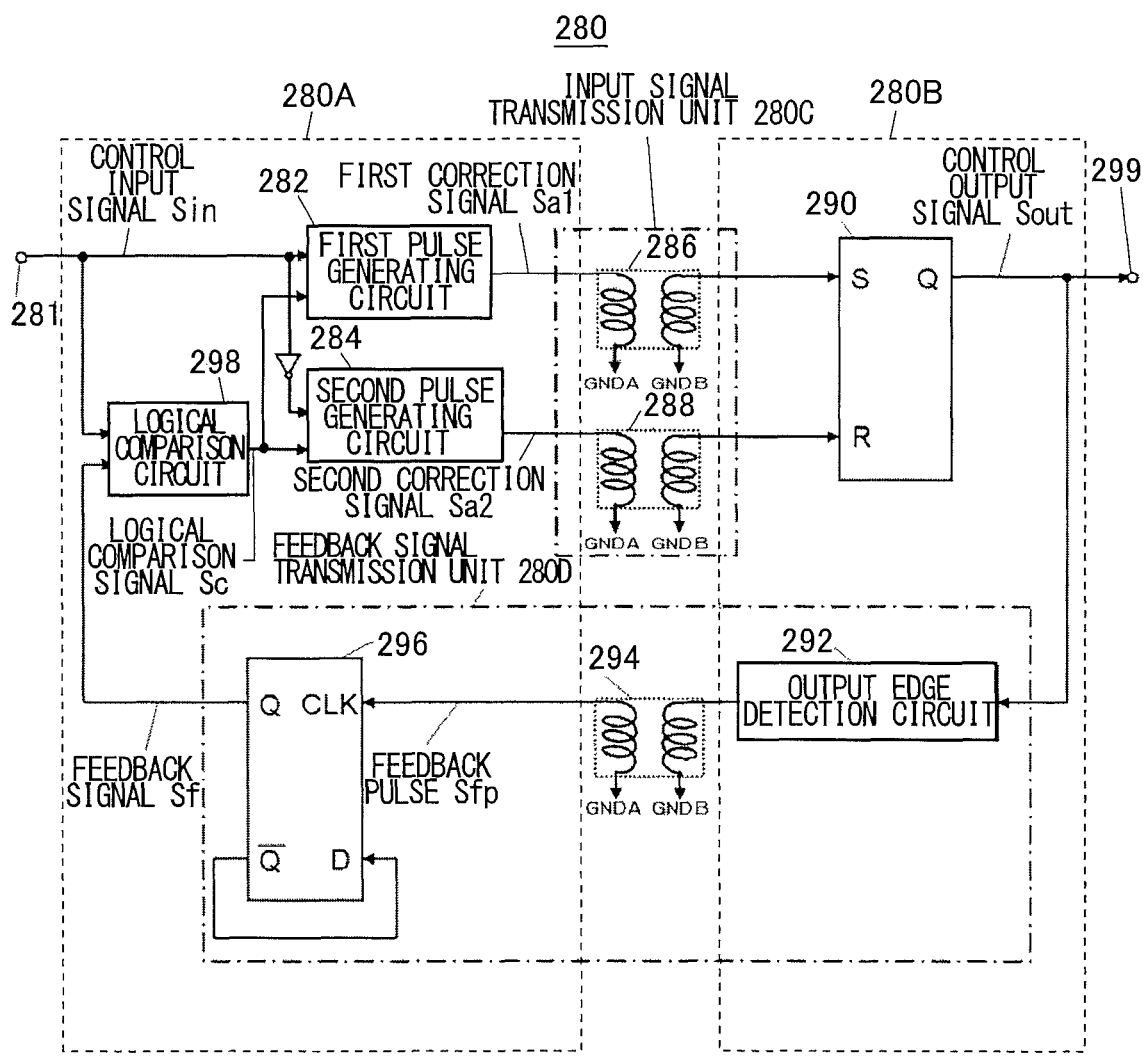
FIG. 9 illustrates a variation example of the third embodiment of the present invention (FIG. 8).

FIG. 9 is a variation example of the signal transmission circuit device 250 illustrated in FIG. 8. A signal transmission circuit device 280 is different from the structure of FIG. 8 in that a feedback signal transmission unit 280D is constituted of an output edge detection circuit 292, a third transformer 294, and a D flip-flop 296.

Structures of a first pulse generating circuit 282, a second pulse generating circuit 284, a first transformer 286, a second transformer 288, an RS flip-flop 290, and a logical comparison circuit 298 in the signal transmission circuit device 280 are the same as the first pulse generating circuit 252, the second pulse generating circuit 254, the first transformer 256, the second transformer 258, the RS flip-flop 260, and the logical comparison circuit 272 in the signal transmission circuit device 250 illustrated in FIG. 8, and thus detailed description thereof is omitted.

The output edge detection circuit 292 detects the rising edge and the falling edge of the control output signal Sout so as to generate the feedback pulse Sfp. The feedback pulse Sfp is transmitted to an input side circuit 280A by the third transformer 294 and is input to a clock terminal CLK of the D flip-flop 296.

The D flip-flop 296 is constituted so that the output potential of an output terminal Q (the first potential or the second potential) changes at the rising timing of the pulse input to the clock terminal CLK. As a result, the control output signal Sout is temporarily changed to the feedback pulse Sfp by the output edge detection circuit 292, and then is restored to the feedback signal Sf equivalent to the control output signal Sout by the D flip-flop 296.

With this structure, the number of transformers in the feedback signal transmission unit 280D can be reduced to one, and hence the signal transmission circuit device can be downsized.

However, because the pulse indicating the rising edge of the control output signal Sout and the pulse indicating the falling edge of the control output signal Sout are input to one clock terminal CLK, the signal transmission circuit device 280 is vulnerable to noise, and hence noise immunity characteristic of the signal transmission circuit device 280 becomes weaker than that of FIG. 8.

Figure 10:
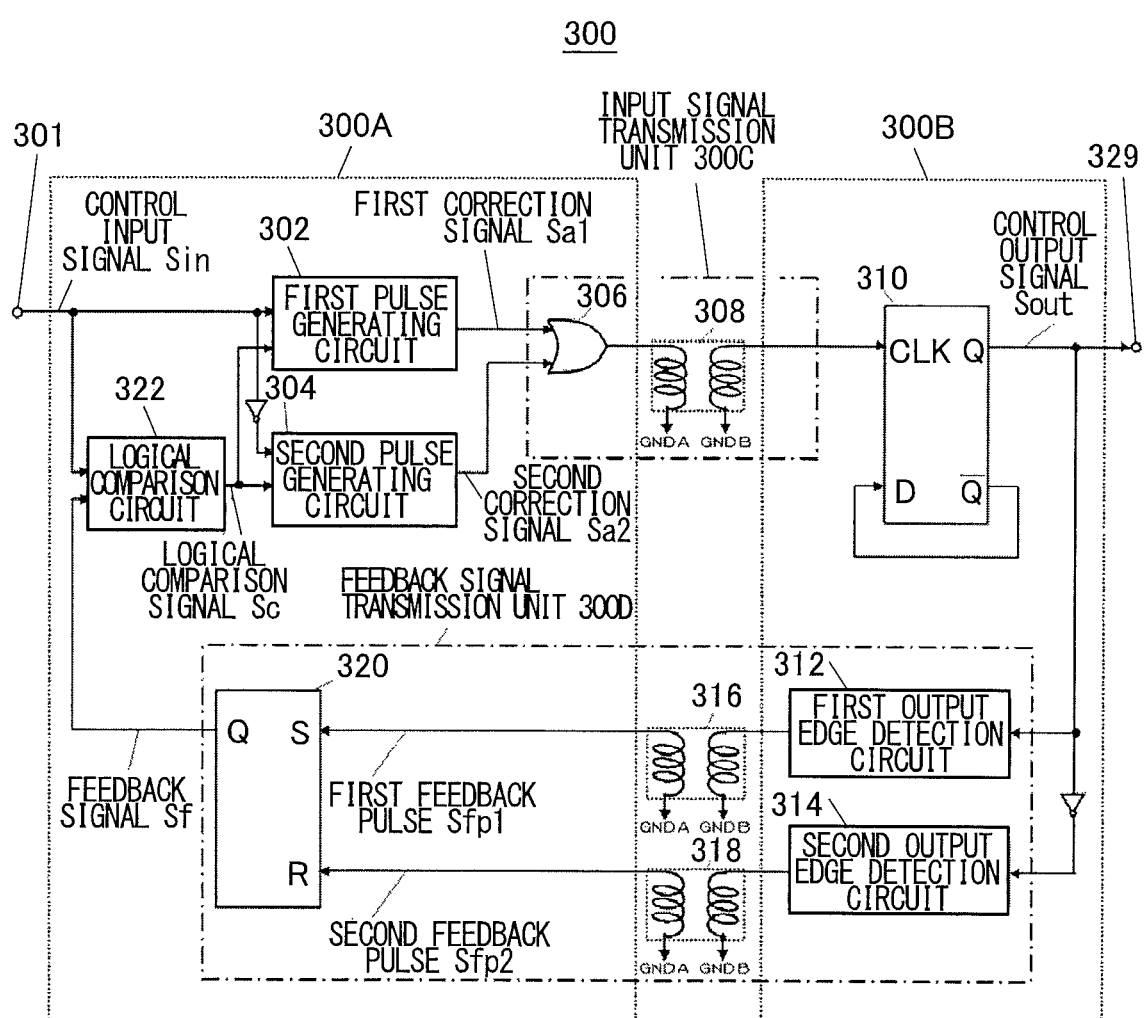
FIG. 10 illustrates another variation example of the third embodiment of the present invention (FIG. 8).

FIG. 10 illustrates another variation example of the signal transmission circuit device 250 illustrated in FIG. 8. A signal transmission circuit device 300 is different from the structure of FIG. 8 in that a logical OR circuit 306 is disposed for performing logical OR process between the first correction signal Sa1 and the second correction signal Sa2 so that the number of transformers in an input signal transmission unit 300C is reduced to one, and that an output side circuit 300B uses a D flip-flop 310 instead of the RS flip-flop 260.

Structures of a first pulse generating circuit 302, a second pulse generating circuit 304, a first output edge detection circuit 312, a second output edge detection circuit 314, a second transformer 316, a third transformer 318, an RS flip-flop 320, and a logical comparison circuit 322 in the signal transmission circuit device 300 are the same as the first pulse generating circuit 252, the second pulse generating circuit 254, the first output edge detection circuit 262, the second output edge detection circuit 264, the third transformer 266, the fourth transformer 268, the second RS flip-flop 270, and the logical comparison circuit 272 in the signal transmission circuit device 250 illustrated in FIG. 8, and thus detailed description thereof is omitted.

With this structure, the number of transformers in the input signal transmission unit 300C can be reduced to one so that the circuit can be downsized.

However, in the signal transmission circuit device 300, because the first correction signal Sa1 for correcting the control output signal Sout to the first potential and the second correction signal Sa2 for correcting the control output signal Sout to the second potential are input to the single clock terminal CLK, it is necessary to design considering pulse widths, phase delays, and the like of the signals. In addition, the first pulse generating circuit 302 and the second pulse generating circuit 304 are constituted to generate a single pulse.

Figure 11:
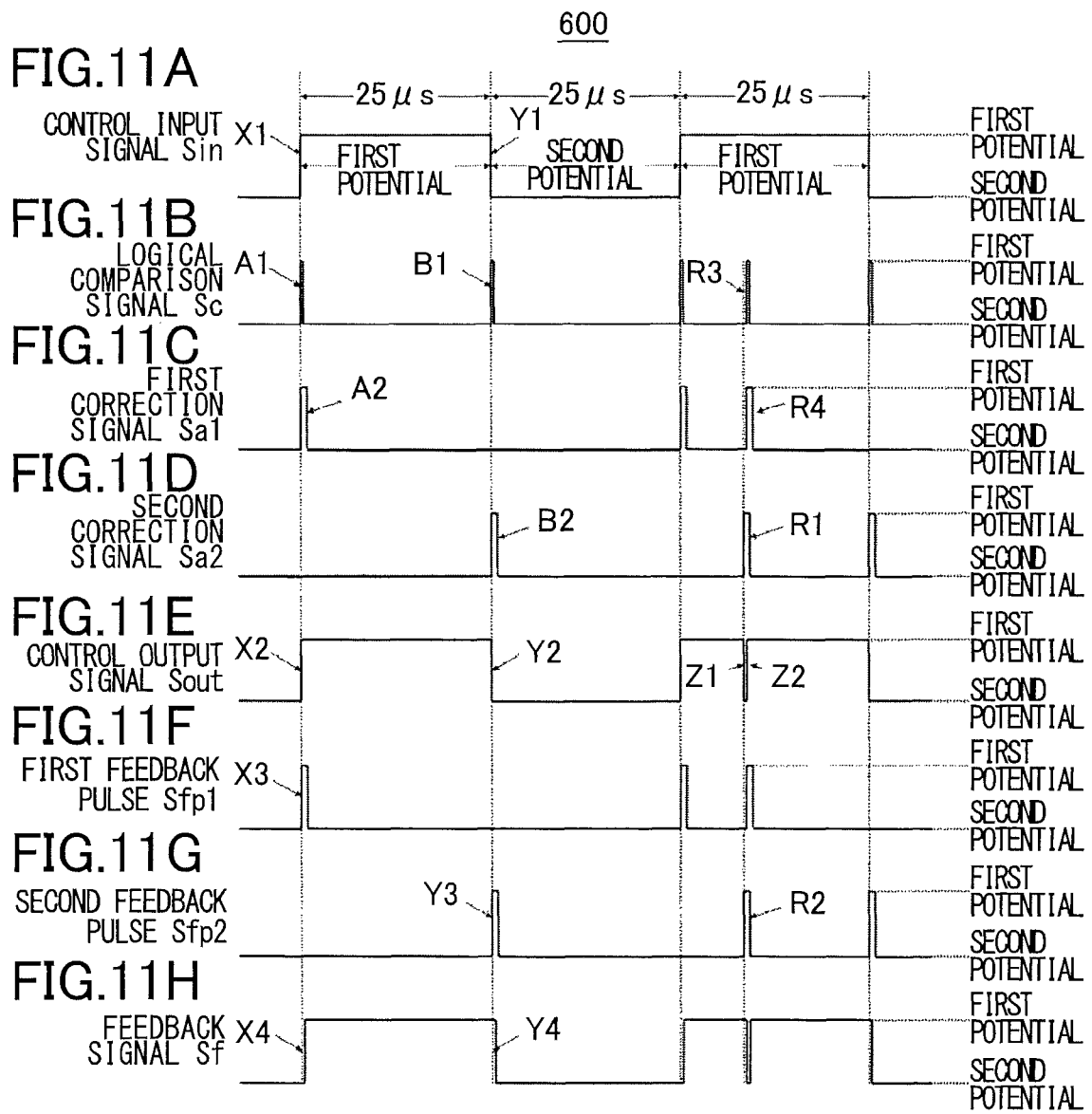
FIGS. 11A, 11B, 11C, 11D, 11E, 11F, 11G and 11H are timing charts illustrating pulse signals of individual portions of the third embodiment of the present invention (FIG. 8).

FIG. 11 is a timing chart illustrating signals of individual portions of the signal transmission circuit device 250 illustrated in FIG. 8. A timing chart 600 illustrates transitions of potentials (the first potential or the second potential) with time lapse of the control input signal Sin, the logical comparison signal Sc, the first correction signal Sa1, the second correction signal Sa2, the control output signal Sout, the first feedback pulse Sfp1, the second feedback pulse Sfp2, and the feedback signal Sf described above, in the signal transmission circuit device 250. In addition, for convenience sake of drawing, a ratio among the pulse widths is not necessarily precise.

The signal illustrated in FIG. 11(*a*) is an example of the control input signal Sin input to the input terminal 251 of the signal transmission circuit device 250, and is a signal having a pulse width of 25 µs and a period of 50 µs.

When the control input signal Sin changes from the second potential to the first potential (FIG. 11(*a*), rising edge X1), because the feedback signal Sf at the moment of change is still the second potential, the logical comparison result in the logical comparison circuit 272 becomes "mismatch", and hence the logical comparison signal Sc becomes the first potential (FIG. 11(*b*), rising edge A1).

When the logical comparison signal Sc becomes the first potential, the first pulse generating circuit 252 generates the pulse A2 of FIG. 11(*c*) based on the fact that the control input signal Sin and the logical comparison signal Sc have become the first combination (e.g., both signals have become the first potential).

Here, in order to reduce power consumption in the signal transmission, pulse widths of the first correction signal Sa1 and the second correction signal Sa2 are set sufficiently smaller than that of the control input signal Sin.

Because the first correction signal Sa1 is input to the set terminal S of the RS flip-flop 260 via the first transformer 256, the control output signal Sout is corrected to the same first potential as the control input signal Sin at the same timing as the pulse A2 of FIG. 11(*c*) (FIG. 11(*e*), rising edge X2).

When the control output signal Sout is changed from the second potential to the first potential, the first output edge detection circuit 262 generates a pulse X3 of FIG. 11(*f*) as the first feedback pulse Sfp1.

Pulse widths of the first feedback pulse Sfp1 and the second feedback pulse Sfp2 are set to 25 ns, for example, which is sufficiently smaller than the pulse width of the control output signal Sout.

Because the first feedback pulse Sfp1 is transmitted to the input side circuit 250A by the third transformer 266 and is input to the set terminal S of the second RS flip-flop 270, the feedback signal Sf becomes the first potential (FIG. 11(*h*), rising edge X4).

In the feedback signal transmission unit 250D of the signal transmission circuit device 250, because there is no delay by the waveform shaping circuit, the rising of the feedback signal Sf is substantially simultaneous with the rising of the control output signal Sout.

When the control input signal Sin changes from the first potential to the second potential (FIG. 11(*a*), falling edge Y1), because the feedback signal Sf at the moment of change is still the first potential, the logical comparison result in the logical comparison circuit 272 becomes "mismatch", and hence the logical comparison signal Sc becomes the first potential (FIG. 11(*b*), rising edge B1).

When the logical comparison signal Sc becomes the first potential, the second pulse generating circuit 254 generates a pulse B2 of FIG. 11(*d*) based on the fact that the control input signal Sin and the logical comparison signal Sc have becomes the second combination (e.g., the control input signal Sin has become the second potential while the logical comparison signal Sc has becomes the first potential).

Because the second correction signal Sa2 is input to the reset terminal R of the RS flip-flop 260 via the second transformer 258, the control output signal Sout is corrected to the same second potential as the control input signal Sin at the same timing as the pulse B2 of FIG. 11(*d*) (FIG. 11(*e*), falling edge Y2).

When the control output signal Sout is changed from the first potential to the second potential, the second output edge detection circuit 264 generates a pulse Y3 of FIG. 11(*g*) as the second feedback pulse Sfp2.

Because the second feedback pulse Sfp2 is transmitted to the input side circuit 250A by the fourth transformer 268 and is input to the reset terminal R of the second RS flip-flop 270, the feedback signal Sf is changed to the second potential (FIG. 11(*h*), falling edge Y4).

As a result, in a normal operating state of the circuit, potentials of the control input signal Sin and the control output signal Sout (the first potential or the second potential) are kept in the always matched state.

In addition, because the feedback signal Sf is hardly delayed from the control output signal Sout, the signal transmission circuit device 250 illustrated in FIG. 8 can output the control output signal Sout that is precise with respect to the control input signal Sin having a pulse width shorter than that of the signal transmission circuit device 220 illustrated in FIG. 2.

Next, a case where noise R1 of FIG. 11(*d*) is mixed in the second correction signal Sa2 is described below.

When the noise R1 is mixed in the second correction signal Sa2, the control output signal Sout is temporarily changed from the first potential to the second potential (FIG. 11(*e*), falling edge Z1). The potential change in the control output signal Sout is reflected on the feedback signal Sf by the second feedback pulse Sfp2 (FIG. 11(*g*), pulse R2), and the logical comparison circuit 272 becomes the first potential based on the fact that the control input signal Sin and the feedback signal Sf have become "mismatched" (FIG. 11(*b*), rising edge R3).

Then, because the control input signal Sin is the first potential at present, the first pulse generating circuit 252 transmits a pulse denoted by R4 in FIG. 11(*c*) as the first correction signal Sa1 so that the RS flip-flop 260 corrects the control output signal Sout to the first potential based on the pulse R4 (FIG. 11(*e*), rising edge Z2).

As a result, when noise is mixed in the circuit, the logical comparison circuit 272 promptly detects that the control input signal Sin and the control output signal Sout have become "mismatched", and the first correction signal Sa1 or the second correction signal Sa2 is transmitted. Thus, the control output signal Sout is corrected to the same potential as the control input signal Sin (the first potential or the second potential) just after the input and output become "mismatched".

As an abnormal state, in addition to the above-mentioned noise mixing, there is considered a case, for example, where the pulse is not transmitted by the first transformer 256 or the second transformer 258. In this case too, the output signal correction function works similarly so as to correct the control output signal Sout to the same potential as the control input signal Sin (the first potential or the second potential). Flows of signals of individual portions are the same, and therefore detailed description thereof is omitted.

However, in the signal transmission circuit device 250, the feedback signal transmission unit 250D is constituted of the first output edge detection circuit 262, the second output edge detection circuit 264, the third transformer 266, the fourth transformer 268, and the second RS flip-flop 270.

Therefore, if noise is mixed in the first feedback pulse Sfp1, a malfunction may occur that the normal feedback signal Sf is not fed back to the input side circuit 250A. The signal transmission circuit device that overcomes the malfunction is described below in a fourth embodiment.

Fourth Embodiment

Figure 12:
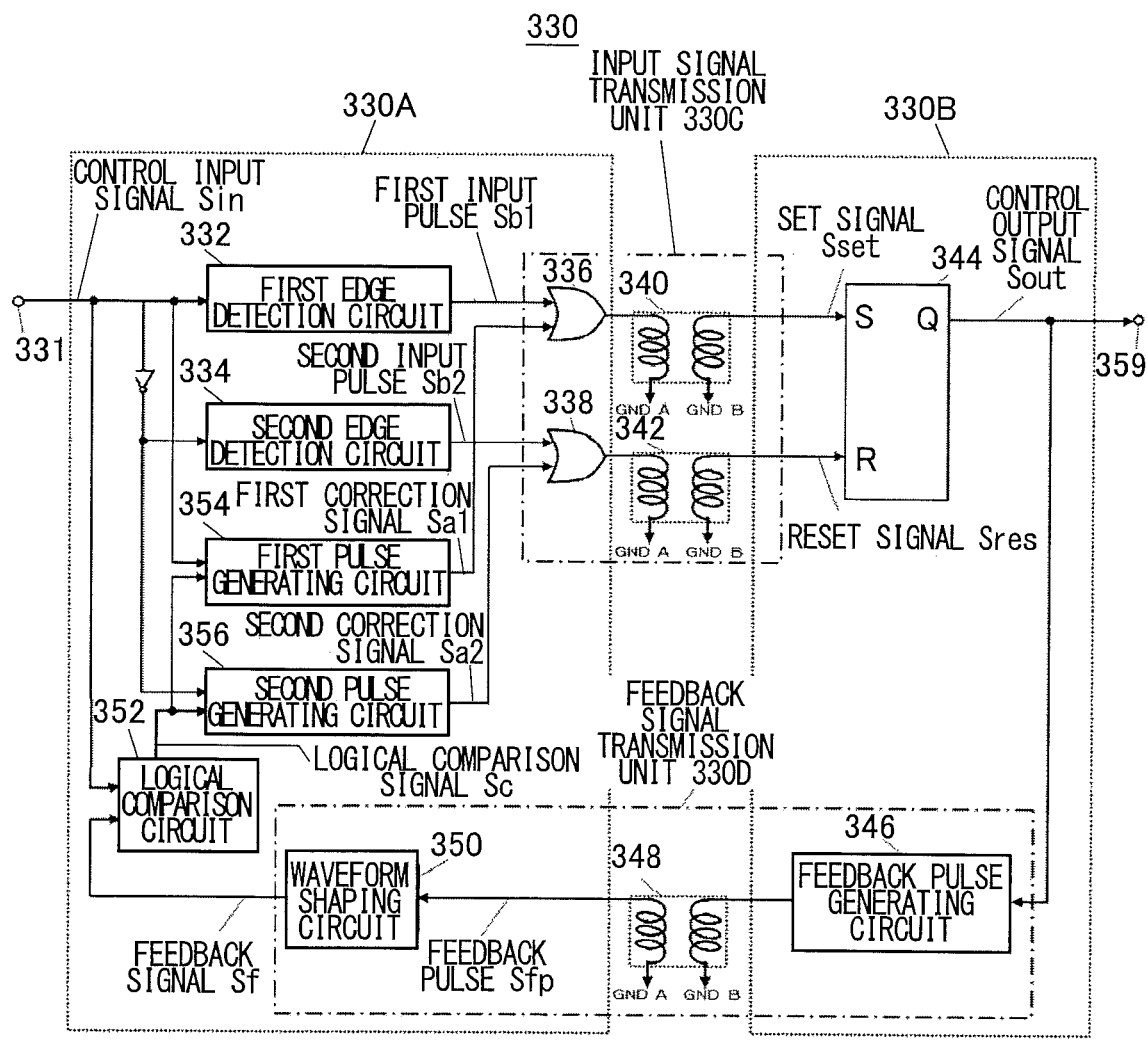
FIG. 12 is a diagram illustrating a signal transmission circuit device according to a fourth embodiment of the present invention.

FIG. 12 illustrates a signal transmission circuit device according to the fourth embodiment. A signal transmission circuit device 330 includes an input terminal 331, a first edge detection circuit 332, a second edge detection circuit 334, a first logical OR circuit 336, a second logical OR circuit 338, a first transformer 340, a second transformer 342, an RS flip-flop 344, an output terminal 359, a feedback pulse generating circuit 346, a third transformer 348, a waveform shaping circuit 350, a logical comparison circuit 352, a first pulse generating circuit 354, and a second pulse generating circuit 356.

An input signal transmission unit 330C that transmits a signal from an input side circuit 330A to an output side circuit 330B is constituted of the first logical OR circuit 336, the second logical OR circuit 338, the first transformer 340, and the second transformer 342. A feedback signal transmission unit 330D that transmits a signal from the output side circuit 330B to the input side circuit 330A is constituted of the feedback pulse generating circuit 346, the third transformer 348, and the waveform shaping circuit 350.

The signal transmission circuit device 330 has a structure different from FIG. 2 in that it includes the first edge detection circuit 332 that detects a rising edge of the control input signal Sin and outputs a first input pulse Sb1, the second edge detection circuit 334 that detects a falling edge of the control input signal Sin and outputs a second input pulse Sb2, the first logical OR circuit 336 that performs a logical OR process of the first input pulse Sb1 and the first correction signal Sa1, and the second logical OR circuit 338 that performs a logical OR process of the second input pulse Sb2 and the second correction signal Sa2.

The control input signal Sin input to the input terminal 331 is converted into the first input pulse Sb1 indicating a rising edge of the control input signal Sin and the second input pulse Sb2 indicating a falling edge of the control input signal Sin by the first edge detection circuit 332 and the second edge detection circuit 334. Pulse widths of the first input pulse Sb1 and the second input pulse Sb2 are set smaller than the pulse width of the control input signal Sin in order to reduce power consumption in the first transformer 340 and the second transformer 342.

The first input pulse Sb1 and the first correction signal Sa1 described later are processed by the first logical OR circuit 336 as a logical OR process, and are converted into a set signal Sset that is a logical OR of the first input pulse Sb1 and the first correction signal Sa1. The set signal Sset is transmitted to the output side circuit 330B by the first transformer 340 and is input to the set terminal S of the RS flip-flop 344.

The second input pulse Sb2 and the second correction signal Sa2 described later are processed by the second logical OR circuit 338 as a logical OR process, and are converted into a reset signal Sres that is a logical OR of the second input pulse Sb2 and the second correction signal Sa2. The reset signal Sres is transmitted to the output side circuit 330B by the second transformer 342 and is input to the reset terminal R of the RS flip-flop 344.

The RS flip-flop 344 outputs the control output signal Sout equivalent to the control input signal Sin based on the set signal Sset and the reset signal Sres.

The control output signal Sout output from the RS flip-flop 344 is extracted from the output terminal 359 and is transmitted to the feedback pulse generating circuit 346. The feedback pulse generating circuit 346 generates the feedback pulse Sfp having continuous pulses during a period while the control output signal Sout is the second potential.

The feedback pulse Sfp is set to have a pulse width of 25 ns and a period of 600 ns, for example. As a matter of course, it is possible to adopt a structure in which the feedback pulse Sfp is generated during a period while the control output signal Sout is the first potential. In this case, it is necessary to consider convenience of waveform shaping in the waveform shaping circuit 350 and logical comparison in the logical comparison circuit 352.

The feedback pulse generating circuit 346 can be constituted, for example, using an oscillator for generating a rectangular signal (continuous pulse signal), a logical AND circuit for performing a logical AND between the oscillation pulse signal generated from this oscillator and the control output signal Sout, and an inverter circuit as necessary.

The feedback pulse Sfp is transmitted to the input side circuit 330A by the third transformer 348, and is transmitted to the waveform shaping circuit 350. The waveform shaping circuit 350 shapes the feedback pulse Sfp into a rectangular signal that is substantially equivalent to the control output signal Sout.

The waveform shaping circuit 350 can be constituted using a switching transistor, a current source, a capacitor, a comparator, and the like, for example. The circuit structure is the same as the second embodiment. A specific structure of the circuit is as illustrated in FIG. 5.

The waveform shaping circuit 350 outputs the shaped rectangular signal as the feedback signal Sf, and the output feedback signal Sf is transmitted to the logical comparison circuit 352 and is compared with the control input signal Sin to check whether they are matched or not. The signals are compared with each other, and the logical comparison signal Sc indicating a match or mismatch between the control input signal Sin and the feedback signal Sf is transmitted to the first pulse generating circuit 354 and the second pulse generating circuit 356. The logical comparison circuit 352 can be constituted of an exclusive OR circuit, for example.

The first pulse generating circuit 354 outputs the first correction signal Sa1 when the control input signal Sin and the logical comparison signal Sc have become the first combination (e.g., both signals have become the first potential). In other words, the first correction signal Sa1 is a signal for correcting the control output signal Sout to the first potential when the logical comparison result between the control input signal Sin and the feedback signal Sf in the logical comparison circuit 352 is "mismatch" and the control input signal Sin is the first potential.

A logical OR process of the first correction signal Sa1 and the first input pulse Sb1 is performed, and the result is input to the set terminal S of the RS flip-flop 344 in the output side circuit 330B. The first correction signal Sa1 and the first input pulse Sb1 have a relationship of mutual complementation.

The second pulse generating circuit 356 outputs the second correction signal Sa2 when the control input signal Sin and the logical comparison signal Sc have become the second combination different from the first combination (e.g., the control input signal Sin has become the second potential while the logical comparison signal Sc has become the first potential). In other words, the second correction signal Sa2 is a signal for correcting the control output signal Sout to the second potential when the logical comparison result between the control input signal Sin and the feedback signal Sf in the logical comparison circuit 352 is "mismatch" and the control input signal Sin is the second potential.

A logical OR process between the second correction signal Sa2 and the second input pulse Sb2 is performed, and the result is input to the reset terminal R of the RS flip-flop 344 in the output side circuit 330B. The second correction signal Sa2 and the second input pulse Sb2 have a relationship of mutual complementation.

In other words, in the signal transmission circuit device 330, the potential change in the control input signal Sin is converted into the first input pulse Sb1 or the second input pulse Sb2 by the first edge detection circuit 332 or the second edge detection circuit 334 and input to the set terminal S or the reset terminal R of the RS flip-flop 344, so as to be promptly reflected on the control output signal Sout.

In addition, even if the control input signal Sin is not correctly transmitted to the control output signal Sout due to some abnormal state in the circuit, the logical comparison circuit 352 detects the "mismatch" between the control input signal Sin and the feedback signal Sf. Then, the first pulse generating circuit 354 or the second pulse generating circuit 356 outputs the first correction signal Sa1 or the second correction signal Sa2. Therefore, the control output signal Sout is always kept at the same potential as the control input signal Sin (the first potential or the second potential).

Figure 13:
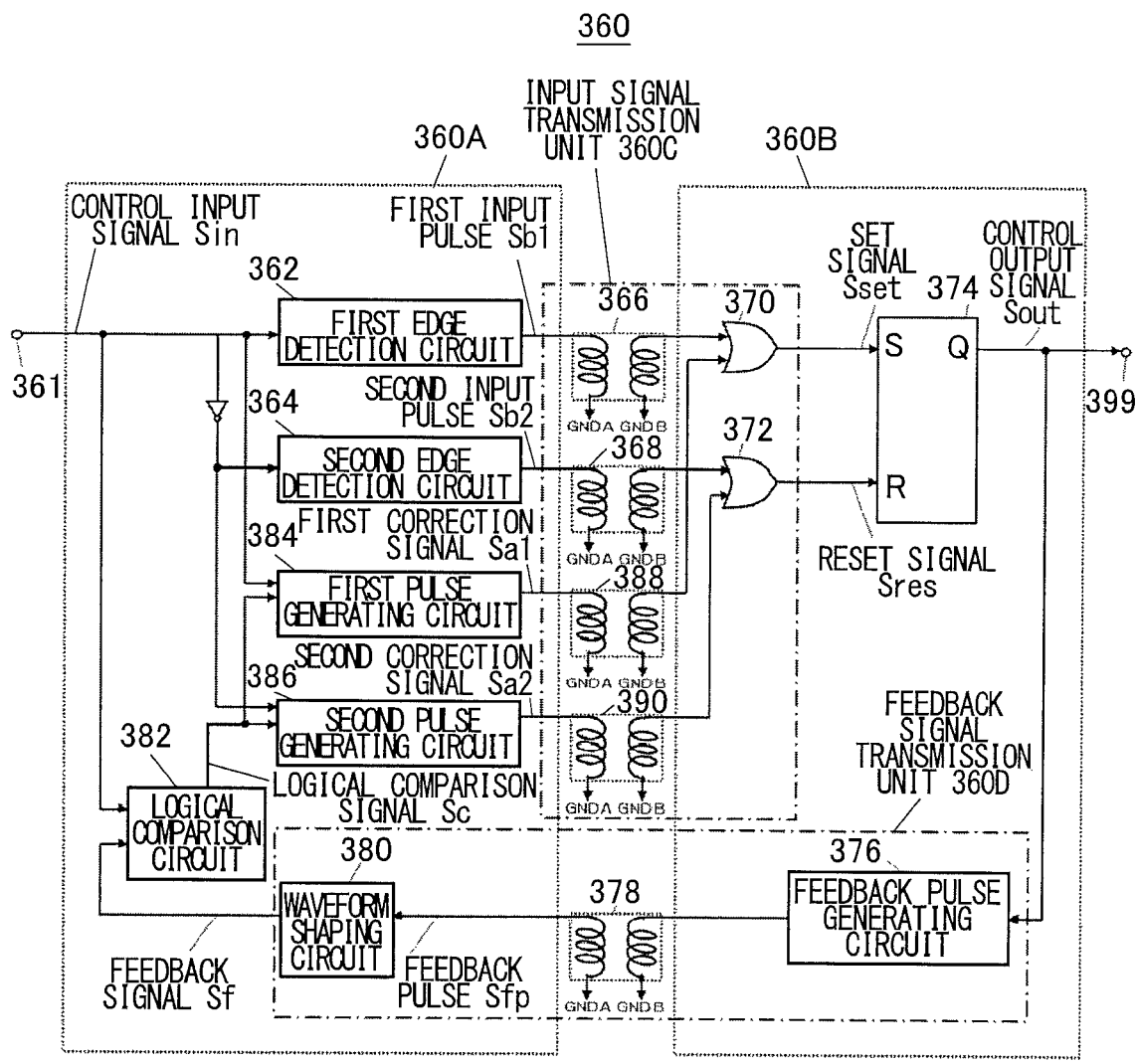
FIG. 13 is a variation example of the fourth embodiment of the present invention (FIG. 12).

In the signal transmission circuit device 330, the first logical OR circuit 336 and the second logical OR circuit 338 are disposed in the input side circuit 330A, but it is possible to adopt a structure in which they are disposed in the output side circuit 330B. The above-mentioned variation example is illustrated in FIG. 13.

A signal transmission circuit device 360 has a structure different from FIG. 12 as follows. The signal transmission circuit device 360 includes a first transformer 366 that transmits the first input pulse Sb1 to an output side circuit 360B, a second transformer 368 that transmits the second input pulse Sb2 to the output side circuit 360B, a third transformer 388 that transmits the first correction signal Sa1 to the output side circuit 360B, and a fourth transformer 390 that transmits the second correction signal Sa2 to the output side circuit 360B. In addition, the output side circuit 360B includes a first logical OR circuit 370 that performs a logical OR process between the first input pulse Sb1 and the first correction signal Sa1, and a second logical OR circuit 372 that performs a logical OR process between the second input pulse Sb2 and the second correction signal Sa2.

Structures of a first edge detection circuit 362, a second edge detection circuit 364, a RS flip-flop 374, a feedback pulse generating circuit 376, a fifth transformer 378, a waveform shaping circuit 380, a logical comparison circuit 382, a first pulse generating circuit 384, and a second pulse generating circuit 386 in the signal transmission circuit device 360 are the same as the structures of the first edge detection circuit 332, the second edge detection circuit 334, the RS flip-flop 344, the feedback pulse generating circuit 346, the third transformer 348, the waveform shaping circuit 350, the logical comparison circuit 352, the first pulse generating circuit 354, and the second pulse generating circuit 356 in the signal transmission circuit device 330 illustrated in FIG. 12, and therefore detailed description thereof is omitted.

With this structure, the first input pulse Sb1, the second input pulse Sb2, the first correction signal Sa1, and the second correction signal Sa2 are transmitted to the output side circuit 360B by another transformer. Therefore, life of the transformer in an input signal transmission unit 360C can be increased.

Figure 14:
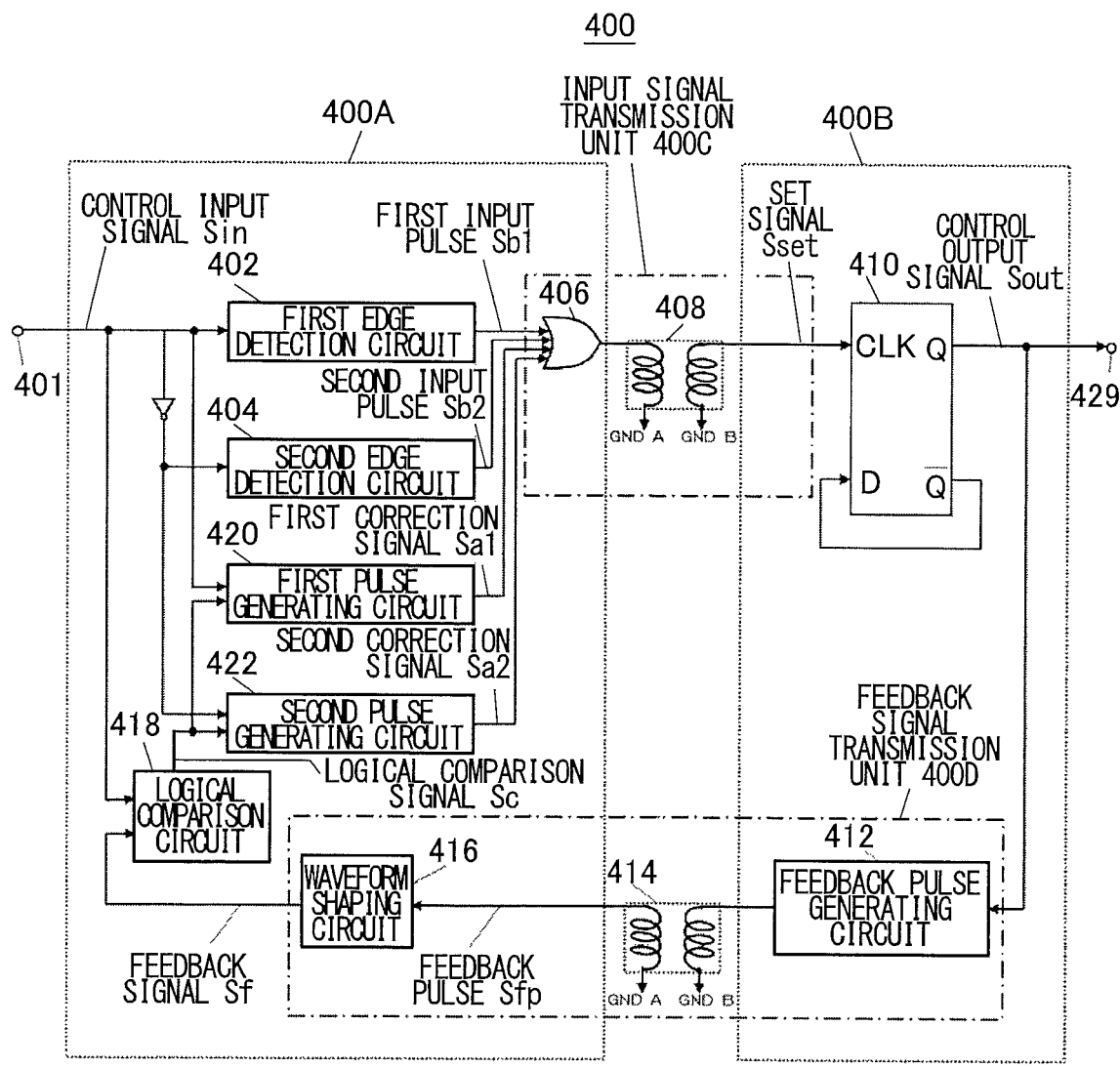
FIG. 14 is another variation example of the fourth embodiment of the present invention (FIG. 12).

FIG. 14 illustrates another variation example of the signal transmission circuit device 330 illustrated in FIG. 12. A signal transmission circuit device 400 is different from FIG. 12 in the following structure. The signal transmission circuit device 400 includes a logical OR circuit 406 that performs a logical OR process among the first input pulse Sb1, the second input pulse Sb2, the first correction signal Sa1, and the second correction signal Sa2 instead of the first logical OR circuit 336 and the second logical OR circuit 338. Thus, the number of transformers in an input signal transmission unit 400C is reduced to one. In addition, a D flip-flop 410 is used instead of the RS flip-flop 344 in an output side circuit 400B.

Structures of a first edge detection circuit 402, a second edge detection circuit 404, a feedback pulse generating circuit 412, a second transformer 414, a waveform shaping circuit 416, a logical comparison circuit 418, a first pulse generating circuit 420, and a second pulse generating circuit 422 in the signal transmission circuit device 400 are the same as the structures of the first edge detection circuit 332, the second edge detection circuit 334, the feedback pulse generating circuit 346, the third transformer 348, the waveform shaping circuit 350, the logical comparison circuit 352, the first pulse generating circuit 354, and the second pulse generating circuit 356 in the signal transmission circuit device 330 illustrated in FIG. 12, and therefore detailed description thereof is omitted.

With this structure, the number of transformers in the input signal transmission unit 400C can be reduced to one, and the signal transmission circuit device can be downsized.

However, in the signal transmission circuit device 400, all the first input pulse Sb1, the second input pulse Sb2, the first correction signal Sa1, and the second correction signal Sa2 are input to one clock terminal CLK. Therefore, it is necessary to design considering pulse widths, phase delays, and the like of the signals. In addition, the first pulse generating circuit 420 and the second pulse generating circuit 422 have a structure of generating a single pulse.

Figure 15:
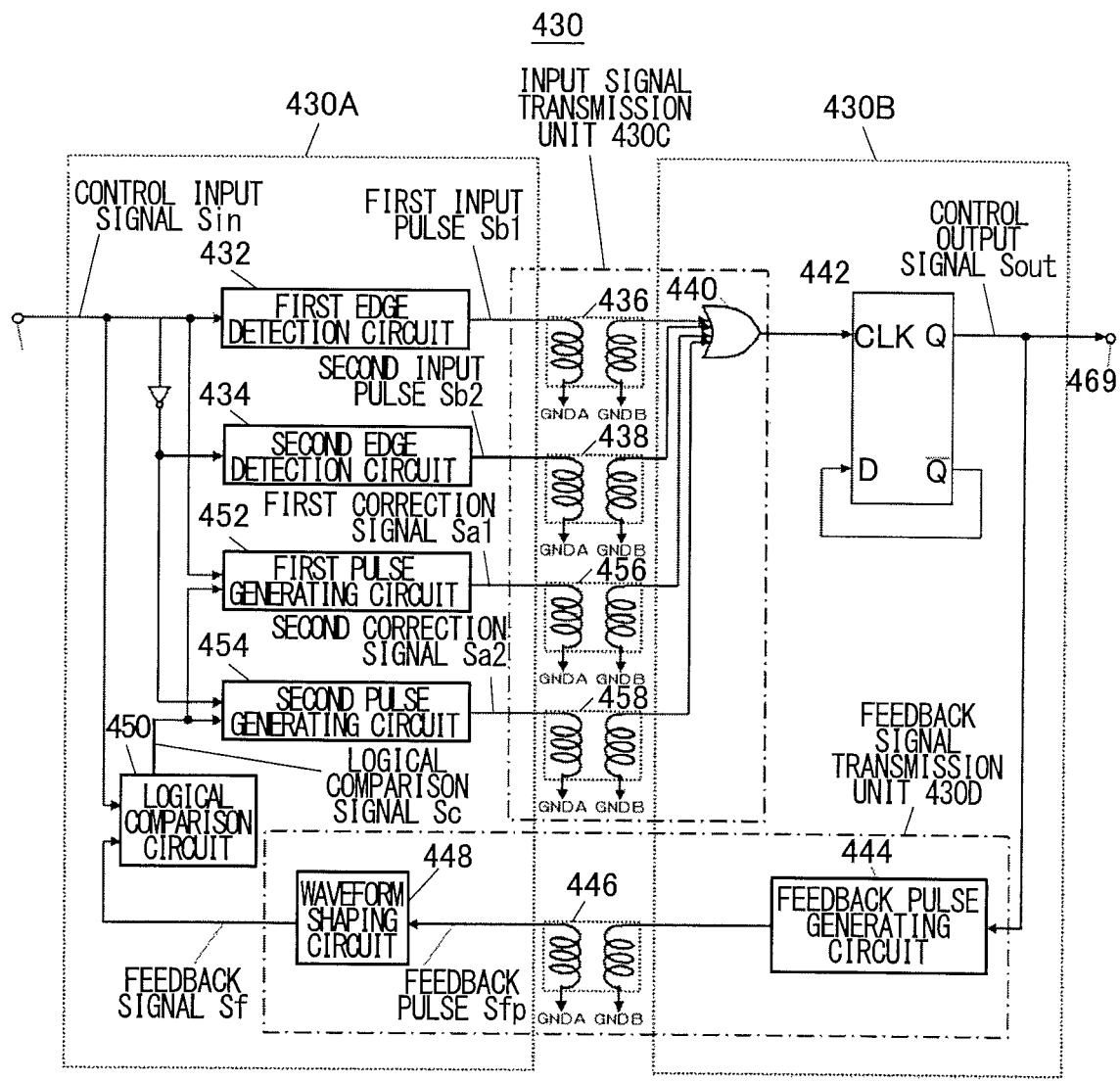
FIG. 15 is still another variation example of the fourth embodiment of the present invention (FIG. 12).

In the signal transmission circuit device 400, the logical OR circuit 406 may be disposed in the output side circuit 400B. The above-mentioned variation example is illustrated in FIG. 15. A signal transmission circuit device 430 is different from FIG. 14 in the following structure. The signal transmission circuit device 430 includes a first transformer 436 that transmits the first input pulse Sb1 to an output side circuit 430B, a second transformer 438 that transmits the second input pulse Sb2 to the output side circuit 430B, a third transformer 456 that transmits the first correction signal Sa1 to the output side circuit 430B, and a fourth transformer 458 that transmits the second correction signal Sa2 to the output side circuit 430B. In addition, the output side circuit 430B includes a logical OR circuit 440 that performs a logical OR process among the first input pulse Sb1, the second input pulse Sb2, the first correction signal Sa1, and the second correction signal Sa2.

Structures of a first edge detection circuit 432, a second edge detection circuit 434, a D flip-flop 442, a feedback pulse generating circuit 444, a fifth transformer 446, a waveform shaping circuit 448, a logical comparison circuit 450, a first pulse generating circuit 452, and a second pulse generating circuit 454 in the signal transmission circuit device 430 are the same as the structures of the first edge detection circuit 402, the second edge detection circuit 404, the D flip-flop 410, the feedback pulse generating circuit 412, the second transformer 414, the waveform shaping circuit 416, the logical comparison circuit 418, the first pulse generating circuit 420, and the second pulse generating circuit 422 in the signal transmission circuit device 400 illustrated in FIG. 14, and therefore detailed description thereof is omitted.

With this structure, the first input pulse Sb1, the second input pulse Sb2, the first correction signal Sa1, and the second correction signal Sa2 are transmitted to the output side circuit 430B by another transformer. Therefore, life of the transformer in an input signal transmission unit 430C can be increased.

Figure 16:
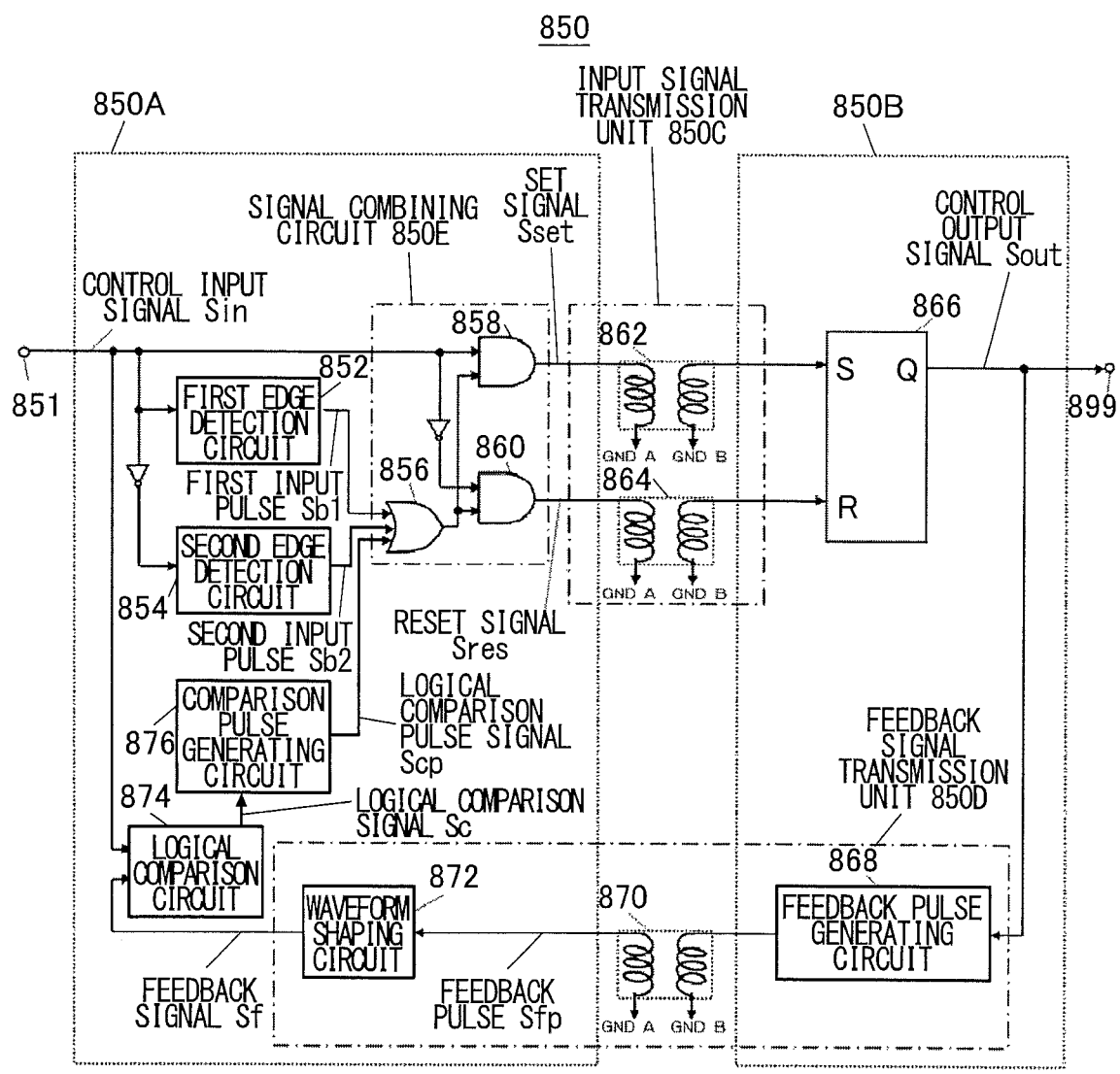
FIG. 16 is still another variation example of the fourth embodiment of the present invention (FIG. 12).
Figure 19:
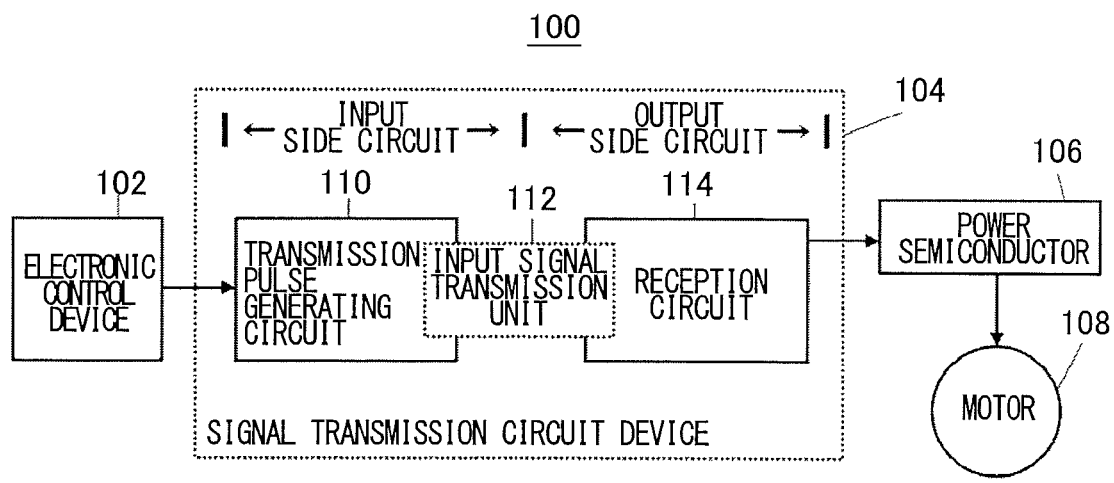
FIG. 19 is a diagram illustrating a drive circuit device according to a conventional power semiconductor.
Figure 20:
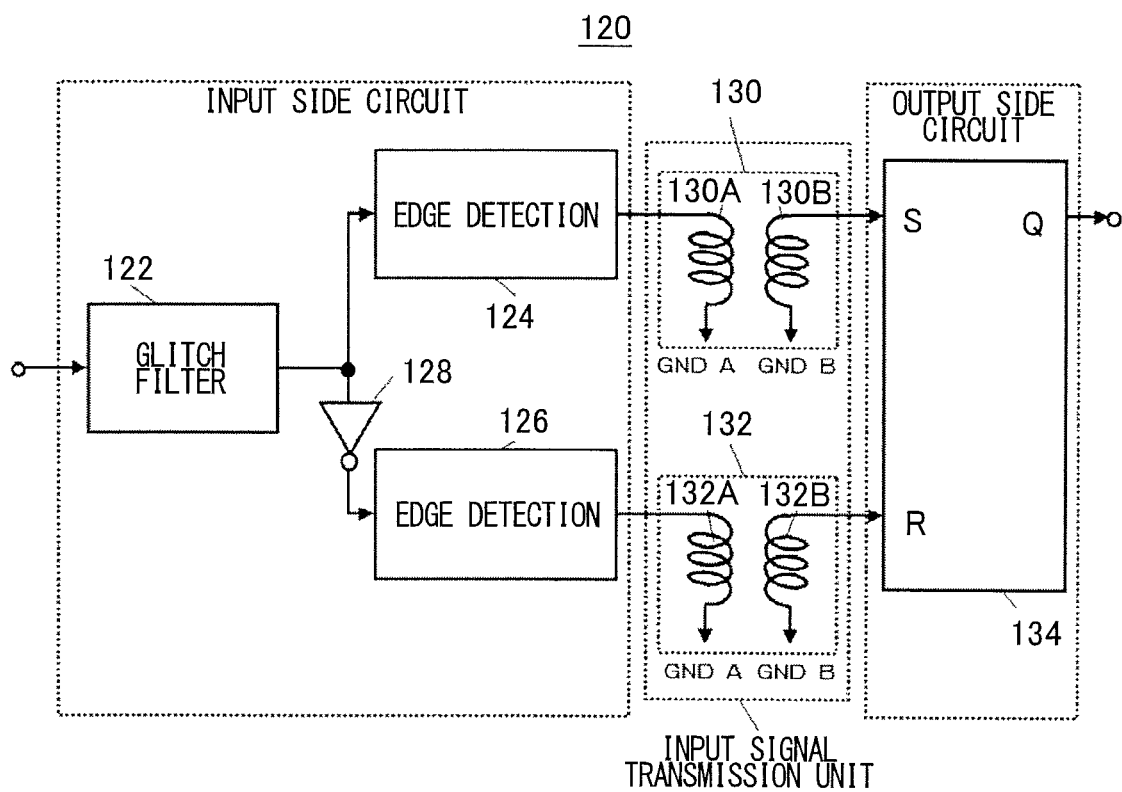
FIG. 20 is a diagram illustrating a conventional signal transmission circuit device.
Figure 21:
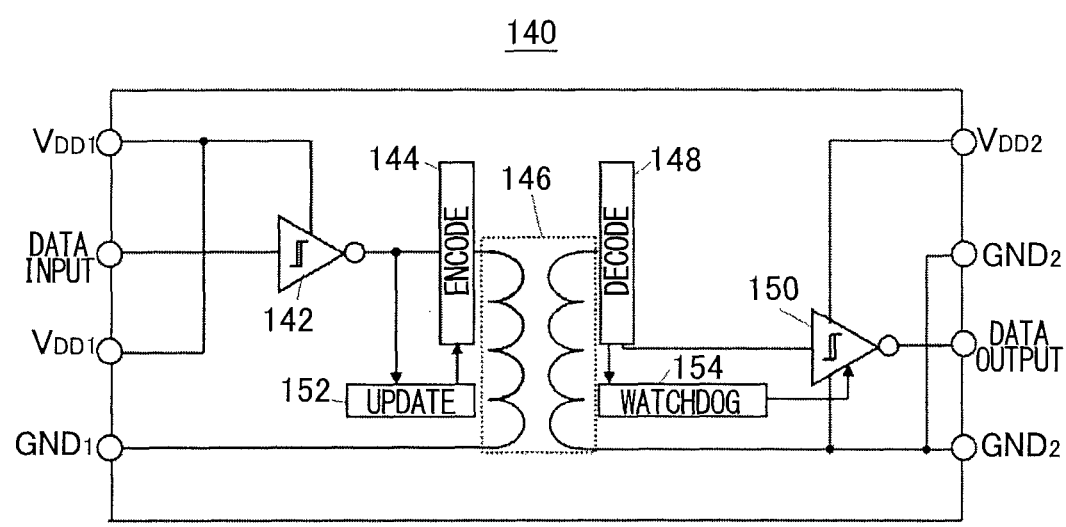
FIG. 21 is a diagram illustrating another conventional signal transmission circuit device.

FIG. 16 illustrates still another variation example of the signal transmission circuit device 330 illustrated in FIG. 12. A signal transmission circuit device 850 is different from FIG. 12 in that a comparison pulse generating circuit 876 that converts logical comparison signal Sc into the logical comparison pulse signal Scp synchronizing with the logical comparison signal Sc is disposed so that the first pulse generating circuit 354 and the second pulse generating circuit 356 are not necessary. With this structure, the structure of the signal transmission circuit device can be simplified.

The structure of the comparison pulse generating circuit 876 is the same as the comparison pulse generating circuit 820 in the signal transmission circuit device 800 illustrated in FIG. 3.

Structures of a first edge detection circuit 852, a second edge detection circuit 854, a first transformer 862, a second transformer 864, an RS flip-flop 866, a feedback pulse generating circuit 868, a third transformer 870, a waveform shaping circuit 872, and a logical comparison circuit 874 in the signal transmission circuit device 850 are the same as the structures of the first edge detection circuit 332, the second edge detection circuit 334, the first transformer 340, the second transformer 342, the RS flip-flop 344, the feedback pulse generating circuit 346, the third transformer 348, the waveform shaping circuit 350, and the logical comparison circuit 352 in the signal transmission circuit device 330 illustrated in FIG. 12, and therefore detailed description thereof is omitted.

A signal combining circuit 850E receives the control input signal Sin, the first input pulse Sb1, the second input pulse Sb2, and the logical comparison pulse signal Scp. At timing when receiving the first input pulse Sb1, the second input pulse Sb2, or the logical comparison pulse signal Scp, the signal combining circuit 850E outputs the set signal Sset or the reset signal Sres based on a potential of the control input signal Sin at that timing. As illustrated in FIG. 16, if the signal combining circuit 850E is constituted of a logical OR circuit 856 that receives the first input pulse Sb1, the second input pulse Sb2, and the logical comparison pulse signal Scp, a first logical AND circuit 858 that receives an output signal of the logical OR circuit 856 and the control input signal Sin, and a second logical AND circuit 860 that receives an output signal of the logical OR circuit 856 and an inverted signal of the control input signal Sin, the signal combining circuit 850E can be constituted of a relatively simple structure. However, the structure of the signal combining circuit 850E is not limited to the structure illustrated in FIG. 16, which can be variously modified.

FIG. 17 is a timing chart illustrating signals of individual portions of the signal transmission circuit device 330 illustrated in FIG. 12. A timing chart 700 illustrates transitions of potentials (the first potential or the second potential) with time lapse of the control input signal Sin, the first input pulse Sb1, the second input pulse Sb2, the set signal Sset, the reset signal Sres, the first correction signal Sa1, the second correction signal Sa2, the control output signal Sout, the feedback pulse Sfp, the feedback signal Sf, and the logical comparison signal Sc, described above, in the signal transmission circuit device 330. In addition, for convenience sake of drawing, a ratio among the pulse widths is not necessarily precise.

Operations of the first correction signal Sa1, the second correction signal Sa2, the feedback pulse Sfp, the feedback signal Sf, and the logical comparison signal Sc are the same as those in the second embodiment, and therefore detailed description thereof is omitted.

Here, a structure of the feedback signal transmission unit 330D in the signal transmission circuit device 330 is the same as that in FIG. 2. Therefore, the rising edge of the feedback signal Sf is delayed from the rising edge of the control output signal Sout by the delay time Td.

The control input signal Sin illustrated in FIG. 17(*a*) is an example of the control input signal Sin input to the input terminal 331 of the signal transmission circuit device 330, which indicates a signal having a pulse width of 25 μs and a period of 50 ns.

When the control input signal Sin changes from the second potential to the first potential (FIG. 17(*a*), rising edge X1), the first edge detection circuit 332 detects the rising edge of the control input signal Sin and generates a pulse A1 of FIG. 17(*b*) as the first input pulse Sb1. Here, in order to reduce power consumption in the signal transmission, pulse widths of the first input pulse Sb1 and the second input pulse Sb2 are set sufficiently smaller than that of the control input signal Sin.

The first input pulse Sb1 is input to the first logical OR circuit 336, and the first logical OR circuit 336 transmits a pulse A2 of FIG. 17(*d*) as the set signal Sset.

The set signal Sset is input to the set terminal S of the RS flip-flop 344 via the first transformer 340, and therefore the control output signal Sout is changed to the first potential at the same timing as the pulse A2 of FIG. 17(*d*) (FIG. 17(*h*), rising edge X2).

When the control input signal Sin is changed from the first potential to the second potential (FIG. 17(*a*), falling edge Y1), the second edge detection circuit 334 detects the falling edge of the control input signal Sin and generates a pulse B1 of FIG. 17(*c*) as the second input pulse Sb2.

The second input pulse Sb2 is input to the second logical OR circuit 338, and the second logical OR circuit 338 transmits a pulse B2 of FIG. 17(*e*) as the reset signal Sres.

The reset signal Sres is input to the reset terminal R of the RS flip-flop 344 via the second transformer 342, and hence the control output signal Sout is changed to the second potential at the same timing as the pulse B2 of FIG. 17(*e*) (FIG. 17(*h*), falling edge Y2).

Therefore, in a state where signal transmission is performed normally from the input side circuit 330A to the output side circuit 330B, the control input signal Sin is always kept at the same potential as the control output signal Sout (the first potential or the second potential).

Next, a case where a noise R1 of FIG. 17(*e*) is mixed in the reset signal Sres is described below.

When the noise R1 is mixed in the reset signal Sres, the control output signal Sout is temporarily changed from the first potential to the second potential (FIG. 17(*h*), falling edge Z1). The potential change in the control output signal Sout is transmitted to the logical comparison circuit 352 as a potential change in the feedback signal Sf, and the logical comparison circuit 352 becomes the first potential based on the fact that the control input signal Sin and the feedback signal Sf have become "mismatched" (FIG. 17(k), rising edge R2).

Then, because the control input signal Sin is the first potential at present, the first pulse generating circuit 354 generates a pulse R3 of FIG. 17(f) as the first correction signal Sa1, and the first logical OR circuit 336 transmits the pulse R4 of FIG. 14(d) as the set signal Sset based on the first correction signal Sa1 that is input. The set signal Sset is input to the set terminal S of the RS flip-flop 344 via the first transformer 340 and corrects the control output signal Sout to the first potential (FIG. 17(h), rising edge Z2).

As a result, when noise is mixed in the circuit, the logical comparison circuit 352 promptly detects that the control input signal Sin and the control output signal Sout have become "mismatched". Then, the first pulse generating circuit or the second pulse generating circuit transmits the first correction signal Sa1 or the second correction signal Sa2. Therefore, the control output signal Sout is corrected to the same potential as the control input signal Sin (the first potential or the second potential) just after the input and output become "mismatched".

As an abnormal state, in addition to the above-mentioned noise mixing, there is considered a case where the pulse is not transmitted in the first transformer or the second transformer. In this case too, the output signal correction function works similarly so as to correct the control output signal Sout to the same potential as the control input signal Sin (the first potential or the second potential). Flows of signals of individual portions are the same, and therefore detailed description thereof is omitted.

Next, FIG. 18 illustrates a timing chart of the signals of individual portions when the control input signal Sin having a pulse width shorter than the delay time Td of the feedback signal Sf is input to the signal transmission circuit device 330 illustrated in FIG. 12. A timing chart 750 illustrates changes of potentials (the first potential or the second potential) with time lapse of the control input signal Sin, the first input pulse Sb1, the second input pulse Sb2, the set signal Sset, the reset signal Sres, the first correction signal Sa1, the second correction signal Sa2, the control output signal Sout, the feedback pulse Sfp, the feedback signal Sf, and the logical comparison signal Sc in the signal transmission circuit device 330.

The signal illustrated in FIG. 18(a) is an example of the control input signal Sin input to the input terminal 331 of the signal transmission circuit device 330, which indicates a signal having a pulse width of 1 μs and a period of 5 μs.

When the control input signal Sin is changed from the second potential to the first potential (FIG. 18(a), rising edge X1), the first edge detection circuit 332 detects the rising edge of the control input signal Sin and generates a pulse A1 of FIG. 18(b) as the first input pulse Sb1.

At this timing, because the feedback signal Sf at the moment of change of the control input signal Sin is still the second potential, the logical comparison result of the logical comparison circuit 352 becomes "mismatch" so that the logical comparison signal Sc becomes the first potential (FIG. 18(k), rising edge X3). Then, the first pulse generating circuit generates a pulse A2 of FIG. 18(f). The pulse A1 in the first input pulse Sb1 and the pulse A2 in the first correction signal Sa1 have a relationship of mutual complementation.

The first logical OR circuit 336 performs a logical OR process between the first input pulse Sb1 and the first correction signal Sa1, and transmits a pulse A3 of FIG. 18(d) as the set signal Sset. Because the set signal Sset is input to the set terminal S of the RS flip-flop 344 via the first transformer 340, the control output signal Sout is changed to the first potential at the same timing as the pulse A3 of FIG. 18(d) (FIG. 18(h), rising edge X2).

At this timing, when the control output signal Sout becomes the first potential, the feedback pulse generating circuit 346 stops supply of the continuous pulses (FIG. 18(i)), but the feedback signal Sf is kept at the second potential due to the delay time Td (FIG. 18(j)).

When the control input signal Sin is changed from the first potential to the second potential (FIG. 18(a), falling edge Y1), the second edge detection circuit 334 detects the falling edge of the control input signal Sin, and generates a pulse B1 of FIG. 18(c) as the second input pulse Sb2.

The second input pulse Sb2 is input to the second logical OR circuit 338, and the second logical OR circuit 338 transmits a pulse B2 of FIG. 18(e) as the reset signal Sres. Because the reset signal Sres is input to the reset terminal R of the RS flip-flop 344 via the second transformer 342, FIG. 18(e), the control output signal Sout is changed to the second potential at the same timing as the pulse B2 (FIG. 18(h), falling edge Y2).

At this timing, before the delay time Td passes from the rising edge of the control output signal Sou, the control output signal Sout becomes the second potential. Therefore, the feedback signal Sf is kept at the second potential, and the logical comparison signal Sc becomes the second potential at the falling timing of the control input signal Sin (FIG. 18(k), falling edge Y3).

Therefore, the second pulse generating circuit 356 does not generate a pulse at the falling timing of the control input signal Sin (FIG. 18(g)), but because the control output signal Sout is already changed to the second potential by the second input pulse Sb2, the pulse width of the control output signal Sout is not increased.

As a result, even if the control input signal Sin having a pulse width smaller than the delay time Td is input to the signal transmission circuit device 330, the pulse width of the control output signal Sout is not increased. Compared with the signal transmission circuit device 220 illustrated in FIG. 2, the smallest input pulse width of the control input signal Sin can be largely reduced.

The fourth embodiment is described above. Because the signal transmission circuit device 330 includes the first edge detection circuit 332 and the second edge detection circuit 334 in addition to the first pulse generating circuit 354 and the second pulse generating circuit 356, it can largely reduce the smallest input pulse width of the control input signal Sin while keeping the output signal correction function without being affected by the delay time Td.

Further, the feedback signal transmission unit 330D is constituted of the feedback pulse generating circuit 346, the third transformer 348, and the waveform shaping circuit 350. Therefore, compared with the structure of FIG. 8 in which the feedback signal transmission unit 250D is constituted of the first output edge detection circuit 262, the second output edge detection circuit 264, the third transformer 266, the fourth transformer 268, and the second RS flip-flop 270, the number of transformers in the feedback signal transmission unit 330D can be reduced to one. In addition, the signal transmission circuit device is downsized, and noise immunity characteristic of the feedback signal transmission unit is improved.

Second Technical Feature

Figure 22:
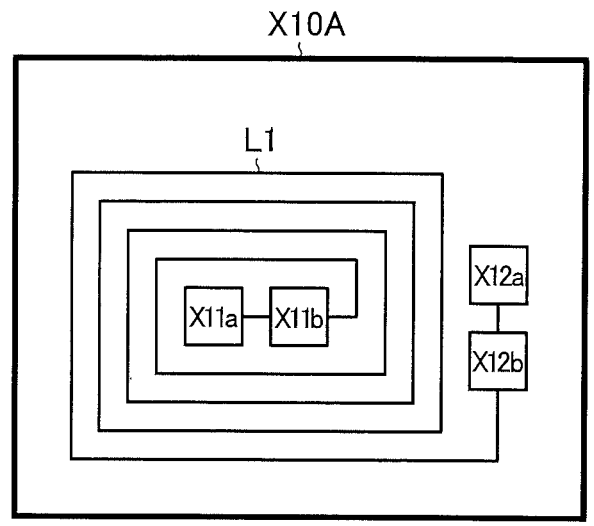
FIG. 22 is a schematic diagram illustrating a first embodiment of a semiconductor device according to the present invention.

FIG. 22 is a schematic diagram illustrating a first embodiment of a semiconductor device according to the present invention. A semiconductor device X10A of this embodiment is a semiconductor device in which a coil L1 is integrated. An end of the coil L1 is connected to a first current supply pad X11a and a first voltage measurement pad X11b, while the other end of the coil L1 is connected to a second current supply pad X12a and a second voltage measurement pad X12b.

Figure 23:
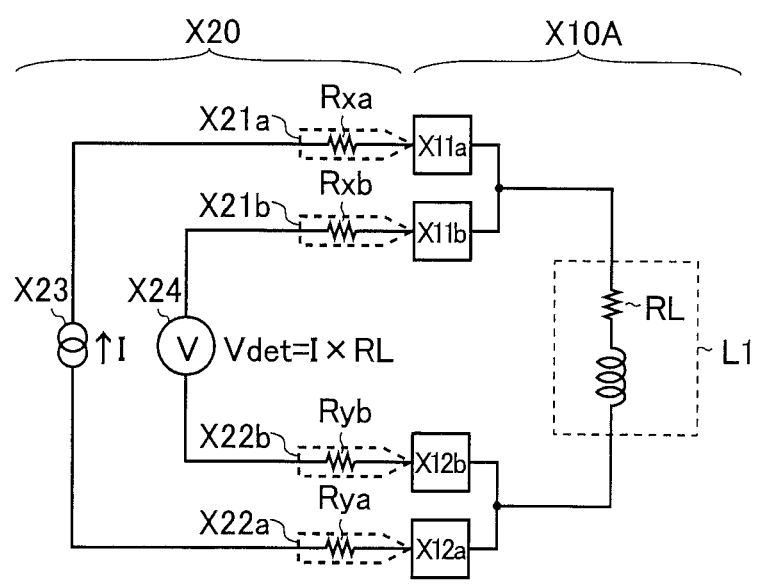
FIG. 23 is a schematic diagram for explaining defective inspection of a semiconductor device X10A.

FIG. 23 is a schematic diagram for explaining defective inspection of the semiconductor device X10A. An inspection apparatus X20 that is used for defective inspection of the semiconductor device X10A includes a first current supply probe X21a to contact with the first current supply pad X11a, a first voltage measurement probe X21b to contact with the first voltage measurement pad X11b, a second current supply probe X22a to contact with the second current supply pad X12a, a second voltage measurement probe X22b to contact with the second voltage measurement pad X12b, a constant current source X23 for supplying a predetermined constant current I between the first current supply probe X21a and the second current supply probe X22a, and a voltmeter X24 for measuring a voltage generated between the first voltage measurement probe X21b and the second voltage measurement probe X22b.

In the defective inspection of the semiconductor device X10A, a predetermined constant current I is supplied from the constant current source X23 to the coil L1, and a voltage generated across both ends of coil L1 (a voltage drop generated due to the series resistance component RL of the coil L1) is measured by the voltmeter X24.

Here, in order to supply the constant current I from the constant current source X23 to the coil L1, it is necessary to contact the probes X21a and X22a to the pads X11a and X12a, respectively, and hence contact resistance components Rxa and Rya are inevitably generated. Therefore, on the path for supplying the constant current I from the constant current source X23 to the coil L1, a voltage drop due to the contact resistance components Rxa and Rya (=I×(Rxa+ Rya)) is generated.

On the other hand, in order to measure a voltage across both ends of the coil L1 by the voltmeter X24, it is necessary to contact the probes X21b and X22b to the pads X11b and X12b, respectively. Therefore, similarly to the above description, contact resistance components Rxb and Ryb are inevitably generated. However, an internal impedance of the voltmeter X24 is very high so that little current flows between both ends of the voltmeter X24. Therefore, the voltage drop due to the contact resistance components Rxb and Ryb becomes substantially zero.

In other words, in the defective inspection of the semiconductor device X10A of this embodiment, a voltage value of a detected voltage Vdet obtained by the voltmeter X24 is not affected at all by the above-mentioned contact resistance components, and varies in accordance with only the series resistance component RL of the coil L1 as expressed by the following expression (2).

$$V\text{det}=I \times RL \quad (2)$$

Therefore, because the semiconductor device X10A of this embodiment can correctly measure the series resistance component RL of the coil L1 in the defective inspection thereof, it is possible to reject a defective product having a break in the coil L1 as a matter of course, and also to appropriately reject a defective product having an abnormal resistance of the coil L1 (e.g., a partial short circuit between windings). Thus, it is possible to prevent the defective product from being on the market.

Figure 24:
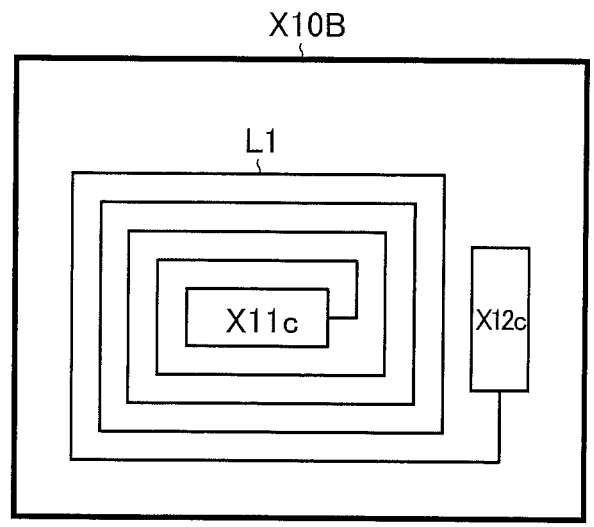
FIG. 24 is a schematic diagram illustrating a second embodiment of the semiconductor device according to the present invention.
Figure 25:
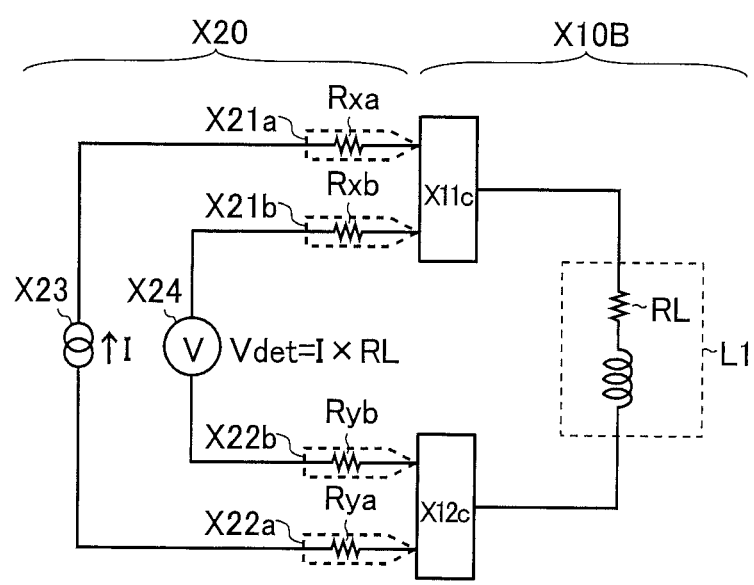
FIG. 25 is a schematic diagram for explaining defective inspection of a semiconductor device X10B.

FIG. 24 is a schematic diagram illustrating a second embodiment of the semiconductor device according to the present invention, and FIG. 25 is a schematic diagram for explaining defective inspection of a semiconductor device X10B.

In the semiconductor device X10B of this embodiment, the first current supply pad X11a and the first voltage measurement pad X11b described above are formed integrally as a first common pad X11c. Note that the first common pad X11c is formed to have an area that enables simultaneous contact of the first current supply probe X21a and the first voltage measurement probe X21b (an area approximately twice an area of the first current supply pad X21a or the first voltage measurement pad X11b).

In addition, in the semiconductor device X10B of this embodiment, the second current supply pad X12a and the second voltage measurement pad X12b described above are formed integrally as a second common pad X12c. Note that the second common pad X12c is formed to have an area that enables simultaneous contact of the second current supply probe X22a and the second voltage measurement probe X22b (an area approximately twice an area of the second current supply pad X12a or the second voltage measurement pad X12b).

In this way, as long as a size of one pad can be designed to be sufficiently large, it is possible to adopt an inspection method in which two probes are contacted with one pad.

Note that the structure and the inspection method of the inspection apparatus X20 used for the defective inspection of the semiconductor device X10B is as described above, and therefore overlapping description is omitted.

Next, there is described an example of a structure in which the present invention is applied to a motor drive apparatus mounted in a hybrid vehicle.

Figure 26:
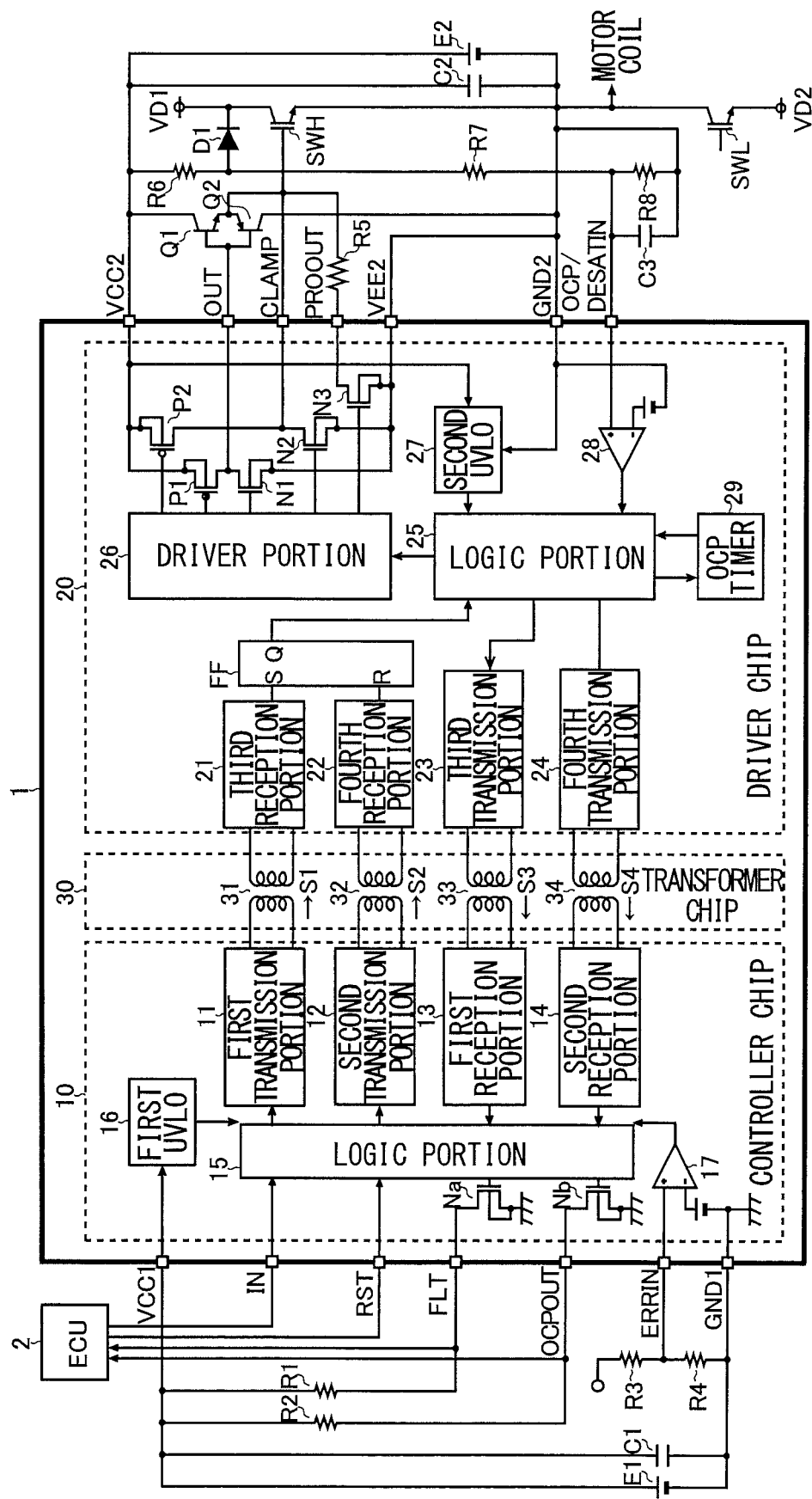
FIG. 26 is a block diagram illustrating a structural example of a motor drive apparatus using a semiconductor device according to the present invention.

FIG. 26 is a block diagram illustrating a structural example of the motor drive apparatus in which the semiconductor device according to the present invention is used. The motor drive apparatus of this structural example includes a high side switch SWH, a low side switch SWL, a switch control device 1 as a control means for the high side switch SWH, an engine control unit 2 (hereinafter referred to as an engine control unit (ECU) 2), DC voltage sources E1 and E2, an npn bipolar transistor Q1, a pnp bipolar transistor Q2, capacitors C1 to C3, resistors R1 to R8, and a diode D1.

The switch control device 1 includes a first semiconductor chip 10, a second semiconductor chip 20, and a third semiconductor chip 30, which are mounted in a single package.

A first feature of the switch control device 1 is that a dielectric withstand voltage between the input and output is 1200 volts. A second feature is that a UVLO is incorporated. A third feature is that a watchdog timer function is incorporated. A fourth feature is that an overcurrent protection function (automatic reset type) is incorporated. A fifth feature is that a slow-off function in the overcurrent protection operation is incorporated. A sixth feature is that an external error detection function (ERRIN) is incorporated. A seventh feature is that an abnormal state output function (FLT, OCPOUT) is incorporated. An eighth feature is that an active mirror clamp function is incorporated. A ninth feature is that a short circuit clamp function is incorporated.

The first semiconductor chip 10 is a controller chip including an integrated controller that is driven by a first power supply voltage VCC1 (5 volts, 3.3 volts, or the like with respect to GND1) supplied from the DC voltage source E1 and generates switch control signals S1 and S2 based on an input signal IN. As main functions of the first semiconductor chip 10, there are a generation function or an output function of the switch control signals S1 and S2, a transformer abnormal transmission monitor function (input and output logic monitor function of the input signal IN), an error state output function, a UVLO function, and an external error input signal process function. Note that a withstand voltage of the first semiconductor chip 10 should be set to an appropriate withstand voltage (e.g., 7 volts withstand voltage) considering the first power supply voltage VCC1 (with respect to GND1).

The second semiconductor chip 20 is a driver chip including an integrated driver that is driven by a second power supply voltage VCC2 (10 to 30 volts with respect to GND2) supplied from the DC voltage source E2 and performs drive control of the high side switch SWH applied with a high voltage of a few kilovolts at one end based on the switch control signals S1 and S2 input from the first semiconductor chip 10 via the third semiconductor chip 30. As main functions of the second semiconductor chip 20, there are a generation function or an output function of the output signal OUT, an overcurrent/overvoltage protection function, and a UVLO function. Note that a withstand voltage of the second semiconductor chip 20 should be set to an appropriate withstand voltage (e.g., 40 volts withstand voltage) considering the second power supply voltage VCC2 (with respect to GND2).

The third semiconductor chip 30 is a transformer chip including an integrated transformer that isolates direct current between the first semiconductor chip 10 and the second semiconductor chip 20 while transmits and receives the switch control signals S1 and S2, a watchdog signal S3, and a fault signal S4.

As described above, the switch control device 1 of this structural example has a structure including, in addition to the first semiconductor chip 10 including the integrated controller and the second semiconductor chip 20 including the integrated driver, the third semiconductor chip 30 including only the transformer independently, which are mounted in a single package.

With this structure, each of the first semiconductor chip 10 and the second semiconductor chip 20 can be produced by a general low withstand voltage process (a few volts to a few tens volts withstand voltage). Therefore, it is not necessary to use a special high withstand voltage process (a few kilovolts withstand voltage) so that manufacturing cost can be reduced.

In addition, each of the first semiconductor chip 10 and the second semiconductor chip 20 can be produced by an existing proven process, and it is not necessary to perform a new reliability test. Therefore, this structure can contribute to reduction of a development period and a development cost.

In addition, a case where a DC isolation element (e.g., photocoupler) is used instead of the transformer can be easily supported by exchanging only the third semiconductor chip 30. Therefore, it is not necessary to develop the controller chip and the driver chip again, and hence this structure can contribute to reduction of a development period and a development cost.

An ECU2 is means for integrally performing electrical control of engine operation and motor operation, which is a microcontroller that performs transmission and reception of various signals (IN, RST, FLT, and OCPOUT) with the switch control device 1.

The high side switch SWH and the low side switch SWL are means that are connected between an applying terminal of a first motor drive voltage VD1 and an end of the motor coil, and between an applying terminal of a second motor drive voltage VD2 and an end of the motor coil, respectively, so as to perform supply control of motor drive current in accordance with on and off control of each signal. Note that the motor drive apparatus of this structural example uses an insulated gate bipolar transistor (IGBT) as each of the high side switch SWH and the low side switch SWL, but the present invention is not limited to this structure. It is possible to use a metal oxide semiconductor (MOS) field effect transistor using a silicon carbide (SiC) semiconductor or to use a MOS field effect transistor using a Si semiconductor. In particular, the MOS field effect transistor using a SiC semiconductor has less power consumption and higher heat resistance temperature than the MOS field effect transistor using a Si semiconductor, and therefore is suitable for being mounted in a hybrid vehicle.

Next, an internal structure of the switch control device 1 is described in detail.

The first semiconductor chip 10 includes a first transmission portion 11, a second transmission portion 12, a first reception portion 13, a second reception portion 14, a logic portion 15, a first low voltage lockout portion 16 (hereinafter referred to as a first under voltage lock out (UVLO) portion 16), an external error detection portion (external error detection comparator) 17, and N channel MOS field effect transistors Na and Nb.

The second semiconductor chip 20 includes a third reception portion 21, a fourth reception portion 22, a third transmission portion 23, a fourth transmission portion 24, a logic portion 25, a driver portion 26, a second low voltage lockout portion 27 (hereinafter referred to as a second UVLO portion 27), a overcurrent detection portion (overcurrent detection comparator) 28, an over current protection (OCP) timer 29, a P channel MOS field effect transistors P1 and P2, N channel MOS field effect transistors N1 to N3, and an SR flip-flop FF.

The third semiconductor chip 30 includes a first transformer 31, a second transformer 32, a third transformer 33, and a fourth transformer 34.

The first transmission portion 11 is means for transmitting a switch control signal Si supplied from the logic portion 15 to the third reception portion 21 via the first transformer 31. The second transmission portion 12 is means for transmitting a switch control signal S2 supplied from the logic portion 15 to the fourth reception portion 22 via the second transformer 32. The first reception portion 13 is means for receiving the watchdog signal S3 supplied from the third transmission portion 23 via the third transformer 33 and transmitting the same to the logic portion 15. The fourth reception portion 14 is means for receiving a driver abnormal signal S4 supplied from the fourth transmission portion 24 via the fourth transformer 34 and for transmitting the same to the logic portion 15.

The logic portion 15 is means for performing transmission and reception of various signals (IN, RST, FLT, and OCPOUT) with the ECU2, and for performing transmission and reception of various signals (S1 to S4) with the second semiconductor chip 20 by using the first transmission portion 11, the second transmission portion 12, the first reception portion 13, and the second reception portion 14.

Note that the logic portion 15 generates the switch control signals S1 and S2 so that the output signal OUT is made high level when the input signal IN is high level, and generates the switch control signals S1 and S2 so that the output signal OUT is made low level when the input signal IN is low level, oppositely. More specifically, the logic portion 15 detects a positive edge of the input signal IN (rising edge from low level to high level) so as to generate a pulse in the switch control signal S1, and detects a negative edge (falling edge from high level to low level) of the input signal IN so as to generate a pulse in the switch control signal S2.

In addition, the logic portion 15 generates the switch control signals S1 and S2 so that generation operation of the output signal OUT is disabled, namely the output signal OUT is fixed to low level when the reset signal RST is low level, and generates the switch control signals S1 and S2 so that the generation operation of the output signal OUT is enabled, namely the output signal OUT is set to a logical level corresponding to the input signal IN when the reset signal RST is high level, oppositely. Note that when the reset signal RST is kept to low level for a predetermined time period (e.g., 500 nanoseconds), the logic portion 15 generates the switch control signals S1 and S2 so that the protection operation by the overcurrent detection portion 28 is reset.

In addition, when the switch control device 1 is normal, the logic portion 15 turns off the transistor Na so that the first state signal FLT becomes open (a state pulled up by the resistor R1). When the switch control device 1 is abnormal (when a low voltage abnormal state on the first semiconductor chip 10 side, transformer abnormal transmission in the switch control signals S1 and S2, or the ERRIN signal abnormal state is detected), the logic portion 15 turns on the transistor Na so that the first state signal FLT becomes low level. With this structure, the ECU2 can grasp a state of the switch control device 1 by monitoring the first state signal FLT. Note that the low voltage abnormal state on the first semiconductor chip 10 side should be decided based on a detection result in the first UVLO portion 16. In addition, the transformer abnormal transmission of the switch control signals S1 and S2 should be decided based on a comparison result between the input signal IN (switch control signals S1 and S2) and the watchdog signal S3. In addition, the ERRIN signal abnormal state should be decided based on an output result of the external error detection portion 17.

In addition, when the switch control device 1 is normal, the logic portion 15 turns off the transistor Nb so that the second state signal OCPOUT becomes open (a state pulled up by the resistor R2). When the switch control device 1 is abnormal (when a low voltage abnormal state on the second semiconductor chip 20 side or overcurrent of the motor drive current flowing in the high side switch SWH is detected), the logic portion 15 turns on the transistor Nb so that the second state signal OCPOUT becomes low level. With this structure, the ECU2 can grasp a state of the switch control device 1 by monitoring the second state signal OCPOUT. Note that the low voltage abnormal on the second semiconductor chip 20 side and the overcurrent of the motor drive current flowing in the high side switch SWH should be decided based on the driver abnormal signal S4.

The first UVLO portion 16 is means for monitoring whether or not the first power supply voltage VCC1 is in a low voltage state, so as to transmit the monitor result to the logic portion 15.

The external error detection portion 17 is means for comparing a voltage input to the ERRIN terminal from a connection node between the resistor R3 and the resistor R4 (a partial voltage obtained by dividing an analog voltage to be monitored by resisters) with a predetermined threshold voltage, so as to transmit the comparison result to the logic portion 15.

The third reception portion 21 is means for receiving the switch control signal S1 supplied from the first transmission portion 11 via the first transformer 31 so as to transmit the same to the set input terminal (S) of the SR flip-flop FF. The fourth reception portion 22 is means for receiving the switch control signal S2 supplied from the second transmission portion 12 via the second transformer 32 so as to transmit the same to the reset input terminal (R) of the SR flip-flop FF. The third transmission portion 23 is means for transmitting the watchdog signal S2 supplied from the logic portion 25 to the first reception portion 13 via the third transformer 33. The fourth transmission portion 24 is means for transmitting the driver abnormal signal S4 supplied from the logic portion 25 to the second reception portion 14 via the fourth transformer 34.

The SR flip-flop FF sets the output signal to high level by trigger of a pulse edge of the switch control signal S1 supplied to the set input terminal (S) and resets the output signal to low level by trigger of a pulse edge of the switch control signal S2 supplied to the reset input terminal (R). In other words, the above-mentioned output signal becomes the same signal as the input signal IN supplied from the ECU2 to the logic portion 15. Note that the output signal is sent to the logic portion 25 from an output terminal (Q) of the SR flip-flop FF.

The logic portion 25 generates a drive signal for the driver portion 26 based on the output signal of the SR flip-flop FF (the same signal as the input signal IN).

In addition, when the logic portion 25 decides that the low voltage abnormal or the overcurrent is generated based on the detection result in the second UVLO portion 27 or the overcurrent detection portion 28, the logic portion 25 transmits the decision as an abnormal detect signal to the driver portion 26 and transmits the same as the driver abnormal signal S4 to the logic portion 15. With this structure, even if an abnormal state occurs in the second semiconductor chip 20, the driver portion 26 can promptly perform the protection operation, and the logic portion 15 can inform the ECU2 of the abnormal state (change of the second state signal OCPOUT to low level). Note that the logic portion 25 has a function of automatic reset from the overcurrent protection operation at a time point when a predetermined time passes after the overcurrent protection operation.

In addition, the logic portion 25 outputs the output signal of the SR flip-flop FF as it is as the watchdog signal S3 to the third transmission portion 23. In this way, with the structure of returning the watchdog signal S3 from the second semiconductor chip 20 to the first semiconductor chip 10, the logic portion 15 can decide presence or absence of transformer abnormal transmission by comparing the input signal IN supplied to the first semiconductor chip 10 with the watchdog signal S3 returned from the second semiconductor chip 20.

The driver portion 26 is means for performing ON/OFF control of the transistor P1 and the transistor N1 based on the drive signal supplied from the logic portion 25 so as to output the output signal OUT from the connection node between the transistor P1 and the transistor N1. The output signal OUT is supplied to the high side switch SWH via the drive circuit constituted of the transistors Q1 and Q2. The above-mentioned drive circuit is means for adjusting a rise/fall time (slew rate) of the output signal OUT so that the output signal OUT has drive ability of the high side switch SWH. Note that the high side switch SWH is turned on when the output signal OUT is high level, and the high side switch SWH is turned off when the output signal OUT is low level on the contrary.

Note that the driver portion 26 has a function (active mirror clamp function) of turning on the transistor N2 so that charge (mirror current) is absorbed from a gate of the high side switch SWH via a CLAMP terminal when a voltage level of the output signal OUT (with respect to GND2) becomes low level. With this structure, when turning off the high side switch SWH, a gate potential of the high side switch SWH can be promptly dropped to low level via the transistor N2 without depending on the slew rate set by the above-mentioned drive circuit.

In addition, the driver portion 26 has a function (short circuit clamp function) of turning on the transistor P2 so that a gate of the high side switch SWH is clamped to the power supply voltage VCC2 via the CLAMP terminal when a voltage level of the output signal OUT (with respect to GND2) becomes high level. With this structure, when turning on the high side switch SWH, the gate potential of the high side switch SWH is not increased to a potential higher than the power supply voltage VCC2.

In addition, the driver portion 26 has a function (slow-off function) of turning off each of the transistors P1 and P2 and the transistors N1 and N2 while turning on the transistor N3 when it is decided that it is necessary to perform protection operation based on the abnormal detect signal supplied from the logic portion 25. With this switch control, when the protection operation is performed, charge can be discharged more gradually than in a normal operation from the gate of the high side switch SWH via the resistor R5. With this structure, because an instantaneous cut-off of motor current in the protection operation can be avoided, it is possible to suppress a surge generated by counter electromotive force of the motor coil. Note that the falling time in the protection operation can be adjusted arbitrarily by appropriately selecting a resistance of the resistor R5.

The second UVLO portion 27 is means for monitoring whether or not the second power supply voltage VCC2 is in a low voltage state, so as to transmit the monitor result to the logic portion 25.

The overcurrent detection portion 28 is means for comparing a voltage supplied to an OCP/DESATIN terminal from a connection node between the resistor R7 and the resistor R8 (a partial voltage obtained by dividing an anode voltage of the diode D1) with a predetermined threshold voltage, so as to transmit the comparison result to the logic portion 25. Note that as the motor drive current flowing in the high side switch SWH is larger, a voltage between emitter and collector of the insulated gate bipolar transistor used as the high side switch SWH becomes higher. Therefore, as the motor drive current flowing in the high side switch SWH is larger, the anode voltage of the diode D1 becomes higher so that a voltage input to the OCP/DESATIN terminal becomes higher. Therefore, when the voltage input to OCP/DESATIN (with respect to GND2) reaches a predetermined threshold value (e.g., 0.5 volts), the overcurrent detection portion 28 decides that the motor drive current flowing in the high side switch SWH is in an overcurrent state.

Note that in this structural example, there is described the structure as an example adopting a method of the motor drive current by detecting the voltage between emitter and collector of the insulated gate bipolar transistor used as the high side switch SWH (voltage detection method), but the detection method of the motor drive current is not limited to this. For instance, it is possible to adopt a method of generating a voltage signal by supplying the motor drive current flowing in the high side switch SWH (or mirror current showing the equivalent behavior) to a sense resistor, so as to supply the generated voltage to the OCP/DESATIN terminal (current detection method).

The OCP timer 29 is means for counting lapse time after the overcurrent protection operation.

The first transformer 31 is a DC isolation element for transmitting the switch control signal S1 from the first semiconductor chip 10 to the second semiconductor chip 20. The second transformer 32 is a DC isolation element for transmitting the switch control signal S2 from the first semiconductor chip 10 to the second semiconductor chip 20. The third transformer 33 is a DC isolation element for transmitting the watchdog signal S3 from the second semiconductor chip 20 to the first semiconductor chip 10. The fourth transformer 34 is a DC isolation element for transmitting the driver abnormal signal S4 from the second semiconductor chip 20 to the first semiconductor chip 10.

In this way, with the structure of transmitting and receiving not only the switch control signals S1 and S2 but also the watchdog signal S3 and the driver abnormal signal S4 between the first semiconductor chip 10 and the second semiconductor chip 20, not only the ON/OFF control of the high side switch SWH but also various protection functions can be realized appropriately.

Figure 27:
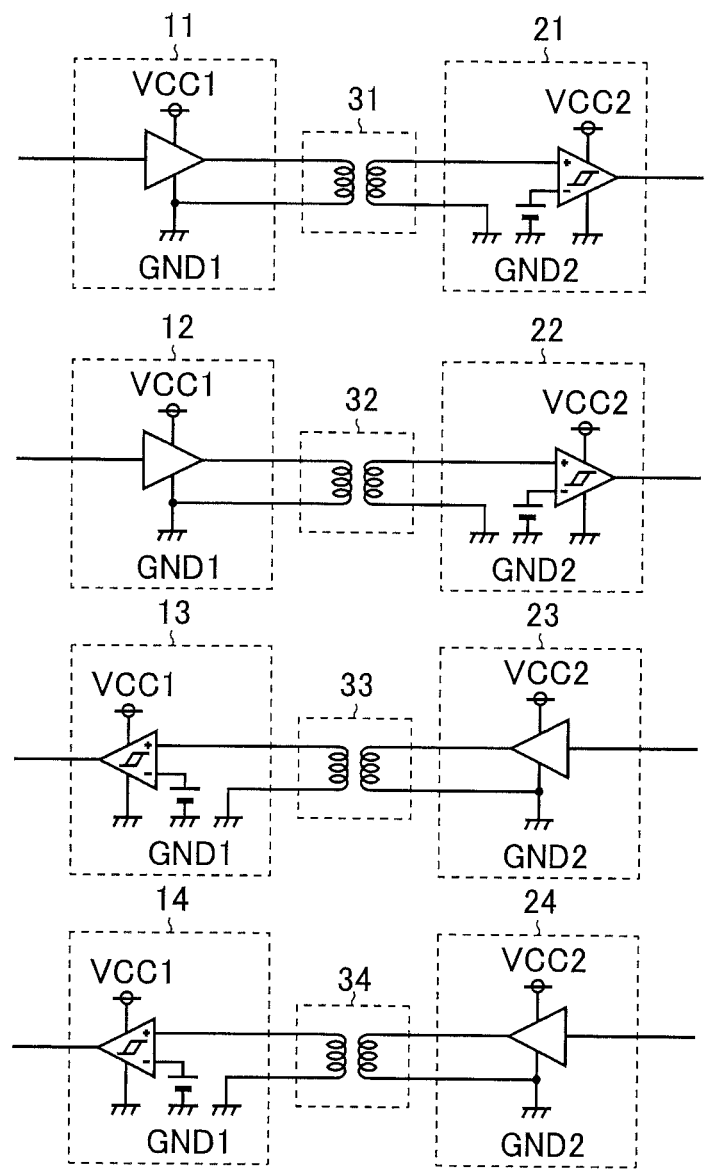
FIG. 27 is a detailed diagram of transmission and reception circuit portions via transformers 31 to 34.

FIG. 27 is a detailed diagram of transmission and reception circuit portions via transformers 31 to 34. As illustrated in this diagram, the first transmission portion 11, the second transmission portion 12, the first reception portion 13, and the second reception portion 14, which are disposed on the first semiconductor chip 10 side, are all driven by the power supply voltage between VCC1 and GND1. The third reception portion 21, the fourth reception portion 22, the third transmission portion 23, and the fourth transmission portion 24, which are disposed on the second semiconductor chip 20 side, are all driven by the power supply voltage between VCC2 and GND2.

With this structure, as described above, each of the first semiconductor chip 10 and the second semiconductor chip 20 can be produced by a general low withstand voltage process (a few volts withstand voltage to a few tens volts withstand voltage). Therefore, it is not necessary to use a special high withstand voltage process (a few kilovolts withstand voltage) so that manufacturing cost can be reduced.

Note that in FIG. 27, each of the first reception portion 13, the second reception portion 14, the third reception portion 21, and the fourth reception portion 22 is shown as a structure using a comparator having a hysteresis characteristic, but presence or absence of the hysteresis characteristic is arbitrary.

Details of various functions of the switch control device 1 having the above-mentioned structure are described in an overall manner.

[UVLO1 (Controller Side Low Voltage Malfunction Prevention Function)]

When the controller side power supply voltage (voltage between VCC1 and GND1) becomes a predetermined lower side threshold voltage $V_{UVLO1L}$ or lower, the switch control device 1 turns off the high side switch SWH and sets an FLT terminal to low level. On the other hand, when the controller side power supply voltage (voltage between VCC1 and GND1) becomes a predetermined upper side threshold voltage $V_{UVLO1H}$ or higher, the switch control device 1 starts the normal operation and sets the FLT terminal to be open (high level).

[UVLO2 (Driver Side Low Voltage Malfunction Prevention Function)]

When the driver side power supply voltage (voltage between VCC2 and GND2) becomes a predetermined lower side threshold voltage $V_{UVLO2L}$ or lower, the switch control device 1 turns off the high side switch SWH and sets the OCPOUT terminal to low level. On the other hand, when the driver side power supply voltage (voltage between VCC2 and GND2) becomes a predetermined upper side threshold voltage $V_{UVLO2H}$ or higher, the switch control device 1 starts the normal operation and sets the OCPOUT terminal to be open (high level).

[Analog Error Input]

When the input voltage to the ERRIN terminal becomes a predetermined threshold voltage $V_{ERRDET}$ or higher, the switch control device 1 turns off the high side switch SWH and sets the FLT terminal to low level. With this structure, an abnormal state generated in a peripheral circuit of the switch control device 1 can be also monitored so that an appropriate protection operation can be performed. Therefore, this structure can be used for overvoltage protection operation of a motor power supply, for example. Note that the above-mentioned threshold voltage $V_{ERRDET}$ should have a predetermined hysteresis ($V_{ERRHYS}$).

[Overcurrent Protection]

When an input voltage to the OCP/DESATIN terminal becomes a predetermined threshold voltage $V_{OCDET}$ or higher (with respect to GND2), the switch control device 1 turns off the high side switch SWH and sets the OCPOUT terminal to low level.

[Overcurrent Protection Automatic Reset]

When a fixed time ($t_{OCPRLS}$) passes from the overcurrent protection operation, the switch control device 1 performs automatic reset and sets the OCPOUT terminal to be open (high level). Note that the reset time may be set fixedly in the switch control device 1 or may be adjustable externally of the device.

[Watchdog Timer]

The switch control device 1 compares the input signal IN supplied from the ECU2 to the first semiconductor chip 10 with the watchdog signal S3 fed back from the second semiconductor chip 20 to the first semiconductor chip 10. If logics of the both signals are mismatched, the high side switch SWH is turned off, and the FLT terminal is set to low level.

[Protection Operation Slow Off]

The switch control device 1 sets a PROOUT terminal to low level and set an OUT terminal to be open when the overcurrent protection operation is performed. With this control, the high side switch SWH can be slowly turned off. Note that the slew rate in the turn-off operation can be arbitrarily adjusted by appropriately selecting a resistance of the external resistor R5.

[Active Mirror Clamp]

When the gate potential of the high side switch SWH becomes a predetermined threshold voltage $V_{AMC}$ or lower, the switch control device 1 sets the CLAMP terminal to low level. With this control, the high side switch SWH can be securely turned off

[Short Circuit Clamp]

When the applied voltage to the CLAMP terminal becomes VCC2-$V_{SCC}$ or higher, the switch control device 1 sets the CLAMP terminal to high level. With this control, the gate potential of the high side switch SWH is not increased above the second power supply voltage VCC2.

Figures 28, 29:
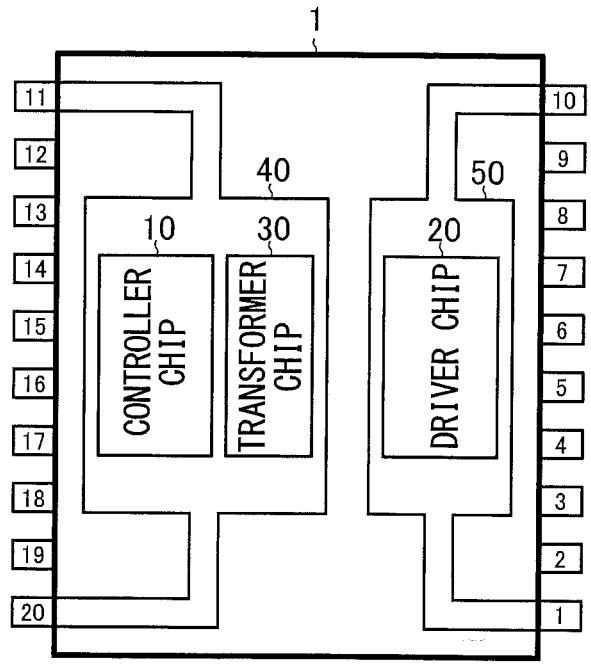
FIG. 28 is a schematic diagram illustrating an example of a terminal layout and a chip arrangement in a package.
FIG. 29 is a table showing external terminals.

FIG. 28 is a schematic diagram illustrating an example of a terminal layout and a chip arrangement in the package. As illustrated in FIG. 28, in the switch control device 1 of this structural example, the package has a plurality of pins arranged on each of two opposite sides. The first semiconductor chip 10, the second semiconductor chip 20, and the third semiconductor chip 30 are arranged in the direction orthogonal to the arrangement direction of the pins (horizontal direction in the diagram).

By adopting this chip arrangement, the pins 11 to 20 connected to the first semiconductor chip 10 and the pins 1 to 10 connected to the second semiconductor chip 20 can be arranged and distributed to the two opposite sides. Therefore, it is possible to prevent a short circuit between the pin 11 to 20 and the pins 1 to 10 while maintaining a pin space at the smallest.

In addition, as illustrated in FIG. 28, in the switch control device 1 of this structural example, the first semiconductor chip 10 and the third semiconductor chip 30 are mounted on a first island 40, while the second semiconductor chip 20 is mounted on a second island 50. With this structure, it is possible to use the first island 40 as a low voltage side island (fixed to GND1) and the second island 50 as a high voltage side island (fixed to VEE2) so that their power supply system can be separated from each other. Note that each of the first island 40 and the second island 50 is made of a non-magnetic material (e.g., copper), but it is possible to use a magnetic material (e.g., iron).

FIG. 29 is an explanatory table of external terminals. Pin 1 (NC) is a non-connection terminal. Pin 2 (VEE2) is a negative power source terminal (e.g., −15 volts at lowest). Pin 3 (GND2) is a GND terminal, which is connected to an emitter of an insulated gate bipolar transistor Tr1 in the outside of the switch control device 1. Pin 4 (OCP/DE-SATIN) is an overcurrent detection terminal. Pin 5 (OUT) is an output terminal. Pin 6 (VCC2) is a positive power source terminal (e.g., 30 volts at highest). Pin 7 (CLAMP) is a clamp terminal. Pin 8 (PROOUT) is a slow-off output terminal. Pin 9 (VEE2) is a negative power source terminal. Pin 10 (NC) is a non-connection terminal. Pin 11 (GND1) is a GND terminal. Pin 12 (IN) is a control input terminal. Pin 13 (RST) is a reset input terminal. Pin 14 (FLT) is an output terminal of the first state signal (abnormal state detection signal on a controller chip side). Pin 15 (OCPOUT) is an output terminal of the second state signal (abnormal state detection signal on a driver chip side). Pin 16 (ERRIN) is an error detection terminal. Pin 17 (VCC1) is a power source terminal (e.g., 5 volts). Pin 18 (NC) and pin 19 (NC) are non-connection terminals. Pin 20 (GND1) is a GND terminal.

FIG. 30 is an electrical characteristic table of the switch control device 1. Note that numeric values in this table are numeric values in a case where Ta=25 degrees centigrade, VCC1=5 volts, VCC2=20 volts, and VEE2=−8 volts, unless otherwise noted.

Figure 31:
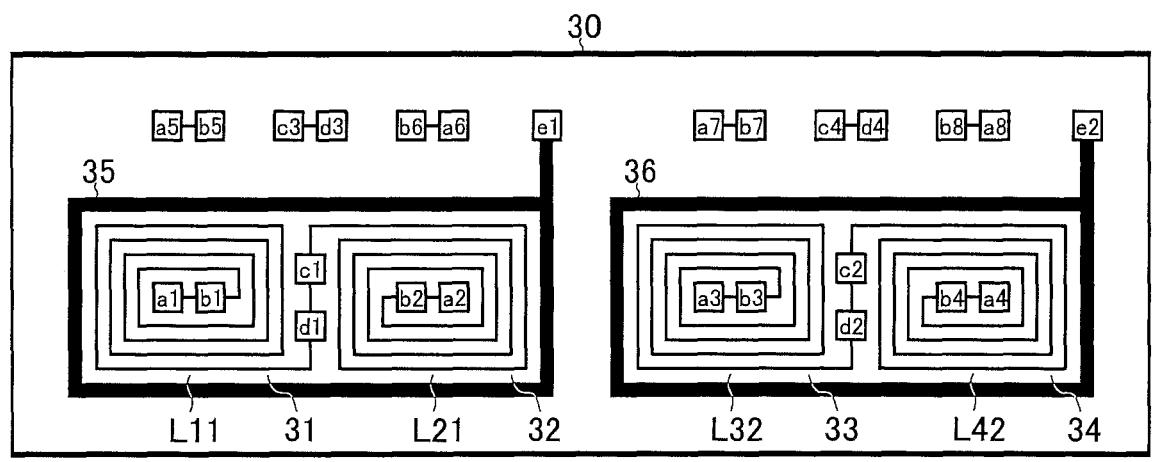
FIG. 31 is a schematic diagram illustrating a layout example of transformers 31 to 34.

Next, a transformer arrangement in the third semiconductor chip 30 is described in detail with reference to FIGS. 31 and 32. FIG. 31 is a schematic diagram illustrating a layout example of the transformers 31 to 34, and FIG. 32 is a chip cross sectional view illustrating a vertical structure of the transformer 31.

An end of a primary side coil L11 forming the first transformer 31 is connected to pads a1 and b1, and the other end of the primary side coil L11 is connected to pads c1 and d1. An end of a primary side coil L21 forming the second transformer 32 is connected to pads a2 and b2, and the other end of the primary side coil L21 is connected to pads c1 and d1.

An end of a secondary side coil L32 forming the third transformer 33 is connected to pads a3 and b3, and the other end of the secondary side coil L32 is connected to pads c2 and d2. An end of a secondary side coil L42 forming the fourth transformer 34 is connected to pads a4 and b4, and the other end of the secondary side coil L42 is connected to the pads c2 and d2.

Figure 32:
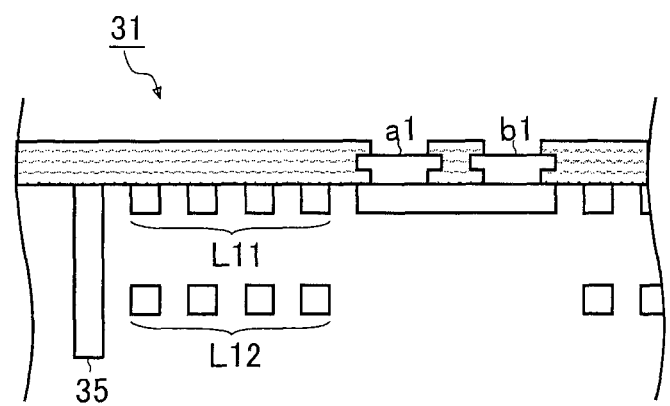
FIG. 32 is a chip cross section illustrating a vertical structure of the transformer 31.
Figure 33:
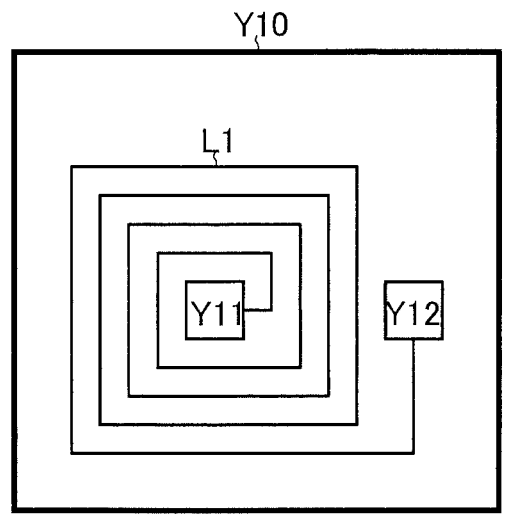
FIG. 33 is a schematic diagram illustrating a conventional example of the semiconductor device in which a coil is integrated.
Figure 34:
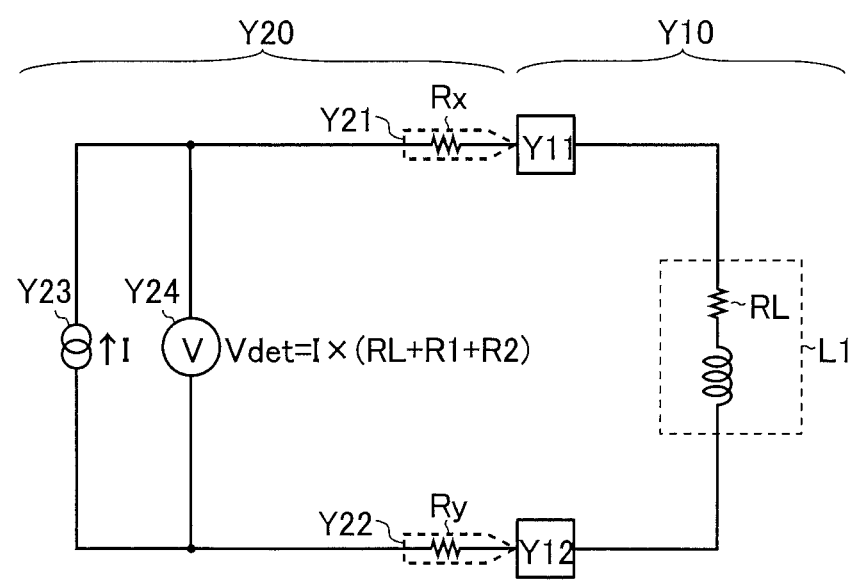
FIG. 34 is a schematic diagram for explaining defective inspection of a semiconductor device Y10.

Note that a secondary side coil L12 forming the first transformer 31, a secondary side coil L22 forming the second transformer 32, a primary side coil L31 forming the third transformer 33, and a primary side coil L41 forming the fourth transformer 34 have basically the same structure as described above, though any of them is not illustrated clearly in FIGS. 31 and 32 except that FIG. 32 illustrates a part of the secondary side coil L12.

In other words, an end of the secondary side coil L12 forming the first transformer 31 is connected to pads a5 and b5, and the other end of the secondary side coil L12 is connected to pads c3 and d3. An end of the secondary side coil L22 forming the second transformer 32 is connected to pads a6 and b6, and the other end of the secondary side coil L22 is connected to the pads c3 and d3.

An end of the primary side coil L31 forming the third transformer 33 is connected to pads a7 and b7, and the other end of the primary side coil L31 is connected to pads c4 and d4. An end of the primary side coil L41 forming the fourth transformer 34 is connected to pads a8 and b8, and the other end of the primary side coil L41 is connected to the pads c4 and d4.

However, the above-mentioned pads a5 to a8, b5 to b8, c3, c4, d3, and d4 are lead out from the inside of the third semiconductor chip 30 to the surface through via holes (not shown).

Each of the pads a1 to a8 among the above-mentioned plurality of pads corresponds to the first current supply pad X11$a$, while each of the pads b1 to b8 corresponds to the first voltage measurement pad X11$b$. In addition, each of the pads c1 to c4 corresponds to the second current supply pad X12$a$, while each of the pads d1 to d4 corresponds to the second voltage measurement pad X12$b$.

Therefore, because the third semiconductor chip 30 of this structural example can perform the defective inspection described above with reference to FIG. 23 and can correctly measure a series resistance component of each coil, it is possible not only to reject a defective product having a break occurred in each coil but also to appropriately reject a defective product having an abnormal resistance in each coil (e.g., partial short circuit between windings), and hence it is possible to prevent a defective product from being on the market.

Note that as to the third semiconductor chip 30 that has passed the above-mentioned defective inspection, the above-mentioned plurality of pads should be used for connection with the first semiconductor chip 10 and the second semiconductor chip 20.

Specifically, the pads a1 and b1 should be connected to a signal output terminal of the first transmission portion 11, while the pads a2 and b2 should be connected to a signal output terminal of the second transmission portion 12. In addition, the pads c1 and d1 should be connected to a common voltage applying terminal (GND1) on the first semiconductor chip 10 side.

In addition, the pads a3 and b3 should be connected to a signal input terminal of the first reception portion 13, while the pads a4 and b4 should be connected to a signal input terminal of the second reception portion 14. In addition, the pads c2 and d2 should be connected to a common voltage applying terminal (GND1) on the first semiconductor chip 10 side.

On the other hand, the pads a5 and b5 should be connected to a signal input terminal on the third reception portion 21, while the pads a6 and b6 should be connected to a signal input terminal of the fourth reception portion 22. In addition, the pads c3 and d3 should be connected to a common voltage applying terminal (GND2) on the second semiconductor chip 20 side.

In addition, the pads a7 and b7 should be connected to a signal output terminal of the third transmission portion 23, while the pads a8 and b8 should be connected to a signal output terminal of the fourth transmission portion 24. In addition, the pads c4 and d4 should be connected to a common voltage applying terminal (GND2) on the second semiconductor chip 20 side.

Here, the first transformer 31 to the fourth transformer 34 are arranged to be coupled in each signal transmission direction thereof as illustrated in FIG. 31. More specifically, the first transformer 31 and the second transformer 32 that transmit a signal from the first semiconductor chip 10 to the second semiconductor chip 20 form a first pair with a first guard ring 35. In addition, the third transformer 33 and the fourth transformer 34 that transmit a signal from the second semiconductor chip 20 to the first semiconductor chip 10 form a second pair with a second guard ring 36.

Such a coupling is performed in order to ensure a withstand voltage between the primary side coil and the secondary side coil in a case where the primary side coils and the secondary side coils forming the first transformer 31 to the fourth transformer 34 are formed to be laminated in the thickness direction of the substrate of the third semiconductor chip 30. However, the first guard ring 35 and the second guard ring 36 are not necessarily essential elements.

Note that the first guard ring 35 and the second guard ring 36 should be connected to a low impedance wiring such as a ground terminal via pads e1 and e2, respectively.

In addition, in the third semiconductor chip 30 of this structural example, the pads c1 and d1 are shared between the coil L11 and the coil L21. In addition, the pads c2 and d2 are shared between the coil L32 and the coil L42. In addition, the pads c3 and d3 are shared between the coil L12 and the coil L22. In addition, pads c4 and d4 are shared between the coil L31 and the coil L41. With this structure, the number of pads can be reduced so that the third semiconductor chip 30 can be downsized.

In addition, as illustrated in FIG. 31, it is preferred that the primary sides coil and the secondary side coils forming the first transformer 31 to the fourth transformer 34 be coiled to have a rectangular shape viewed from the front of the chip. With this structure, an area of an overlapping part between the primary side coil and the secondary side coil increases so that transmission efficiency of the transformer can be enhanced.

Note that the embodiment described above exemplifies the structure in which the present invention is applied to the motor drive apparatus mounted in a hybrid vehicle, but the application of the present invention is not limited to this. The present invention can be applied generally to semiconductor devices in which a coil is integrated on a chip.

In addition, the structure of the present invention can be modified variously other than the above-mentioned embodiment within the scope of the invention without deviating from the spirit thereof.

For instance, as to the layout of the semiconductor device, the number of coils, the shape thereof, the arrangement thereof, and the arrangement of the pads are arbitrary.

Third Technical Feature

Hereinafter, a motor drive apparatus using a signal transmission device according to the present invention (in particular, a motor drive IC mounted in a hybrid vehicle using a high voltage) is exemplified for detailed description. Note that the overall structure and the operation of the motor drive apparatus in which the signal transmission device according to the present invention is mounted are as described above with reference to FIGS. 26 to 30. Therefore, overlapping description is omitted, and a structure and operation of the signal transmission device are described mainly.

[First Embodiment of Signal Transmission Device]

Figure 35:
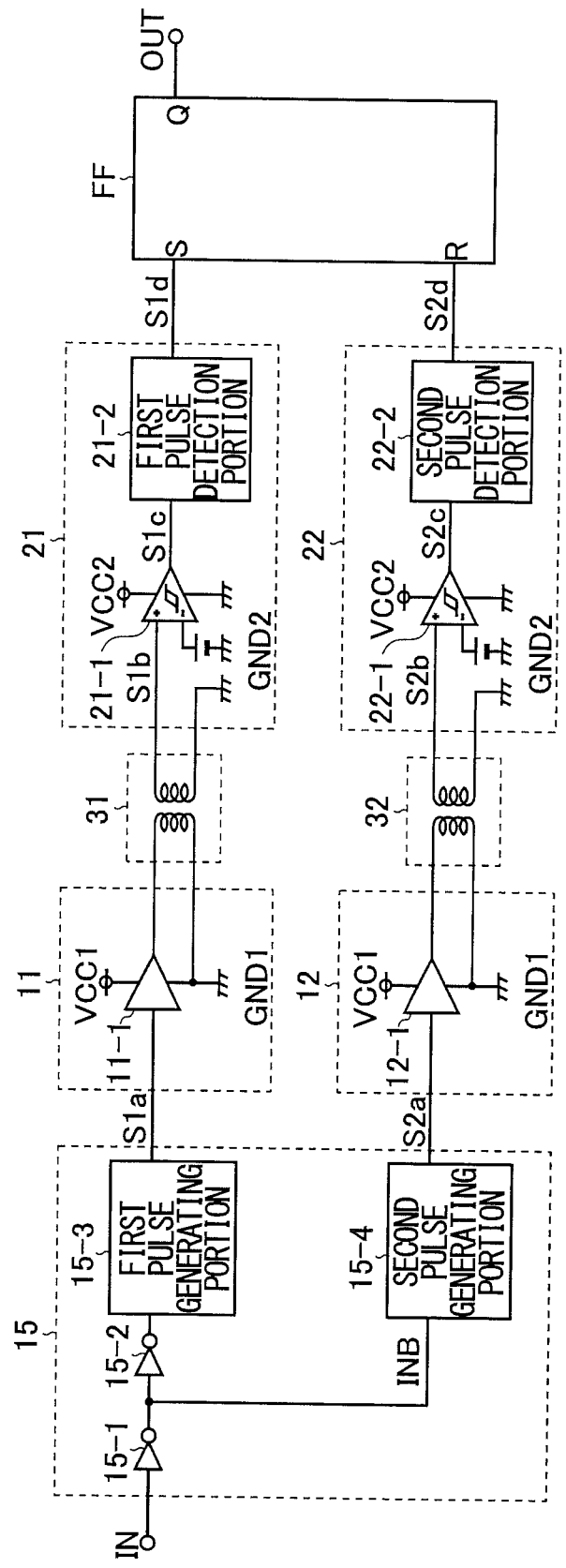
FIG. 35 is a circuit block diagram illustrating a first embodiment of a signal transmission device according to the present invention.

FIG. 35 is a circuit block diagram illustrating a first embodiment of the signal transmission device according to the present invention. The signal transmission device of this embodiment includes the logic portion 15, the first transmission portion 11, the second transmission portion 12, the first transformer 31, the second transformer 32, the third reception portion 21, the fourth reception portion 22, and the SR flip-flop FF, as circuit blocks for transmitting the switch control signals S1 and S2 from the primary side circuit to the secondary side circuit, in a state where the ground voltage GND1 of the primary side circuit and the ground voltage GND2 of the secondary side circuit are isolated from each other. Each of these circuit blocks is described above with reference to FIGS. 26 and 27. In the signal transmission device of this embodiment, in order to avoid a malfunction due to noise or the like, there are creations and devices in the structures of the logic portion 15, the third reception portion 21, and the fourth reception portion 22. Hereinafter, a characteristic part of the structure is described mainly.

The logic portion 15 includes inverters 15-1 and 15-2, a first pulse generating portion 15-3, and a second pulse generating portion 15-4.

An input terminal of the inverter 15-1 is connected to the input terminal of the input signal IN. An output terminal of the inverter 15-1 is connected to an input terminal of the inverter 15-2 and is also connected to an input terminal of the second pulse generating portion 15-4. An output terminal of the inverter 15-2 is connected to an input terminal of the first pulse generating portion 15-3.

The first pulse generating portion 15-3 generates N pulses (N≥2) in a first transformer drive signal S1a in response to a positive edge of the input signal IN input via the inverters 15-2 and 15-3. Note that the first transformer drive signal S1a is output to the primary side winding of the first transformer 31 via a buffer 11-1 forming the first transmission portion 11.

The second pulse generating portion 15-4 generates N pulses (N≥2) in a second transformer drive signal S2a in response to an positive edge of an inversed input signal INB input from the inverter 15-2 (namely, a negative edge of the input signal IN). Note that the second transformer drive signal S2a is output to a primary side winding of the second transformer 32 via a buffer 12-1 forming the second transmission portion 12.

In this way, in the signal transmission device of the first embodiment, the logic portion 15 works as a transformer drive signal generating portion, which continuously generates N pulses in the first transformer drive signal Slain response to a positive edge of the input signal IN from low level to high level, and continuously generates N pulses in the second transformer drive signal S2a in response to a negative edge of the input signal IN from high level to low level.

The first transformer 31 generates a first induced signal S1b in the secondary side winding in response to the first transformer drive signal S1a input to the primary side winding.

The second transformer 32 generates a second induced signal S2b in the secondary side winding in response to the second transformer drive signal S2a input to the primary side winding.

The third reception portion 21 includes a first comparator 21-1 that compares the first induced signal S1b with a predetermined threshold voltage so as to generate a first comparison signal S1c, and a first pulse detection portion 21-2 that detects that N pulses are continuously generated in the first comparison signal S1c so as to generate a pulse in the first detection signal S1d.

The fourth reception portion 22 includes a second comparator 22-1 that compares the second induced signal S2b with a predetermined threshold voltage so as to generate a second comparison signal S2c, and a second pulse detection portion 22-2 that detects that N pulses are continuously generated in the second comparison signal S2c so as to generate a pulse in the second detection signal S2d.

The SR flip-flop FF changes the output signal OUT from low level to high level in response to the pulse generated in the first detection signal S1d input to the set input terminal (S), and changes the output signal OUT from high level to low level in response to the pulse generated in the second detection signal S2d input to the reset input terminal (R).

In other words, the switch control signal S1 described above is transmitted from the logic portion 15 to the SR flip-flop FF while having various signal forms of the first transformer drive signal S1a, the first induced signal S1b, the first comparison signal S1c, and the first detection signal S1d. Similarly, the switch control signal S2 described above is transmitted from the logic portion 15 to the SR flip-flop FF while having various signal forms of the second transformer drive signal S2a, the second induced signal S2b, the second comparison signal S2c, and the second detection signal S2d.

Figure 36:
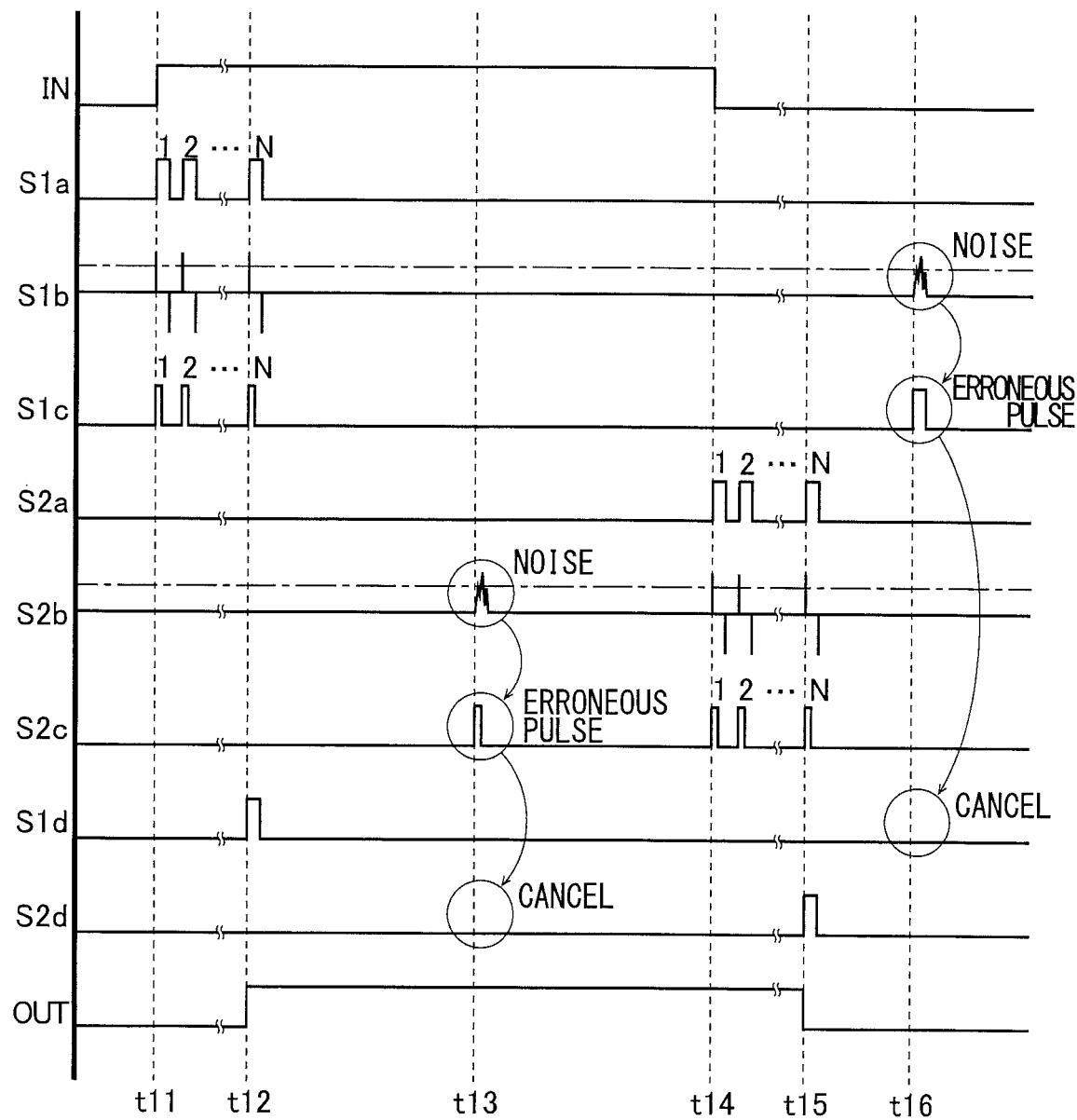
FIG. 36 is a timing chart illustrating an example of noise cancel operation.

FIG. 36 is a timing chart illustrating an example of noise cancel operation realized by the signal transmission device of the first embodiment. There are illustrated, in order from the upper part, the input signal IN, the first transformer drive signal S1a, the first induced signal S1b, the first comparison signal S1c, the second transformer drive signal S2a, the second induced signal S2b, the second comparison signal S2c, the first detection signal S1d, the second detection signal S2d, and the output signal OUT.

When the input signal IN is raised from low level to high level at time point t11, the first pulse generating portion 15-3 starts pulse drive of the first transformer drive signal S1a. Then, the first induced signal S1b responding to the first transformer drive signal S1a is generated in the secondary side winding of the first transformer 31, and pulses of the same number as the first transformer drive signal S1a are generated in the first comparison signal S1c output from the first comparator 21-1. Note that the first pulse detection portion 21-2 maintains the first detection signal S1d at low level after the time point t11 until N pulses are continuously generated in the first comparison signal S1c.

The N-th pulse is generated in the first transformer drive signal S1a at time point t12, and when the N-th pulse is generated in the first comparison signal S1c, the first pulse detection portion 21-2 generates a pulse in the first detection signal S1d. In response to this pulse, the SR flip-flop FF raises the output signal OUT from low level to high level.

It is supposed that at time point t13, a noise is added to the second induced signal S2b in a state where the input signal IN is maintained at high level, and an erroneous pulse is generated in the second comparison signal S2c. In this case too, the second pulse detection portion 222 maintains the second detection signal S2d at low level as long as N pulses are not generated continuously in the second comparison signal S2c. Therefore, the output signal OUT is not dropped to low level unintentionally.

When the input signal IN is dropped from high level to low level at time point t14, the second pulse generating portion 15-4 starts pulse drive of the second transformer drive signal S2a. Then, the second induced signal S2b corresponding to the second transformer drive signal S2a is generated in the secondary side winding of the second transformer 32, and pulses of the same number as the second transformer drive signal S2a are generated in the second comparison signal S2c output from the second comparator 22-1. Note that the second pulse detection portion 22-2 maintains the second detection signal S2d at low level after time point t14 until N pulses are continuously generated in the second comparison signal S2c.

The N-th pulse is generated in the second transformer drive signal S2a at time point t15, and when the N-th pulse is generated in the second comparison signal S2c, the second pulse detection portion 22-2 generated a pulse in the second detection signal S2d. In response to this pulse, the SR flip-flop FF drops the output signal OUT from high level to low level.

It is supposed that at time point t16, a noise is added to the first induced signal S1b in a state where the input signal IN is maintained at low level, and an erroneous pulse is generated in the first comparison signal S1c. In this case too, the first pulse detection portion 21-2 maintains the first detection signal S1d at low level as long as N pulses are not continuously generated in the first comparison signal S1c. Therefore, the output signal OUT is not dropped to high level unintentionally.

In this way, with the structure in which N pulses are continuously generated in the transformer drive signal generated in the primary side circuit, and a logical level of the output signal OUT is changed only when N pulses are continuously generated in the comparison signal generated in the secondary side circuit, an unintentional logic change is not generated in the output signal OUT, even if an erroneous pulse is generated when the transformer is affected by a noise, as long as the number of generation is not larger than (N−1). Therefore, it is possible to eliminate erroneous ON/OFF of the high side switch SWH so as to prevent a break down of a power transistor used as the high side switch SWH or the low side switch SWL.

Note that in the signal transmission device of the first embodiment, it is necessary to take a countermeasure against generation of an erroneous pulse due to a noise so that N pulse count operation in a normal state is not affected, namely, a countermeasure in the structures of the first pulse detection portion 21-2 and the second pulse detection portion 22-2 (e.g., if the N-th pulse is not detected in a predetermined period after the first pulse is detected, a detection result at that time is reset).

However, even if the above-mentioned countermeasure is taken, if a noise is added at a vicinity of a pulse edge of the input signal IN in the transformer, an erroneous pulse cannot be distinguished from a normal pulse so that a count value of the erroneous pulse is added to a count value of the normal pulses. Therefore, there may rarely be a problem that a necessary time from a change of a logical level of the input signal IN until a change of a logical level of the output signal OUT is varied so that a jitter component of the output signal OUT increases.

Therefore, in the following description, in order to solve the above-mentioned problem, a second embodiment of the signal transmission device according to the present invention is proposed.

[Second Embodiment of Signal Transmission Device]

Figure 37:
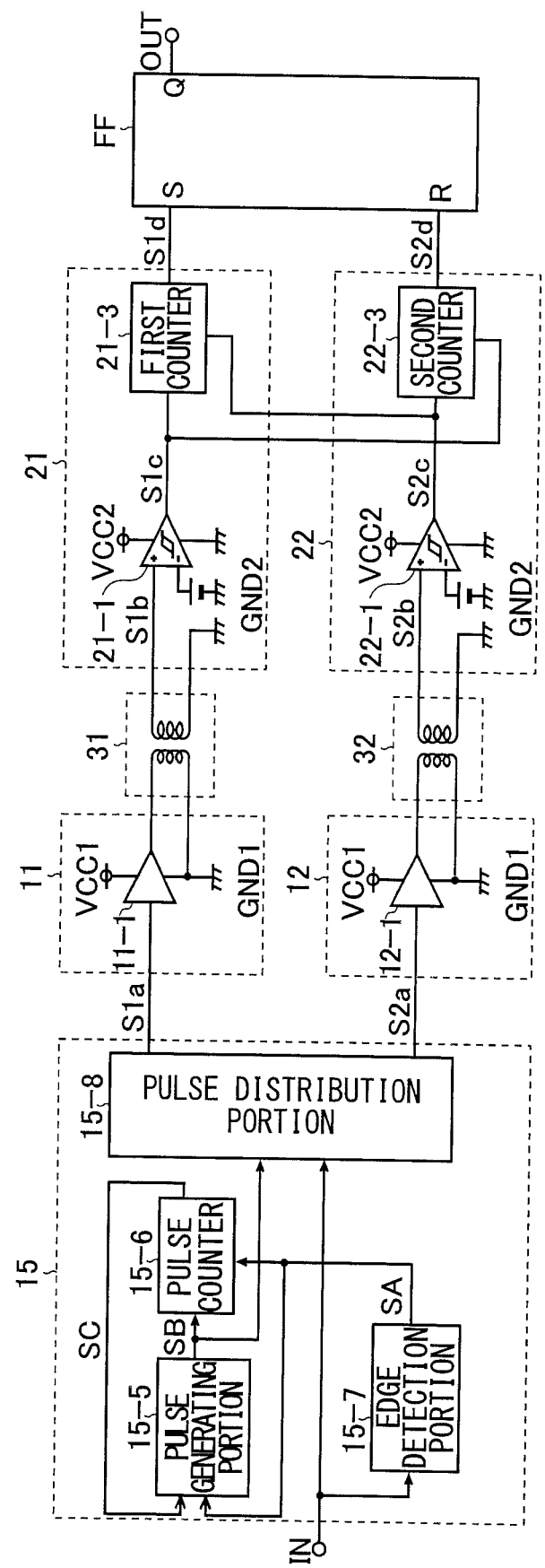
FIG. 37 is a circuit block diagram illustrating a second embodiment of the signal transmission device according to the present invention.

FIG. 37 is a circuit block diagram illustrating a second embodiment of the signal transmission device according to the present invention. The signal transmission device of this embodiment basically has the same structure as the first embodiment described above, but has a modified internal structure of the logic portion 15, the third reception portion 21, and the fourth reception portion 22, assuming that the same noise will be generated in both the first induced signal S1b and the second induced signal S2b if the transformers 31 and 32 are disposed close to each other. Therefore, in the following description, the above-mentioned modified part is described mainly.

The logic portion 15 includes a pulse generating portion 15-5, a pulse counter 15-6, an edge detection portion 15-7, and a pulse distribution portion 15-8.

The pulse generating portion 15-5 generates a pulse signal SB having a predetermined frequency and outputs the same to the pulse counter 15-6 and the pulse distribution portion 15-8. Note that the pulse generating portion 15-5 is supplied with an edge detection signal SA from the edge detection portion 15-7, and drive of the same is started when the edge detection signal SA is set to high level. In addition, the pulse generating portion 15-5 is supplied with a counter output signal SC from the pulse counter 15-6, and drive the same is stopped when the counter output signal SC is set to low level.

The pulse counter 15-6 counts the number of pulses of the pulse signal SB and maintains the counter output signal SC at high level until the count value reaches N. When the count value reaches N, the pulse counter 15-6 changes the counter output signal SC from high level to low level. Note that the pulse counter 15-6 is supplied with an edge detection signal SA from the edge detection portion 15-7. When the edge detection signal SA is set to high level, the count value is reset.

When the edge detection portion 15-7 detects a pulse edge of the input signal IN, it generates a pulse in the edge detection signal SA. Specifically, both in the case where the input signal IN is raised from low level to high level and in the case where the input signal IN is dropped from high level to low level, the edge detection signal SA is raised from low level to high level for a predetermined period, and after that the signal SA is dropped to low level again.

The pulse distribution portion 15-8 distributes the pulse signal SB as either one of the first transformer drive signal S1a and the second transformer drive signal S2b in response to a logical level of the input signal IN. Specifically, if the input signal IN is high level, the pulse distribution portion 15-8 outputs the pulse signal SB as the first transformer drive signal S1a and maintains the second transformer drive signal S2a at low level. On the contrary, if the input signal IN is low level, the pulse distribution portion 15-8 outputs the pulse signal SB as the second transformer drive signal S2a and maintains the first transformer drive signal S1a at low level.

Figure 38:
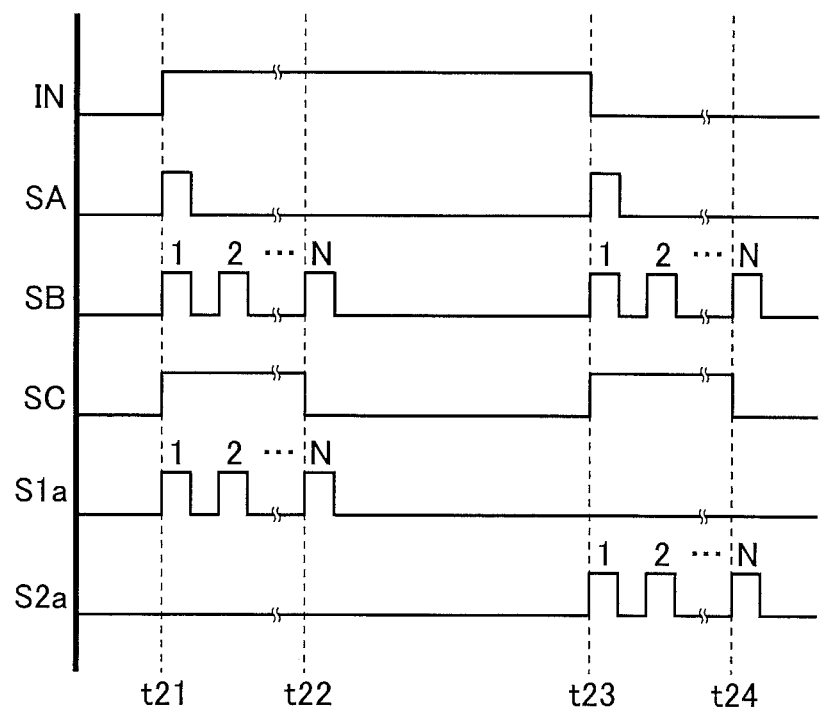
FIG. 38 is a timing chart illustrating a first generation operation of a transformer drive signal.

FIG. 38 is a timing chart illustrating a first generation operation of the transformer drive signals S1a and S2a. There are illustrated, in order from the upper part, the input signal IN, the edge detection signal SA, the pulse signal SB, the counter output signal SC, the first transformer drive signal S1a, and the second transformer drive signal S2a.

When the input signal IN is raised from low level to high level at time point t21, an edge detection portion 157 raises the edge detection signal SA from low level to high level, and then drops the same to low level again. The pulse generating portion 15-5 starts the operation when the edge detection signal SA is set to high level, and starts to output the pulse signal SB without delay from the time point t21. The pulse counter 15-6 resets the count value when the edge detection signal SA is set to high level and starts to count the number of pulses of the pulse signal SB from the beginning. In addition, because the count value of the pulse counter 15-6 is reset, the counter output signal SC is raised from low level to high level. After the time point t21 until the number of pulses of the pulse signal SB reaches N, the counter output signal SC is maintained at high level. The pulse distribution portion 15-8 outputs the pulse signal SB as the first transformer drive signal S1a after the time point t21 during a period while the input signal IN is high level and maintains the second transformer drive signal S2a at low level.

When the number of pulses of the pulse signal SB reaches N at time point t22, the pulse counter 15-6 drops the counter output signal SC from high level to low level, and the pulse generating portion 15-5 stops the drive in response to the drop. Therefore, the first transformer drive signal S1a and the second transformer drive signal S2a are maintained at low level after the time point t22 until the input signal IN is dropped to low level.

When the input signal IN is dropped from high level to low level at time point t23, the edge detection portion 15-7 raises the edge detection signal SA from low level to high level, and then drops the same to low level again. The pulse generating portion 15-5 starts the drive when the edge detection signal SA is set to high level, and starts to output the pulse signal SB without delay from the time point t23. The pulse counter 15-6 resets the count value when the edge detection signal SA is set to high level and starts to count the number of pulses of the pulse signal SB from the beginning. In addition, when a count value of the pulse counter 15-6 is reset, the counter output signal SC is raised from low level to high level. After the time point t23 until the number of pulses of the pulse signal SB reaches N, the counter output signal SC is maintained at high level. The pulse distribution portion 15-8 outputs the pulse signal SB as the second transformer drive signal S2a and maintains the first transformer drive signal S1a at low level after the time point t23 during a period while the input signal IN is low level.

When the number of pulses of the pulse signal SB reaches N at time point t24, the pulse counter 15-6 drops the counter output signal SC from high level to low level, and the pulse generating portion 15-5 stops the drive in response to the drop. Therefore, after the time point t24 until the input signal IN is raised to high level, both the first transformer drive signal S1a and the second transformer drive signal S2a are maintained at low level.

In this way, in the signal transmission device of the second embodiment too, the logic portion 15 works as the transformer drive signal generating portion that continuously generates N pulses in the first transformer drive signal S1a in response to a positive edge of the input signal IN from low level to high level, and continuously generates N pulses in the second transformer drive signal S2a in response to a negative edge of the input signal IN from high level to low level. This point is the same as the first embodiment described above.

With reference to FIG. 37 again, internal structures of the third reception portion 21 and the fourth reception portion 22 are described below.

The third reception portion 21 includes the first comparator 21-1 and a first counter 21-3. The first counter 21-3 is a circuit block that counts the number of pulses generated in the first comparison signal S1c and generates a pulse in the first detection signal S1d when the count value reaches N. In addition, the first counter 21-3 has a structure in which the count value is reset by the pulse generated in the second comparison signal S2c. The action and effect thereof will be described later.

The fourth reception portion 22 includes a second comparator 22-1 and a second counter 22-3. The second counter 22-3 is a circuit block that counts the number of pulses generated in the second comparison signal S2c and generates a pulse in the second detection signal S2d when the count value reaches N. In addition, the second counter 22-3 has a structure in which the count value is reset by the pulse generated in the first comparison signal S1c. The action and effect thereof will be described later.

In this way, in the second embodiment, the first counter 21-3 and the second counter 22-3 are used as circuit blocks corresponding to the first pulse detection portion 21-2 and the second pulse detection portion 22-2, respectively, described in the first embodiment.

Figure 39:
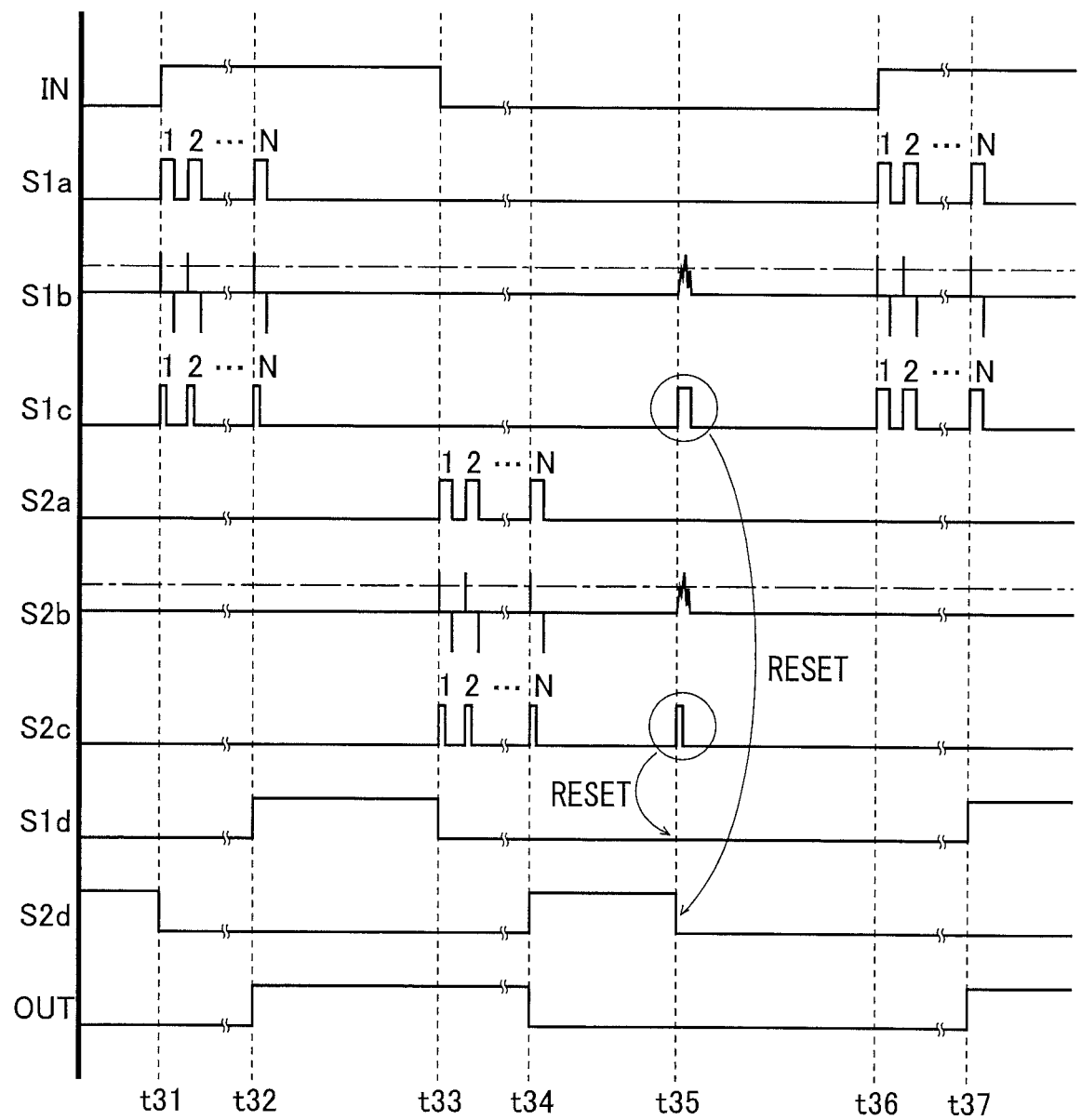
FIG. 39 is a timing chart illustrating an example of the noise cancel operation.

FIG. 39 is a timing chart illustrating an example of noise cancel operation realized by the signal transmission device of the second embodiment. There are illustrated, in order from the upper part, the input signal IN, the first transformer drive signal S1a, the first induced signal S1b, the first comparison signal S1c, the second transformer drive signal S2a, the second induced signal S2b, the second comparison signal S2c, the first detection signal S1d, the second detection signal S2d, and the output signal OUT.

When the input signal IN is raised from low level to high level at time point t31, the logic portion 15 starts pulse drive of the first transformer drive signal S1a by the signal generation operation as described above with reference to FIG. 38. Then, the first induced signal S1b responding to the first transformer drive signal S1a is generated in the secondary side winding of the first transformer 31, and pulses of the same number as the first transformer drive signal S1a are generated in the first comparison signal S1c output from the first comparator 21-1. Note that the first counter 21-3 maintains the first detection signal S1d at low level after the time point t31 until the number of pulses in the first comparison signal S1c reaches N. In addition, because a count value of the second counter 22-3 is reset by the first pulse generated in the first comparison signal S1c at the time point t31, the second detection signal S2d is dropped from high level to low level. After the time point t31 too, a count value of the second counter 22-3 is reset every time when a pulse is generated in the first comparison signal S1c, and the second detection signal S2d is maintained at low level.

At time point t32, the N-th pulse is generated in the first transformer drive signal S1a, and when the number of pulses of the first comparison signal S1c reaches N, the first counter 21-3 raises the first detection signal S1d from low level to high level. In response to this positive edge, the SR flip-flop FF raises the output signal OUT from low level to high level.

At time point t33, when the input signal IN is dropped from high level to low level, the logic portion 15 starts the pulse drive of the second transformer drive signal S2a by the signal generation operation as described above with reference to FIG. 38. Then, the second induced signal S2b is generated in the secondary side winding of the second transformer 32 in response to the second transformer drive signal S2a, and pulses of the same number as the second transformer drive signal S2a are generated in the second comparison signal S2c output from the second comparator 22-1. Note that the second counter 22-3 maintains the second detection signal S2d at low level after the time point t33 until the number of pulses in the second comparison signal S2c reaches N. In addition, because a count value of the first counter 21-3 is reset by the first pulse generated in the second comparison signal S2c at the time point t33, the first detection signal S1d is dropped from high level to low level. After the time point t33 too, a count value of the first counter 21-3 is reset every time when a pulse is generated in the second comparison signal S2c, and the first detection signal S1d is maintained at low level.

At time point t34, the N-th pulse is generated in the second transformer drive signal S2a, and when the number of pulses of the second comparison signal S2c reaches N, the second counter 22-3 raises the second detection signal S2d from low level to high level. In response to this positive edge, the SR flip-flop FF drops the output signal OUT from high level to low level.

It is supposed that the same noise is added to both the first induced signal S1b and the second induced signal S2b in a state where the input signal IN is maintained at low level at time point t35, and that an erroneous pulse is added to both the first comparison signal S1c and the second comparison signal S2c. In this case too, the first counter 21-3 and the second counter 22-3 maintain the first detection signal S1d and the second detection signal S2d to low level as long as the number of pulses of the first comparison signal S1c and the second comparison signal S2c does not reach N. Therefore, the output signal OUT is not changed to the unintentional logical level.

In addition, a count value of the first counter 21-3 is reset by an erroneous pulse generated in the second comparison signal S2c, and a count value of the second counter 22-3 is reset by an erroneous pulse generated in the first comparison signal S1c. Therefore, when the input signal IN is raised from low level to high level at time point t36, even if a noise is added to the transformer just before that (namely, the time point t35 and the time point t36 are close to each other), the first counter 21-3 can start to count the number of only correct pulses generated in the first comparison signal S1c in the normal signal transmission operation from the beginning without including an erroneous pulse generated due to the above-mentioned noise in a count value. Therefore, a variation is not generated in the timing when the N-th pulse is detected so that jitter characteristic of the output signal OUT can be appropriately maintained.

Note that in the above description with reference to FIG. 39, a case where a noise is added in a state where the input signal IN is maintained at low level is exemplified. On the contrary, if a noise is added in a state where the input signal IN is maintained at high level (e.g., between the time point t32 and the time point t33), the fact that a count value of the second counter 22-3 is reset by an erroneous pulse generated in the first comparison signal S1c is effectual as follows. When the input signal IN is dropped from high level to low level at time point t33, the second counter 22-3 can start the number of only correct pulses generated in the second comparison signal S2c in the normal signal transmission operation from the beginning without including an erroneous pulse generated due to the above-mentioned noise in a count value.

In this way, in the signal transmission device of the second embodiment, a counter value of the first counter 21-3 is reset by a pulse generated in the second comparison signal S2c, and a counter value of the second counter 22-3 is reset by a pulse generated in the first comparison signal S1c. Therefore, a pulse is not generated in the first detection signal S1d and the second detection signal S2d, and hence a logical level of the output signal OUT is not changed, unless the first induced signal S1b is detected N times continuously only by the first comparator 21-1, or the second induced signal S2b is detected N times continuously only by the second comparator 22-1.

In other words, the signal transmission device of the second embodiment can distinguish pulses generated N times continuously only in one transformer as correct pulses generated in the normal signal transmission operation from pulses generated in both transformers simultaneously as erroneous pulses generated due to a noise. Therefore, a count value of the erroneous pulse is not included in a count value of the correct pulses.

Therefore, the signal transmission device of the second embodiment not only can obtain the same action and effect as the first embodiment described above but also can keep the time necessary after a change of a logical level in the input signal IN until a change in a logical level of the output signal OUT to be constant so that jitter characteristic of the output signal OUT can be maintained appropriately.

Note that in each of the first embodiment and the second embodiment described above, there is exemplified a structure in which N pulses are continuously generated in the transformer drive signal generated by the primary side circuit, and only if N pulses are continuously generated in the comparison signal generated in the secondary side circuit, a logical level of the output signal OUT is changed. However, the present invention is not limited to this structure. It is possible to adopt a structure in which as to the transformer drive signal generated in the primary side circuit, N+a pulses (here, N≥2 and a≥0) may be continuously generated. With this structure, there is redundancy in pulse detection operation on the secondary side circuit (no redundancy if a=0) so that stability of the signal transmission operation can be enhanced.

However, if the first generation operation described above with reference to FIG. 38 is adopted as generation operation of the first transformer drive signal S1a and the second transformer drive signal S2a, a jitter component of the output signal OUT may be increased depending on timing of change in a logical level of the input signal IN. This point is described below with reference to FIG. 40A in comparison with FIG. 40B.

Figure 40A:
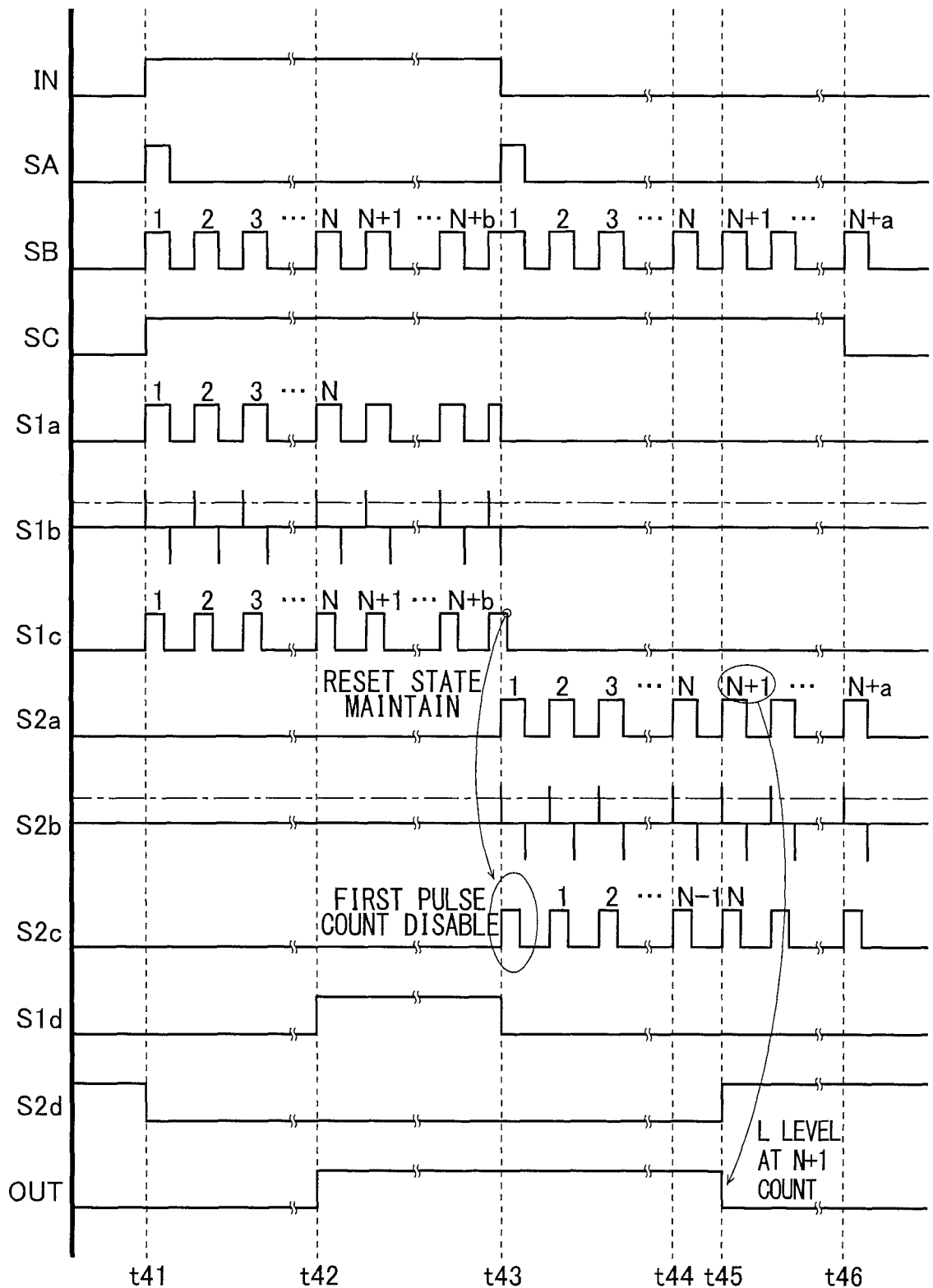
FIG. 40A is a timing chart for explaining a cause of generating output jitter.
Figure 40B:
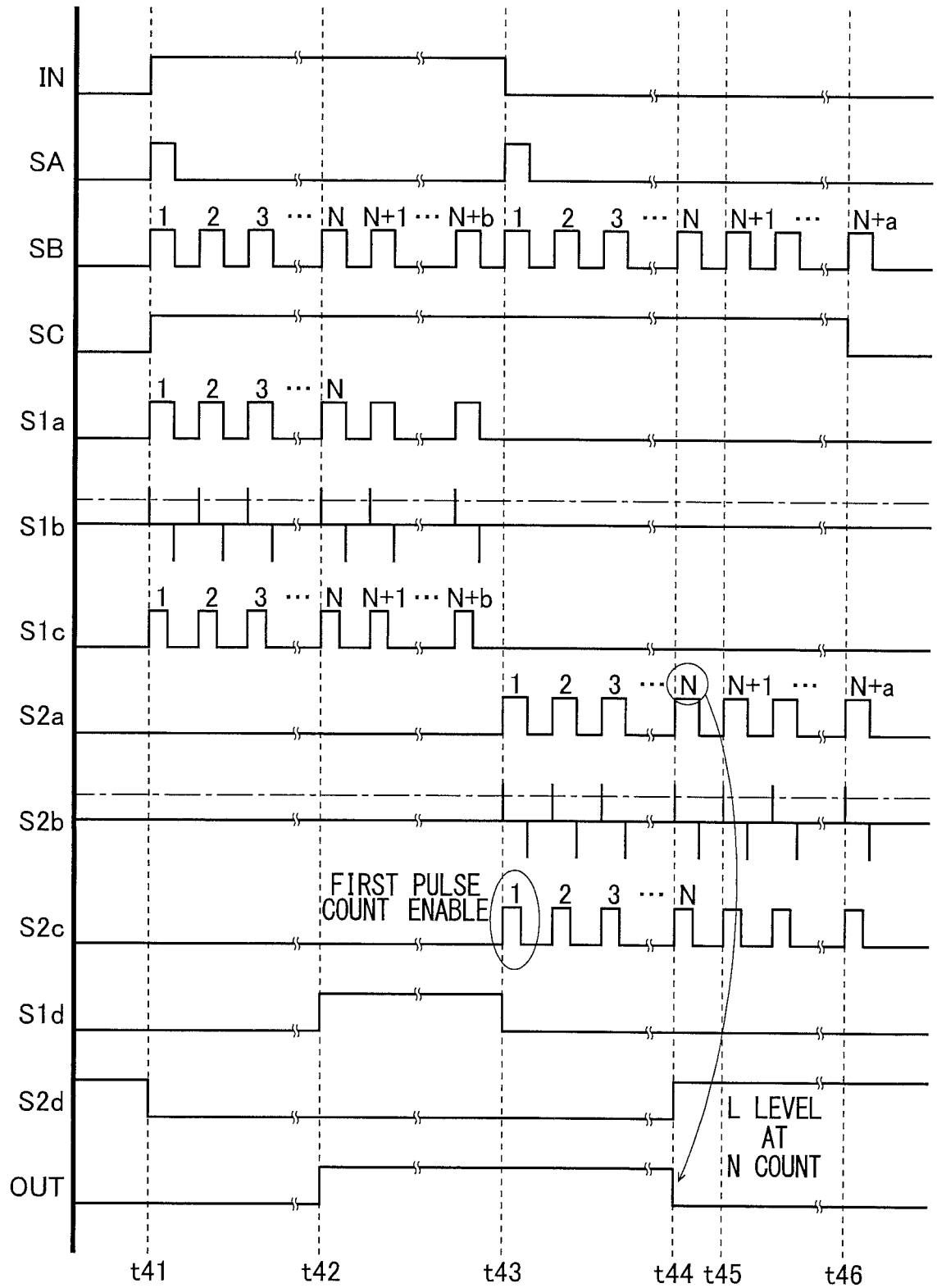
FIG. 40B is a timing chart for explaining a cause of generating output jitter.

FIGS. 40A and 40B are timing charts for explaining a cause of generating an output jitter. There are illustrated, in order from the upper part, the input signal IN, the edge detection signal SA, the pulse signal SB, the counter output signal SC, the first transformer drive signal S1a, the first induced signal S1b, the first comparison signal S1c, the second transformer drive signal S2a, the second induced signal S2b, the second comparison signal S2c, the first detection signal S1d, the second detection signal S2d, and the output signal OUT.

First, with reference to FIG. 40A, there is described a case where the (N+b)th pulse (here 0≤b≤ a) is generated in the first transformer drive signal S1a at timing just before a change of a logical level of the input signal IN.

When the input signal IN is raised from low level to high level at time point t41, the edge detection portion 15-7 raises the edge detection signal SA from low level to high level, and then drops the same to low level again. The pulse generating portion 15-5 starts the drive when the edge detection signal SA is set to high level and starts to output the pulse signal SB without delay from the time point t41. The pulse counter 15-6 resets the count value when the edge detection signal SA is set to high level and starts to count the number of pulses of the pulse signal SB from the beginning. In addition, when the count value of the pulse counter 15-6 is reset, the counter output signal SC is raised from low level to high level. The counter output signal SC is maintained at high level after the time point t41 until the number of pulses of the pulse signal SB reaches N+a. The pulse distribution portion 15-8 outputs the pulse signal SB as the first transformer drive signal S1a and maintains the second transformer drive signal S2a at low level after the time point t41 during a period while the input signal IN is high level.

When the above-mentioned signal generation operation is performed, the logic portion 15 starts pulse drive of the first transformer drive signal S1a at the time point t41. Then, in the secondary side winding of the first transformer 31, the first induced signal S1b is generated in response to the first transformer drive signal S1a, and pulses of the same number as the first transformer drive signal S1a are generated in the first comparison signal S1c output from the first comparator 21-1. Note that the first counter 21-3 maintains the first detection signal S1d at low level after the time point t41 until the number of pulses of the first comparison signal S1c reaches N. In addition, at the time point t41, a count value of the second counter 22-3 is reset by the first pulse generated in the first comparison signal S1c. Therefore, the second detection signal S2d is dropped from high level to low level. After the time point t41 too, a count value of the second counter 22-3 is reset every time when a pulse is generated in the first comparison signal S1c, and hence the second detection signal S2d is maintained at low level.

At time point t42, the N-th pulse is generated in the first transformer drive signal S1a, and when the number of pulses of the first comparison signal S1c reaches N, the first counter 21-3 raises the first detection signal S1d from low level to high level. In response to this positive edge, the SR flip-flop FF raises the output signal OUT from low level to high level.

On the other hand, the pulse counter 15-6 maintains the counter output signal SC at high level until the number of pulses of the pulse signal SB reaches N+a. Therefore, generation of the pulse signal SB (hence, the first transformer drive signal S1a) in the pulse generating portion 15-5 is continued.

After that, when the input signal IN is dropped from high level to low level at time point t43, the edge detection portion 15-7 raises the edge detection signal SA from low level to high level, and then drops the same to low level again. The pulse generating portion 15-5 stops to generate the (N+b)th and subsequent pulses at the time point when the edge detection signal SA is set to high level and newly starts pulse generation from beginning. The pulse counter 15-6 resets the count value when the edge detection signal SA is set to high level, and starts to count the number of pulses of the pulse signal SB from the beginning. In addition, when the count value of the pulse counter 15-6 is reset, the counter output signal SC is maintained at high level after the time point t43 until the number of pulses of the pulse signal SB reaches N+a. The pulse distribution portion 15-8 outputs the pulse signal SB as the second transformer drive signal S2a and maintains the first transformer drive signal S1a at low level after the time point t43 during a period while the input signal IN is low level.

When the above-mentioned signal generation operation is performed, the logic portion 15 starts pulse drive of the second transformer drive signal S2a at the time point t43.

Then, the second induced signal S2b is generated in response to the second transformer drive signal S2a in the secondary side winding of the second transformer 32, and pulses of the same number as the second transformer drive signal S2a are generated in the second comparison signal S2c output from the second comparator 22-1. Note that the second counter 22-3 maintains the second detection signal S2d at low level after the time point t43 until the number of pulses of the second comparison signal S2c reaches N. In addition, because a count value of the first counter 21-3 is reset by the first pulse generated in the second comparison signal S2c at the time point t43, the first detection signal S1d is dropped from high level to low level. After the time point t43 too, a count value of the first counter 21-3 is reset and the first detection signal S1d is maintained at low level every time when a pulse is generated in the second comparison signal S2c.

Here, it is a problem that the (N+b)th pulse is generated in the first transformer drive signal S1a at the timing just before the input signal IN is dropped from high level to low level. In this case, in response to the (N+b)th pulse generated in the first transformer drive signal S1a, the (N+b)th pulse is also generated in the first comparison signal S1c, and this pulse resets a count value of the second counter 22-3. However, depending on response ability of the first comparator 21-1, the first comparison signal S1c may be maintained at high level for some period of time after the pulse generated in the first induced signal S1b has vanished.

According to the above-mentioned phenomenon, if the first comparison signal S1c is maintained to high level after the time point t43, a reset state of the second counter 22-3 is not canceled. Therefore, the second counter 22-3 cannot count the first pulse generated in the second comparison signal S2c after the time point t43.

As a result, even if the N-th pulse is generated in the second transformer drive signal S2a, and the corresponding pulse is generated in the second comparison signal S2c at time point t44, the second detection signal S2d is maintained at low level because a count value of the second counter 22-3 is N−1. Then, the output signal OUT generated in the SR flip-flop FF remains at high level.

When the (N+1)th pulse is generated in the second transformer drive signal S2a, and the corresponding pulse is generated in the second comparison signal S2c at time point t45, a count value of the second counter 22-3 becomes N, and the second detection signal S2d is raised from low level to high level. Therefore, in response to the positive edge, the output signal OUT of the SR flip-flop FF is dropped from high level to low level.

After that, when the number of pulses of the pulse signal SB reaches N+a at time point t46, the pulse counter 15-6 drops the counter output signal SC from high level to low level, and in response to this, the pulse generating portion 15-5 stops the drive. Therefore, both the first transformer drive signal S1a and the second transformer drive signal S2a are maintained at low level during a period after the time point t46 until the input signal IN is raised to high level.

In this way, in the case of FIG. 40A, the output signal OUT cannot be dropped from high level to low level substantially until the (N+1)th pulse is generated in the second comparison signal S2c.

Next, with reference to FIG. 40B, there is described a case where the (N+b)th pulse is not generated in the first transformer drive signal S1a at a timing just before a logical level of the input signal IN is changed.

In this case too, similarly to the case of FIG. 40A, in response to the (N+b)th pulse generated in the first transformer drive signal S1a, the (N+b)th pulse is generated in the first comparison signal S1c, and this pulse resets a count value of the second counter 22-3. In addition, depending on the response ability of the first comparator 21-1, the first comparison signal S1c may be maintained at high level for some period of time after the pulse generated in the first induced signal S1b has vanished similarly to FIG. 40A.

Unlike FIG. 40A, the first comparison signal S1c is back to low level before the time point t43, and the reset state of the second counter 22-3 is canceled. If the input signal IN is dropped from high level to low level in this state, the second counter 22-3 can appropriately count the first pulse generated in the second comparison signal S2c after the time point t43.

As a result, when the N-th pulse is generated in the second transformer drive signal S2a, and the corresponding pulse is generated in the second comparison signal S2c at time point t44, a count value of the second counter 22-3 becomes N, and the second detection signal S2d is raised from low level to high level. Therefore, in response to this positive edge, the output signal OUT of the SR flip-flop FF is dropped from high level to low level.

After that, when the number of pulses of the pulse signal SB reaches N+a at time point t46, the pulse counter 15-6 drops the counter output signal SC from high level to low level, and in response to this, the pulse generating portion 15-5 stops the drive. Therefore, both the first transformer drive signal S1a and the second transformer drive signal S2a are maintained at low level in a period of time after the time point t46 until the input signal IN is raised to high level.

In this way, in the case of FIG. 40B, the output signal OUT can be dropped from high level to low level at a time point when the N-th pulse is generated in the second comparison signal S2c.

Note that in the description described above, a case where the output signal OUT is dropped from high level to low level is exemplified. However, it is needless to say that the same is true in a case where the output signal OUT is raised from low level to high level on the contrary.

As understood from comparison between FIGS. 40A and 40B, if the first generation operation described above with reference to FIG. 38 is adopted, depending on the timing when a logical level of the input signal IN is changed, the timing of changing a logical level of the output signal OUT may be shifted, and hence there may occur a malfunction that a jitter component of the output signal OUT is increased.

Figure 41:
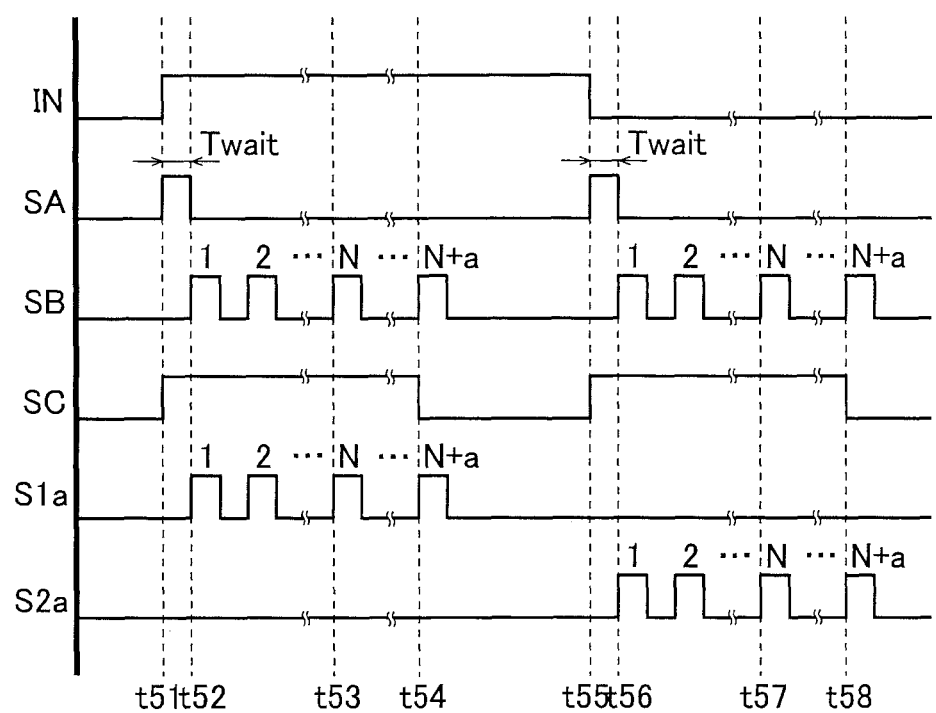
FIG. 41 is a timing chart illustrating a second generation operation of the transformer drive signal.

In order to solve this malfunction, it is preferred to adopt not the first generation operation illustrated in FIG. 38 but the second generation operation illustrated in FIG. 41 as the generation operation of the first transformer drive signal S1a and the second transformer drive signal S2a.

FIG. 41 is a timing chart illustrating the second generation operation of the first transformer drive signal S1a and the second transformer drive signal S2a. There are illustrated, in order from the upper part, the input signal IN, the edge detection signal SA, the pulse signal SB, the counter output signal SC, the first transformer drive signal S1a, and the second transformer drive signal S2a.

When the input signal IN is raised from low level to high level at time point t51, the edge detection portion 15-7 raises the edge detection signal SA from low level to high level. The pulse generating portion 15-5 starts the drive when the edge detection signal SA is set to high level. However, the pulse generating portion 15-5 does not start to output the pulse signal SB at the time point t51, and does not generate the pulse signal SB until a predetermined time Twait passes (here, in a period of time while the edge detection signal SA is maintained at high level). When the edge detection signal SA is set to high level, the pulse counter 15-6 resets the count value and starts to count the number of pulses of the pulse signal SB from the beginning. In addition, when the count value of the pulse counter 15-6 is reset, the counter output signal SC is raised from low level to high level, and the counter output signal SC is maintained at high level after the time point t51 until the number of pulses of the pulse signal SB reaches N+a. After the time point t51 during a period while the input signal IN is maintained at high level, the pulse distribution portion 15-8 outputs the pulse signal SB as the first transformer drive signal S1a and maintains the second transformer drive signal S2a at low level.

When a predetermined time Twait passes from the time point t51 at time point t52, the edge detection portion 15-7 drops the edge detection signal SA from high level to low level again. When the edge detection signal SA is set to low level, the pulse generating portion 15-5 starts to output the pulse signal SB without delay.

Even if the number of pulses of the pulse signal SB reaches N at time point t53, the pulse counter 15-6 maintains the counter output signal SC at high level. Therefore, generation of the pulse signal SB in the pulse generating portion 15-5 is continued.

When the number of pulses of the pulse signal SB reaches N+a at time point t54, the pulse counter 15-6 drops the counter output signal SC from high level to low level, and in response to this, the pulse generating portion 15-5 stops the drive. Therefore, both the first transformer drive signal S1a and the second transformer drive signal S2a are maintained at low level after the time point t54 until the input signal IN is dropped to low level.

When the input signal IN is dropped from high level to low level at time point t55, the edge detection portion 15-7 raises the edge detection signal SA from low level to high level. The pulse generating portion 15-5 starts the drive when the edge detection signal SA is set to high level. However, the pulse generating portion 15-5 does not start to output the pulse signal SB at the time point t55, and does not generate the pulse signal SB until a predetermined time Twait passes (here, in a period of time while the edge detection signal SA is maintained at high level). When the edge detection signal SA is set to high level, the pulse counter 15-6 resets the count value and starts to count the number of pulses of the pulse signal SB from the beginning. In addition, when the count value of the pulse counter 15-6 is reset, the counter output signal SC is raised from low level to high level, and after the time point t51 until the number of pulses of the pulse signal SB reaches N+a, the counter output signal SC is maintained at high level. After the time point t55 during a period while the input signal IN is low level, the pulse distribution portion 15-8 outputs the pulse signal SB as the second transformer drive signal S2a and maintains the first transformer drive signal S1a at low level.

When a predetermined time Twait passes from the time point t55 at time point t56, the edge detection portion 15-7 drops the edge detection signal SA from high level to low level again. The pulse generating portion 15-5 starts to output the pulse signal SB without delay at a time point when the edge detection signal SA is set to low level.

Even if the number of pulses of the pulse signal SB reaches N at time point t57, the pulse counter 15-6 maintains the counter output signal SC at high level. Therefore, generation of the pulse signal SB in the pulse generating portion 15-5 is continued.

When the number of pulses of the pulse signal SB reaches N+a at time point t58, the pulse counter 15-6 drops the counter output signal SC from high level to low level, and in response to this, the pulse generating portion 15-5 stops the drive. Therefore, both the first transformer drive signal S1a and the second transformer drive signal S2a are maintained at low level after the time point t58 until the input signal IN is raised to high level.

Figure 42A:
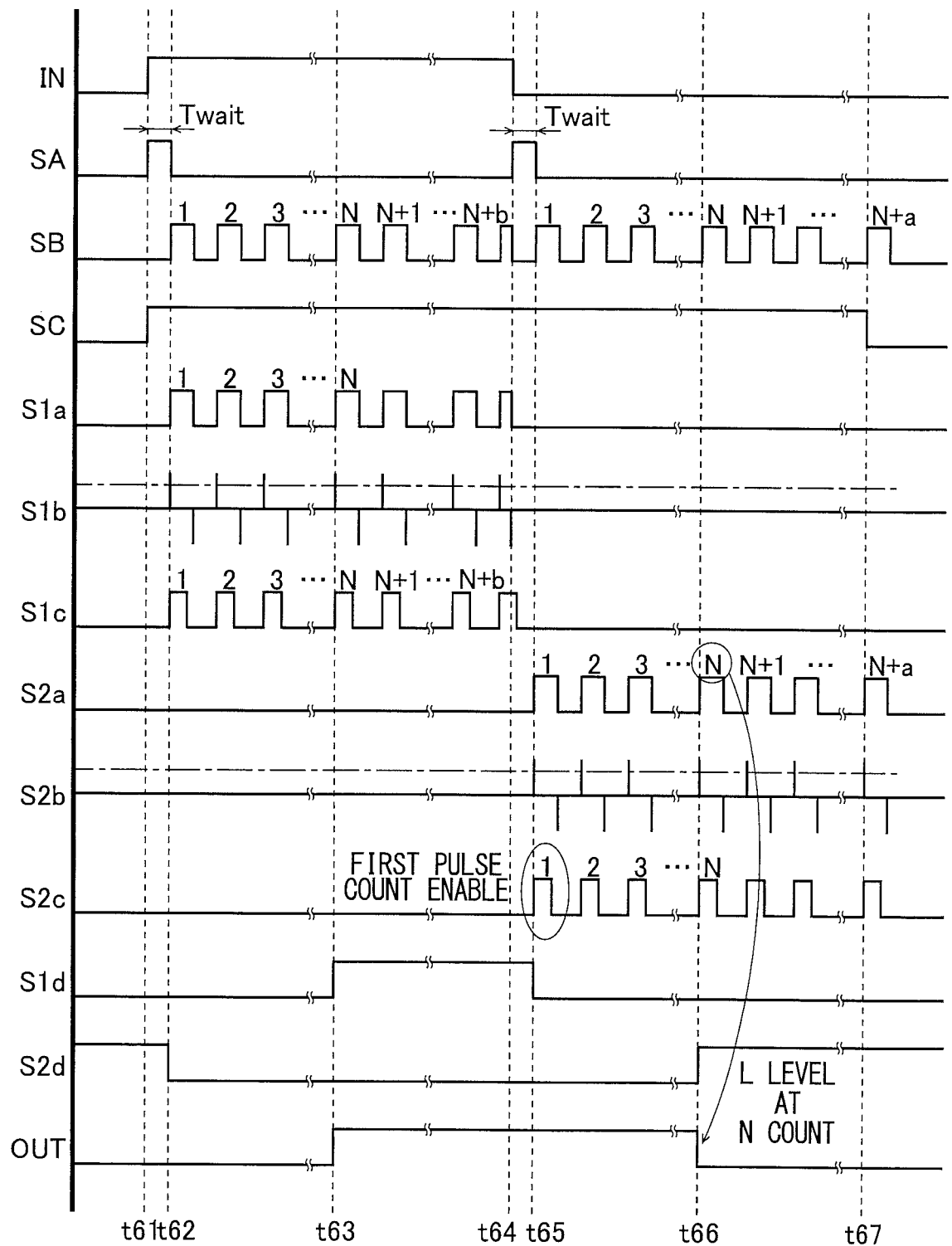
FIG. 42A is a timing chart for explaining a cause of canceling output jitter.
Figure 42B:
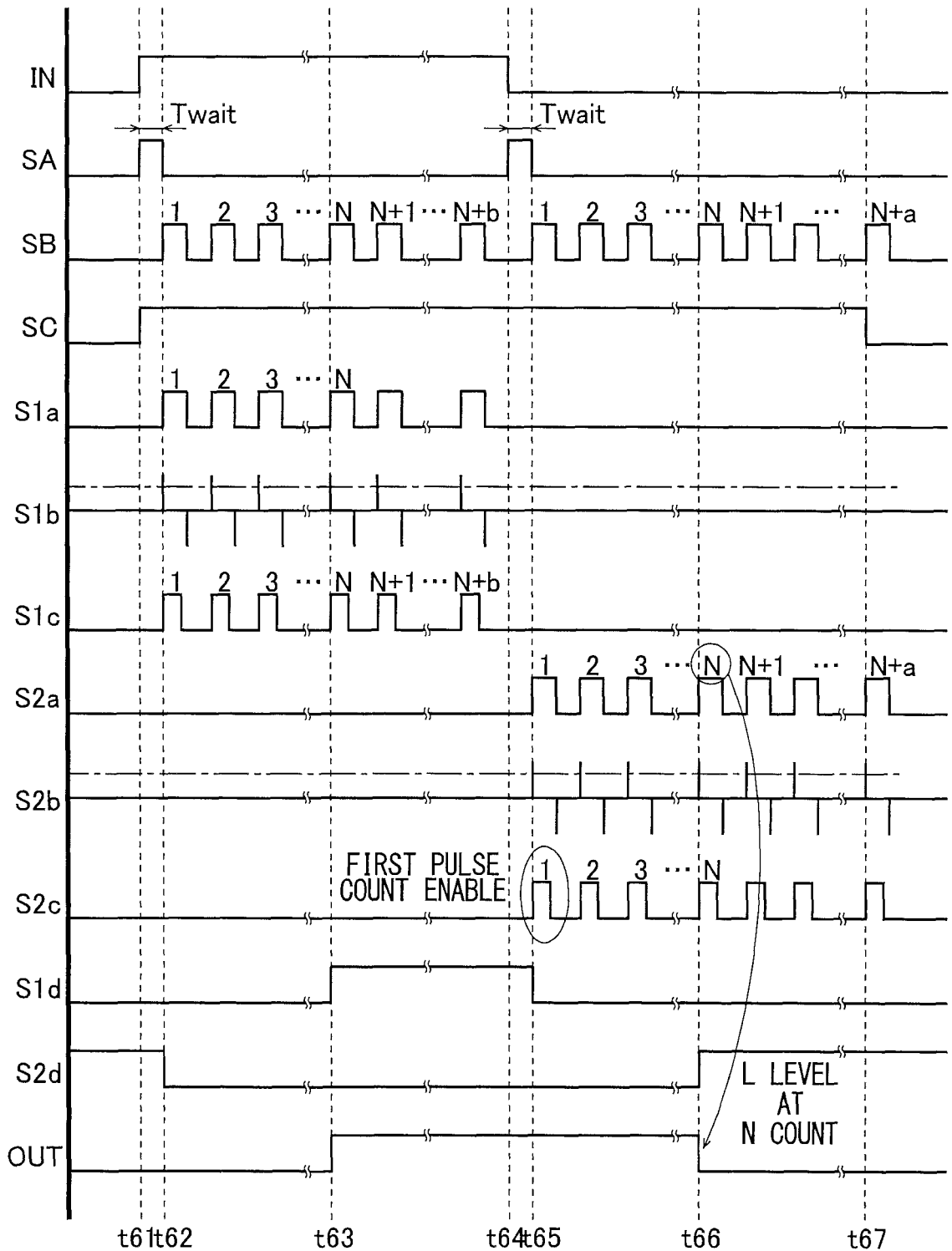
FIG. 42B is a timing chart for explaining a cause of canceling output jitter.
Figure 43:
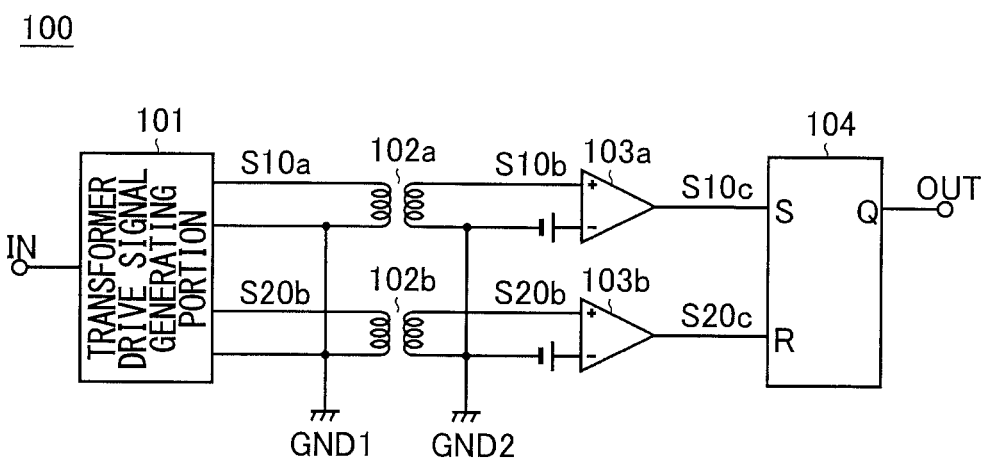
FIG. 43 is a circuit block diagram illustrating a conventional example of the signal transmission device.
Figure 44:
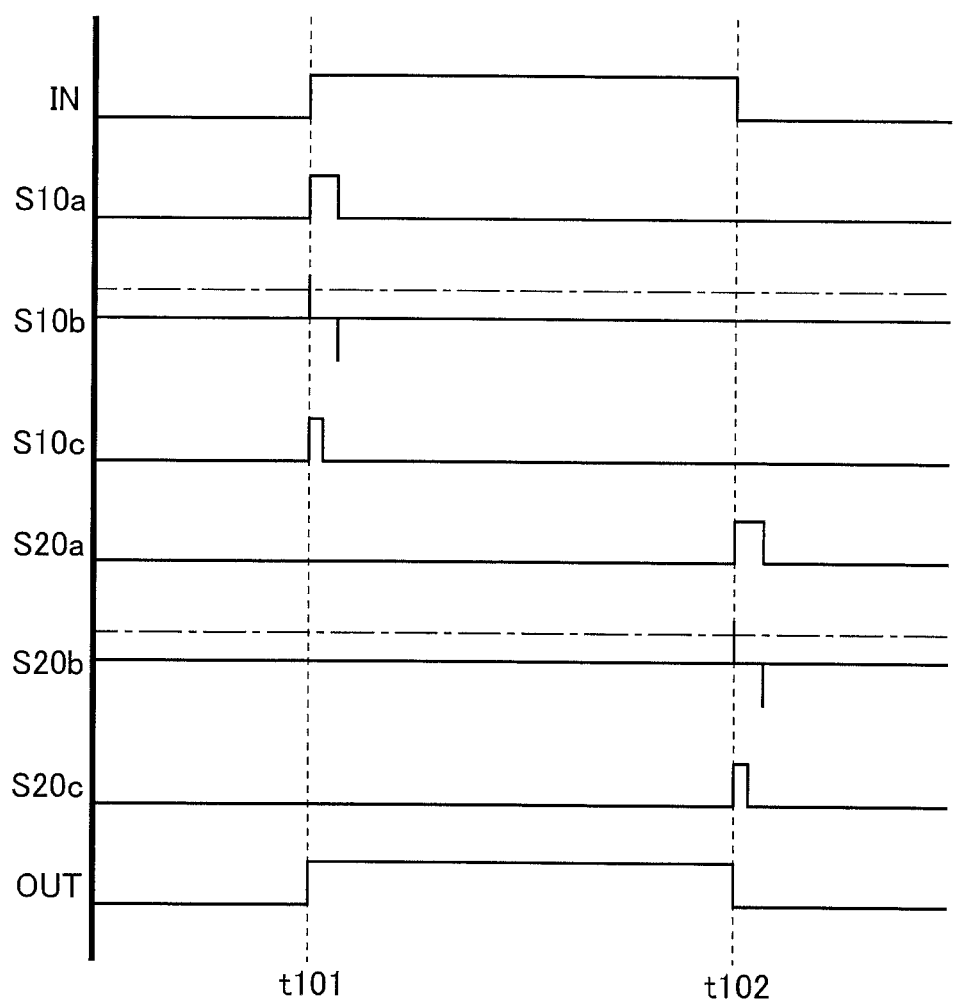
FIG. 44 is a timing chart illustrating an example of a normal operation.
Figure 45A:
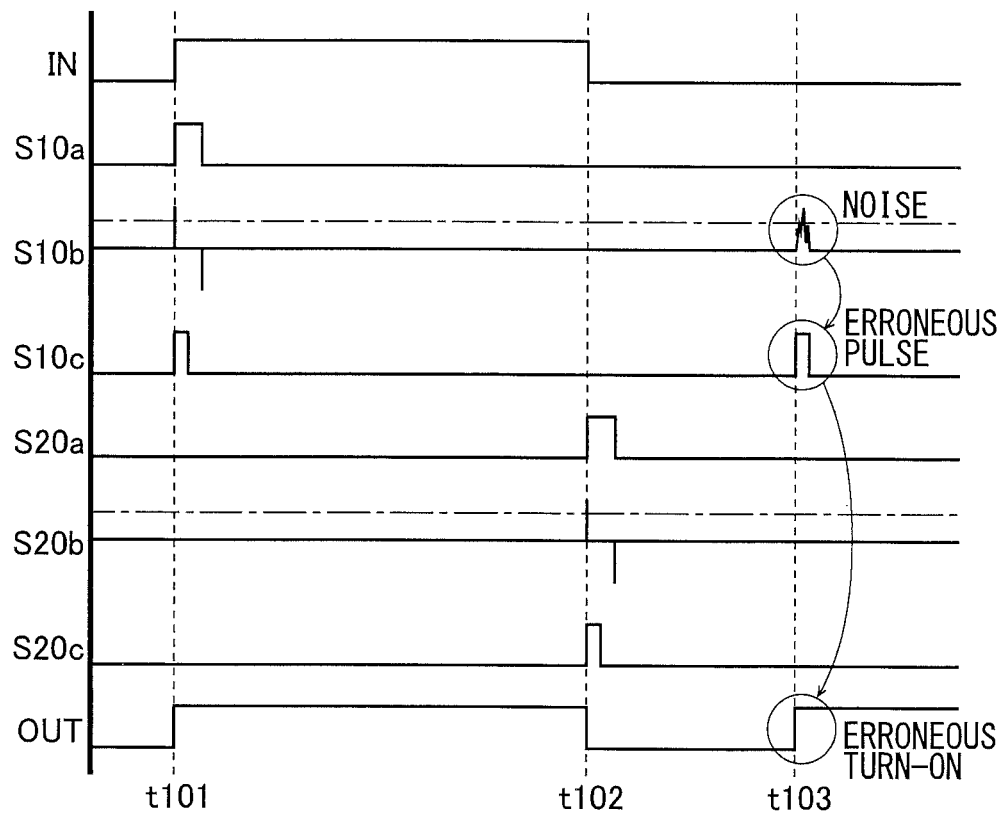
FIG. 45A is a timing chart illustrating an example of an abnormal operation.
Figure 45B:
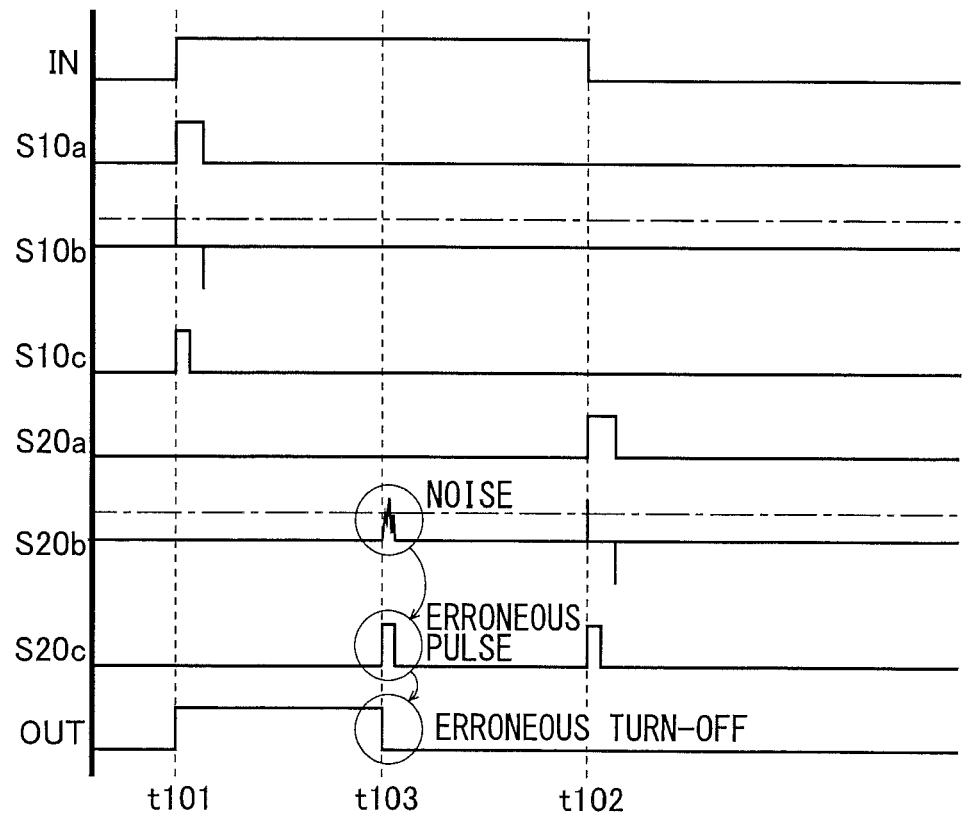
FIG. 45B is a timing chart illustrating an example of an abnormal operation.
Figure 46A:
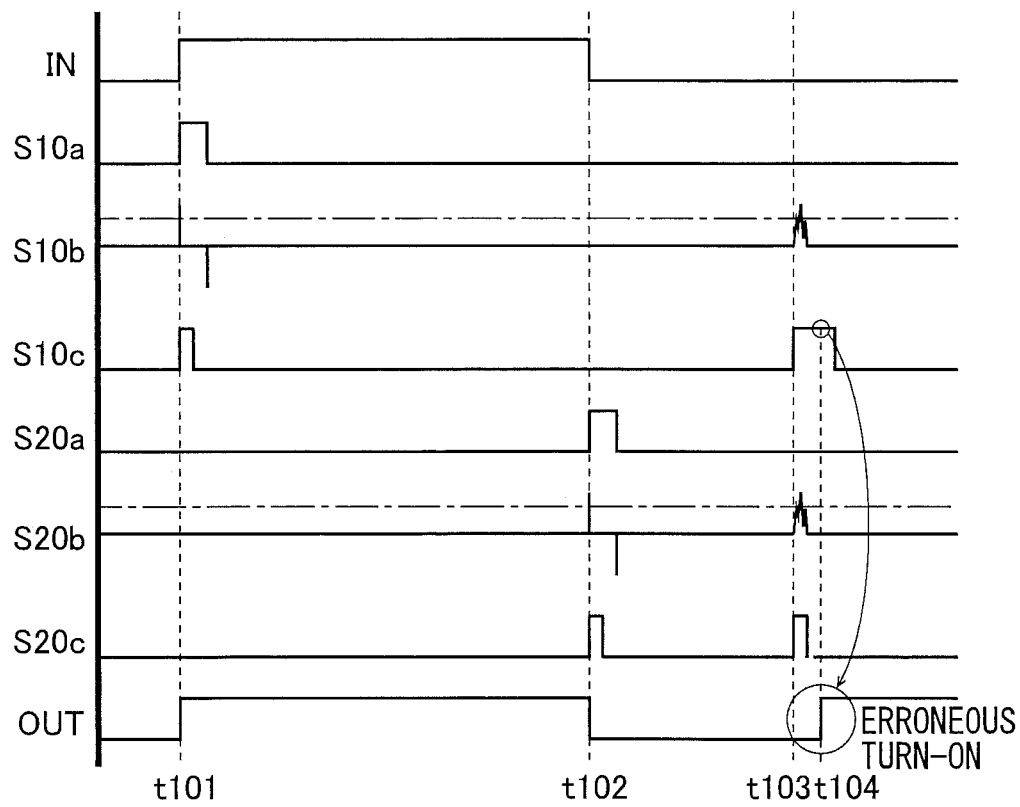
FIG. 46A is a timing chart illustrating an example of an abnormal operation.
Figure 46B:
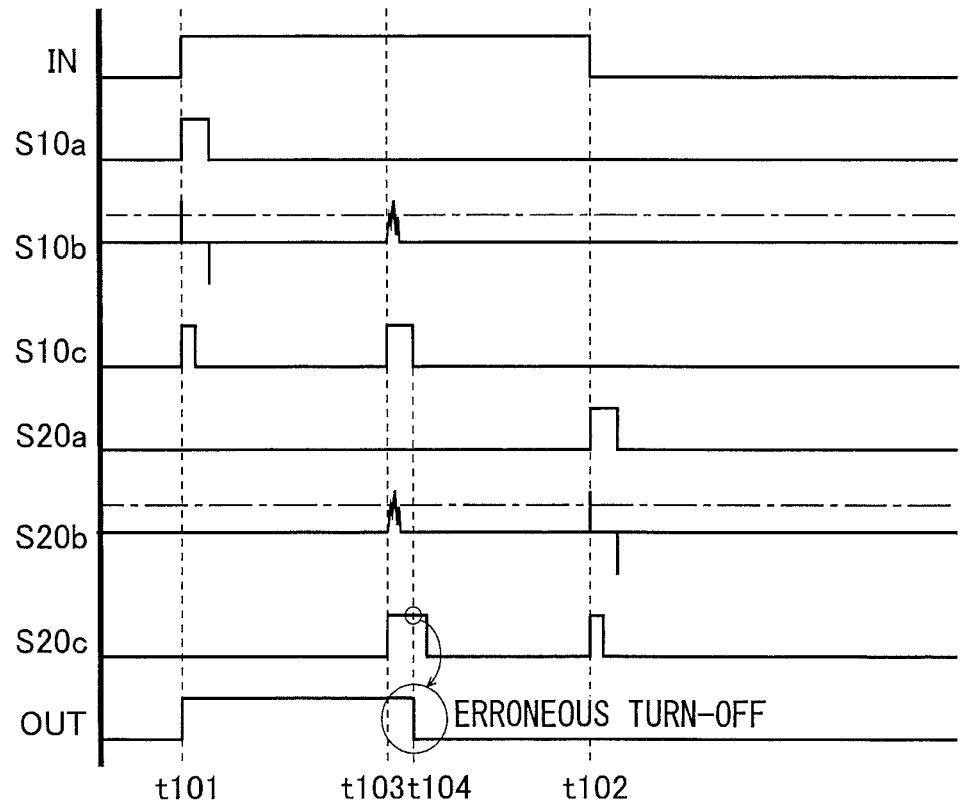
FIG. 46B is a timing chart illustrating an example of an abnormal operation.

Next, with reference to FIG. 42A in comparison with FIG. 42B, there is described a reason why a jitter component of the output signal OUT can be reduced by adopting the second generation operation illustrated in FIG. 41 as the generation operation of the first transformer drive signal S1a and the second transformer drive signal S2a.

Each of FIGS. 42A and 42B is a timing chart for explaining a cause of canceling the output jitter. There are illustrated, in order from the upper part, the input signal IN, the edge detection signal SA, the pulse signal SB, the counter output signal SC, the first transformer drive signal S1a, the first induced signal S1b, the first comparison signal S1c, the second transformer drive signal S2a, the second induced signal S2b, the second comparison signal S2c, the first detection signal S1d, the second detection signal S2d, and the output signal OUT.

First, with reference to FIG. 42A, there is described a case where the (N+b)th pulse is generated in the first transformer drive signal S1a at a timing just before a logical level of the input signal IN is changed.

When the input signal IN is raised from low level to high level at time point t61, the edge detection portion 15-7 raises the edge detection signal SA from low level to high level. The pulse generating portion 15-5 starts the drive when the edge detection signal SA is set to high level. However, the pulse generating portion 15-5 does not start to output the pulse signal SB at the time point t61, and does not generate the pulse signal SB until a predetermined time Twait passes (here, in a period of time while the edge detection signal SA is maintained at high level). When the edge detection signal SA is set to high level, the pulse counter 15-6 resets the count value and starts to count the number of pulses of the pulse signal SB from the beginning. In addition, when the count value of the pulse counter 15-6 is reset, the counter output signal SC is raised from low level to high level. After the time point t61 until the number of pulses of the pulse signal SB reaches N+a, the counter output signal SC is maintained at high level. After the time point t61 during a period of time while the input signal IN is maintained at high level, the pulse distribution portion 15-8 outputs the pulse signal SB as the first transformer drive signal S1a and maintains the second transformer drive signal S2a at low level.

By the signal generation operation described above, the logic portion 15 starts the pulse drive of the first transformer drive signal S1a at time point t62. In response to this, the first induced signal S1b corresponding to the first transformer drive signal S1a is generated in the secondary side winding of the first transformer 31, and pulses of the same number as the first transformer drive signal S1a are generated in the first comparison signal S1c output from the first comparator 21-1. Note that the first counter 21-3 maintains the first detection signal S1d to low level after the time point t62 until the number of pulses of the first comparison signal S1c reaches N. In addition, because a count value of the second counter 223 is reset by the first pulse generated in the first comparison signal S1c at time point t62, the second detection signal S2d is dropped from high level to low level. After the time point t62 too, a count value of the second counter 22-3 is reset every time when a pulse is generated in the first comparison signal S1c, and hence the second detection signal S2d is maintained at low level.

At time point t63, the N-th pulse is generated in the first transformer drive signal S1a, and when the number of pulses of the first comparison signal S1c reaches N, the first counter 21-3 raises the first detection signal S1d from low level to high level. In response to this positive edge, the SR flip-flop FF raises the output signal OUT from low level to high level.

On the other hand, the pulse counter 15-6 maintains the counter output signal SC at high level until the number of pulses of the pulse signal SB reaches N+a. Therefore, generation of the pulse signal SB (hence, the first transformer drive signal S1a) in the pulse generating portion 15-5 is continued.

After that, when the input signal IN is dropped from high level to low level at time point t64, the edge detection portion 15-7 raises the edge detection signal SA from low level to high level. The pulse generating portion 15-5 stops to generate the (N+b)th and subsequent pulses at the time point when the edge detection signal SA is set to high level. However, the pulse generating portion 15-5 does not start to output the new pulse signal SB at the time point t64, and does not generate the pulse signal SB until a predetermined time Twait passes (here, in a period of time while the edge detection signal SA is maintained at high level). At time point t65, the pulse generating portion 15-5 restarts generation of the pulse signal SB. When the edge detection signal SA is set to high level, the pulse counter 15-6 resets the count value and starts to count the number of pulses of the pulse signal SB from the beginning. In addition, when the count value of the pulse counter 15-6 is reset, the counter output signal SC is maintained at high level after the time point t64 until the number of pulses of the pulse signal SB reaches N+a. After the time point t64 during a period while the input signal IN is low level, the pulse distribution portion 15-8 outputs the pulse signal SB as the second transformer drive signal S2a and maintains the first transformer drive signal S1a at low level.

By the signal generation operation described above, the logic portion 15 starts the pulse drive of the second transformer drive signal S2a at the time point t65. Then, the second induced signal S2b corresponding to the second transformer drive signal S2a is generated in the secondary side winding of the second transformer 32, and the pulses of the same number as the second transformer drive signal S2a are generated in the second comparison signal S2c output from the second comparator 22-1. Note that the second counter 22-3 maintains the second detection signal S2d at low level after the time point t65 until the number of pulses of the second comparison signal S2c reaches N. In addition, at time point t65, because a count value of the first counter 21-3 is reset by the first pulse generated in the second comparison signal S2c, the first detection signal S1d is dropped from high level to low level. After the time point t65 too, a count value of the first counter 21-3 is reset every time when a pulse is generated in the second comparison signal S2c, and the first detection signal S1d is maintained at low level.

Here, in response to the (N+b)th pulse generated in the first transformer drive signal S1a, the (N+b)th pulse is generated in the first comparison signal S1c, and this pulse resets a count value of the second counter 22-3 similarly to FIG. 40A. In addition, depending on the response ability of the first comparator 21-1, the first comparison signal S1c may be maintained at high level for some period of time after the pulse generated in the first induced signal S1b has vanished similarly to FIG. 40A.

Unlike FIG. 40A, in a period while the first comparison signal S1c is maintained at high level, a pulse is not generated in the second transformer drive signal S2a. The generation of the pulse in the second transformer drive signal S2a is started after the first comparison signal S1c is back to low level, and the reset state of the second counter 22-3 is canceled.

By adopting this signal generation operation, even if the (N+b)th pulse is generated in the first transformer drive signal S1a at a timing just before a logical level of the input signal IN is changed, the second counter 22-3 can appropriately count the first pulse generated in the second comparison signal S2c after the time point t65.

As a result, the N-th pulse is generated in the second transformer drive signal S2a at time point t66, and a pulse corresponding to this is generated in the second comparison signal S2c. At this time point, a count value of the second counter 22-3 becomes N, and the second detection signal S2d is raised from low level to high level. Therefore, in response to this positive edge, the SR flip-flop FF drops the output signal OUT from high level to low level.

After that, when the number of pulses of the pulse signal SB reaches N+a at time point t67, the pulse counter 15-6 drops the counter output signal SC from high level to low level, and in response to this, the pulse generating portion 15-5 stops the drive. Therefore, both the first transformer drive signal S1a and the second transformer drive signal S2a are maintained at low level after the time point t67 until the input signal IN is raised to high level.

In this way, in the case of FIG. 42A, the output signal OUT can be dropped from high level to low level at a time point when the N-th pulse is generated in the second comparison signal S2c.

Next, with reference to FIG. 42B, there is described a case where the (N+b)th pulse is not generated in the first transformer drive signal S1a at timing just before a logical level of the input signal IN is changed.

Unlike FIG. 42A, the first comparison signal S1c is back to low level before the time point t64, and the reset state of the second counter 22-3 is canceled before the predetermined time Twait passes. In this state, if the input signal IN is dropped from high level to low level, the second counter 22-3 can appropriately count the first pulse generated in the second comparison signal S2c after the time point t64. However, as described above, the timing when the pulse drive of the second transformer drive signal S2a is actually started is the time point t65 after passing a predetermined time Twait similarly to FIG. 42A.

As a result, the N-th pulse is generated in the second transformer drive signal S2a at the time point t66, and the corresponding pulse is generated in the second comparison signal S2c. At this time point, a count value of the second counter 22-3 becomes N, and the second detection signal S2d is raised from low level to high level. Therefore, in response to this positive edge, the SR flip-flop FF drops the output signal OUT from high level to low level.

After that, when the number of pulses of the pulse signal SB reaches N+a at the time point t67, the pulse counter 15-6 drops the counter output signal SC from high level to low level, and in response to this, the pulse generating portion 15-5 stops the drive. Therefore, both the first transformer drive signal S1a and the second transformer drive signal S2a are maintained at low level after the time point t67 until the input signal IN is raised to high level.

In this way, in the case of FIG. 42B too, similarly to FIG. 42A, the output signal OUT can be dropped from high level to low level at a time point when the N-th pulse is generated in the second comparison signal S2c.

Note that in the above description, there is exemplified the case where the output signal OUT is dropped from high level to low level, but it is needless to say that the same is true in the case where the output signal OUT is raised from low level to high level on the contrary.

As understood from comparison between FIGS. 42A and 42B, if the second generation operation described above with reference to FIG. 41 is adopted, the timing of changing a logical level of the output signal OUT can be the same regardless of the timing when a logical level of the input signal IN is changed. Therefore, a jitter component of the output signal OUT can be reduced.

Note that in the embodiment described above, the motor drive apparatus using the signal transmission device according to the present invention is exemplified. However, the application of the present invention is not limited to this. The present invention can be applied generally to signal transmission devices using a transformer. For instance, if the present invention is applied to a transformer coupler, mistransmission of a signal can be prevented so that a breakdown of a system can be avoided.

In addition, the structure of the present invention can be modified variously other than the above-mentioned embodiment within the scope of the present invention without deviating from the spirit thereof. In other words, the embodiment described above is merely an example and should not be interpreted as a limitation. The technical scope of the present invention should be defined not by the above description of the embodiment but by the claims, and should be interpreted to include every modification within the scope equivalent to the claims in meaning.

For instance, in the embodiment described above, there is exemplified the signal transmission device that transmits the switch control signal S1 for raising the output signal OUT from low level to high level when the input signal IN is raised from low level to high level, and the switch control signal S2 for dropping the output signal OUT from high level to low level when the input signal IN is dropped from high level to low level, respectively, using the transformers 31 and 32. However, it is possible to apply the technical concept to a signal transmission device using a single transformer, in which N pulses are continuously generated in the transformer drive signal generated in the primary side circuit, and a logical level of the output signal OUT is changed only when N pulses are continuously generated in the comparison signal generated in the secondary side circuit, in order to avoid a malfunction due to a noise or the like.

In this case, the signal transmission device to which the present invention is applied should have a structure including a transformer drive signal generating portion that generates N+a pulses (here, N≥2 and a≥0) in a transformer drive signal in response to a pulse edge of an input signal; a transformer that generates an induced signal in a secondary side winding in response to the transformer drive signal input to a primary side winding; a comparator that compares the induced signal with a predetermined threshold voltage so as to generate a comparison signal; and a pulse detection portion that detects that N pulses are generated in the comparison signal so as to generate a pulse in the output signal.

INDUSTRIAL APPLICABILITY

First Technical Feature

As described above, the signal transmission circuit device of the present invention has an output signal correction function performed by the feedback signal transmission unit, the logical comparison circuit, the first pulse generating circuit, and the second pulse generating circuit. Therefore, even if the control output signal becomes the "mismatched" state with the control input signal, it is possible to promptly make the control output signal be "matched" with the control input signal. In addition, if the feedback signal transmission unit has a structure having a flip-flop, or a structure in which the first edge detection circuit and the second edge detection circuit are disposed in parallel with the first pulse generating circuit and the second pulse generating circuit, a precise control output signal can be output even for a control input signal having a very small pulse width. Therefore, the present invention has high industrial applicability.

Second Technical Feature

The present invention provides a technique that is appropriately usable for enhancing reliability of a motor drive IC (gate driver IC) mounted widely in a hybrid vehicle, an electric vehicle, home electrical appliances such as an air conditioner, and an industrial machine, for example.

Third Technical Feature

The present invention provides a technique that can be appropriately used for enhancing reliability of a motor drive IC (gate driver IC) mounted widely in a hybrid vehicle, an electric vehicle, home electrical appliances such as an air conditioner, and an industrial machine, for example, which uses high voltage.

EXPLANATION OF NUMERALS 200, 220, 250, 280, 300, 330, 360, 400, 430, 800, 850 signal transmission circuit device
200A, 220A, 250A, 280A, 300A, 330A, 360A, 400A, 430A, 800A, 850A input side circuit
200B, 220B, 250B, 280B, 300B, 330B, 360B, 400B, 430B, 800B, 850B output side circuit
201, 221, 251, 281, 301, 331, 361, 401, 431, 801, 851 input terminal
219, 249, 279, 299, 329, 359, 399, 429, 469, 849, 899 output terminal
202, 222, 252, 282, 302, 354, 384, 420, 452 first pulse generating circuit
204, 224, 254, 284, 304, 356, 386, 422, 454 second pulse generating circuit
212, 238, 272, 298, 322, 352, 382, 418, 450, 818, 874 logical comparison circuit
820, 876 comparison pulse generating circuit
206, 220C, 250C, 280C, 300C, 330C, 360C, 400C, 430C, 800C, 850C input signal transmission unit
208 input signal restoration circuit
210, 220D, 250D, 280D, 300D, 330D, 360D, 400D, 430D, 800D, 850D feedback signal transmission unit
230, 260, 290, 320, 344, 374, 810, 866 RS flip-flop
270 second RS flip-flop
226, 256, 286, 308, 340, 366, 408, 436, 806, 862 first transformer
228, 258, 288, 316, 342, 368, 414, 438, 808, 864 second transformer
234, 266, 294, 318, 348, 388, 456, 814, 870 third transformer
268, 390, 458 fourth transformer
378, 446 fifth transformer
232, 346, 376, 412, 444, 812, 868 feedback pulse generating circuit
236, 350, 380, 416, 448, 816, 872 waveform shaping circuit
262, 312 first output edge detection circuit
264, 314 second output edge detection circuit
292 output edge detection circuit
296, 310, 410, 442 D flip-flop
306, 406, 440, 856 logical OR circuit
332, 362, 402, 432, 852 first edge detection circuit
334, 364, 404, 434, 854 second edge detection circuit
336, 370 first logical OR circuit
338, 372 second logical OR circuit
850E signal combining circuit
802, 858 first logical AND circuit
804, 860 second logical AND circuit
902 current source
904 switching transistor
906 capacitor
910 comparator
GND A first ground potential
GND B second ground potential
GND ground potential
S set terminal
R reset terminal
Q flip-flop output terminal
CLK clock terminal
X10A, X10B semiconductor device
X11a first current supply pad
X11b first voltage measurement pad
X11c first common pad (X11a+X11b)
X12a second current supply pad
X12b second voltage measurement pad
X12c second common pad (X12a+X12b)
X20 inspection apparatus
X21a first current supply probe
X21b first voltage measurement probe
X22a second current supply probe
X22b second voltage measurement probe
X23 constant current source
X24 voltmeter
1 switch control device
2 engine control unit (ECU)
10 first semiconductor chip (controller chip)
11 first transmission portion
11-1 buffer
12 second transmission portion
12-1 buffer
13 first reception portion
14 second reception portion
15 logic portion
15-1, 15-2 inverter
15-3 first pulse generating portion
15-4 second pulse generating portion
15-5 pulse generating portion
15-6 pulse counter
15-7 edge detection portion
15-8 pulse distribution portion
16 first low voltage lockout portion (first UVLO portion)
17 external error detection portion (comparator)
20 second semiconductor chip (driver chip)
21 third reception portion
21-1 first comparator
21-2 first pulse detection portion
21-3 first counter
22 fourth reception portion
22-1 first comparator 22-2 second pulse detection portion
22-3 second counter
23 third transmission portion
24 fourth transmission portion
25 logic portion
26 driver portion
27 second low voltage lockout portion (second UVLO portion)
28 overcurrent detection portion (comparator)
29 OCP timer
30 third semiconductor chip (transformer chip)
31 first transformer
32 second transformer
33 third transformer
34 fourth transformer
35 first guard ring
36 second guard ring
40 first island (low voltage side island)
50 second island (high voltage side island)
SWH high side switch (IGBT, SiC-MOS)
SWL low side switch (IGBT, SiC-MOS)
Na, Nb, N1 to N3 N channel MOS field effect transistor
P1, P2 P channel MOS field effect transistor
E1, E2 DC voltage source
Q1 npn bipolar transistor
Q2 pnp bipolar transistor
C1 to C3 capacitor
R1 to R8 resistor
D1 diode
a1 to a8 pad (corresponding to first current supply pad)
b1 to b8 pad (corresponding to first voltage measurement pad)
c1 to c4 pad (corresponding to second current supply pad)
d1 to d4 pad (corresponding to second voltage measurement pad)
e1, e2 pad
L11, L21, L31, L41 primary side coil
L12, L22, L32, L42 secondary side coil

The invention claimed is:

1. A signal transmission device comprising:
a signal transmission chip; and
a first lead frame supporting the signal transmission chip,
wherein the signal transmission chip comprises:
   a first inductor spiral ring;
   a second inductor spiral ring;
   a first bonding pad electrically coupled between the first inductor spiral ring and the second inductor spiral ring;
   a guard ring provided to roundly cover the first inductor spiral ring and the second inductor spiral ring in a plan view; and
   a plurality of bonding pads provided outside of the guard ring;
wherein a direction of rotation between the first inductor spiral ring and the second inductor spiral ring are different from each other so that the first and second inductor spiral rings are disposed substantially symmetrically about the first bonding pad, and no bonding pad is provided at a first side of the signal transmission chip,
wherein the signal transmission device further comprises a semiconductor chip and a second lead frame supporting the semiconductor chip, wherein the signal transmission chip and the semiconductor chip are placed to face each other.

2. The signal transmission device according to claim 1, wherein a second bonding pad is provided at a center of the first inductor spiral ring, and a third bonding pad is provided at a center of the second inductor spiral ring.

3. The signal transmission device according to claim 2, further comprising a third inductor spiral ring, a fourth inductor spiral ring, and a fourth bonding pad electrically coupled between the third and fourth inductor spiral rings, wherein a direction of rotation between the third and fourth inductor spiral rings are different from each other so that both of the third and fourth inductor spiral rings are disposed substantially symmetrically about the fourth bonding pad.

4. The signal transmission device according to claim 3, wherein a signal transmission direction is same between the first inductor spiral ring and the second inductor spiral ring.

5. The signal transmission device according to claim 4, wherein a signal transmission direction is same between the third inductor spiral ring and the fourth inductor spiral ring.

6. The signal transmission device according to claim 5, wherein a signal transmission direction is different from each other between the first inductor spiral ring and the third inductor spiral ring.

7. The signal transmission device according to claim 6, wherein a layer of material directly under the first bonding pad is composed of a same material as the first inductor spiral ring and is disposed in a same plane as the first inductor spiral ring.

8. The signal transmission device according to claim 7, wherein the guard ring roundly covers the first inductor spiral ring and the second inductor spiral ring in a plan view continuously without any disconnection.

9. The signal transmission device according to claim 8, wherein the plurality of bonding pads are placed as a straight line along a second side of the signal transmission chip.

10. The signal transmission device according to claim 9, wherein the guard ring is connected to a ground potential.

11. A signal transmission device according to claim 1, further comprising a molding resin covering the signal transmission chip, the semiconductor chip, the first lead frame, and the second lead frame.

12. The signal transmission device according to claim 11, wherein lead terminal are protruded from a first side of the signal transmission device and a second side of the signal transmission device, and no lead terminal is protruding from a third side of the signal transmission device and a fourth side of the signal transmission device.

* * * * *